US011985825B2

(12) United States Patent
Lin et al.

(10) Patent No.: US 11,985,825 B2
(45) Date of Patent: May 14, 2024

(54) 3D MEMORY ARRAY CONTACT STRUCTURES

(71) Applicant: Taiwan Semiconductor Manufacturing Co., Ltd., Hsinchu (TW)

(72) Inventors: Meng-Han Lin, Hsinchu (TW); Feng-Cheng Yang, Zhudong Township (TW); Sheng-Chen Wang, Hsinchu (TW); Sai-Hooi Yeong, Zhubei (TW); Yu-Ming Lin, Hsinchu (TW); Han-Jong Chia, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 370 days.

(21) Appl. No.: 17/231,523

(22) Filed: Apr. 15, 2021

(65) Prior Publication Data

US 2021/0408038 A1 Dec. 30, 2021

Related U.S. Application Data

(60) Provisional application No. 63/044,092, filed on Jun. 25, 2020.

(51) Int. Cl.
*H10B 41/27* (2023.01)
*G11C 8/14* (2006.01)
(Continued)

(52) U.S. Cl.
CPC .............. *H10B 43/27* (2023.02); *G11C 8/14* (2013.01); *H10B 41/10* (2023.02); *H10B 41/27* (2023.02);
(Continued)

(58) Field of Classification Search
CPC ........ H10B 43/27; H10B 41/10; H10B 43/35; H10B 41/35; H10B 43/10; H10B 41/27; G11C 8/14
See application file for complete search history.

(56) References Cited

U.S. PATENT DOCUMENTS

| 1,152,386 | A | 8/1915 | Smith |
| 8,203,884 | B2 | 6/2012 | Kito et al. |

(Continued)

FOREIGN PATENT DOCUMENTS

| CN | 102971797 A | 3/2013 |
| CN | 103165617 A | 6/2013 |

(Continued)

OTHER PUBLICATIONS

Karouta, F., "A practical approach to reactive ion etching," J. Phys. D: Appl. Phys. 47 (2014) 233501, May 8, 2014, 15 pages.

(Continued)

*Primary Examiner* — Ali Naraghi
*Assistant Examiner* — Siangluai Mang
(74) *Attorney, Agent, or Firm* — Slater Matsil, LLP

(57) ABSTRACT

A memory array device includes a stack of transistors over a semiconductor substrate, a first transistor of the stack being disposed over a second transistor of the stack. The first transistor includes a first memory film along a first word line and a first channel region along a source line and a bit line, the first memory film being disposed between the first channel region and the first word line. The second transistor includes a second memory film along a second word line and a second channel region along the source line and the bit line, the second memory film being disposed between the second channel region and the second word line. The memory array device includes a first via electrically connected to the first word line and a second via electrically (Continued)

connected to the second word line, the second staircase via and the first staircase via having different widths.

14 Claims, 58 Drawing Sheets

(51) Int. Cl.
    *H10B 41/10*     (2023.01)
    *H10B 41/35*     (2023.01)
    *H10B 43/10*     (2023.01)
    *H10B 43/27*     (2023.01)
    *H10B 43/35*     (2023.01)

(52) U.S. Cl.
    CPC ............. *H10B 41/35* (2023.02); *H10B 43/10* (2023.02); *H10B 43/35* (2023.02)

(56) References Cited

U.S. PATENT DOCUMENTS

| | | | |
|---|---|---|---|
| 8,470,671 B1 | 6/2013 | Lin et al. | |
| 8,847,302 B2 | 9/2014 | Alsmeier et al. | |
| 9,015,561 B1 | 4/2015 | Hu | |
| 9,240,420 B2 | 1/2016 | Rabkin et al. | |
| 9,355,727 B1 | 5/2016 | Zhang et al. | |
| 9,418,743 B1* | 8/2016 | Chen | H10B 43/27 |
| 9,455,262 B2 | 9/2016 | Widjaja | |
| 9,520,407 B2 | 12/2016 | Fukuzumi et al. | |
| 9,601,497 B1 | 3/2017 | Chen et al. | |
| 9,634,023 B2 | 4/2017 | Lee | |
| 9,640,547 B2 | 5/2017 | Mizukami et al. | |
| 9,806,202 B2 | 10/2017 | Yamazaki et al. | |
| 9,892,930 B1* | 2/2018 | Sawa | G11C 16/0483 |
| 9,997,631 B2 | 6/2018 | Yang et al. | |
| 10,043,819 B1 | 8/2018 | Lai et al. | |
| 10,256,247 B1 | 4/2019 | Kanakamedala et al. | |
| 10,490,571 B2 | 11/2019 | Yoo et al. | |
| 10,515,981 B2 | 12/2019 | Or-Bach et al. | |
| 10,720,441 B2 | 7/2020 | Kam et al. | |
| 10,777,566 B2 | 9/2020 | Lue | |
| 10,868,042 B1 | 12/2020 | Zhang et al. | |
| 10,998,447 B2 | 5/2021 | Onuki et al. | |
| 11,011,529 B2 | 5/2021 | Ramaswamy | |
| 11,152,386 B2 | 10/2021 | Or-Bach et al. | |
| 11,171,157 B1 | 11/2021 | Lai et al. | |
| 11,205,659 B2 | 12/2021 | Zhu et al. | |
| 11,211,395 B2 | 12/2021 | Lung | |
| 11,404,091 B2 | 8/2022 | Lin et al. | |
| 11,423,966 B2 | 8/2022 | Lin et al. | |
| 11,785,776 B2 | 10/2023 | Lu et al. | |
| 2006/0228859 A1 | 10/2006 | Willer | |
| 2007/0072439 A1 | 3/2007 | Akimoto et al. | |
| 2008/0265235 A1 | 10/2008 | Kamigaichi et al. | |
| 2009/0020744 A1 | 1/2009 | Mizukami et al. | |
| 2011/0266604 A1 | 11/2011 | Kim et al. | |
| 2011/0298013 A1 | 12/2011 | Hwang et al. | |
| 2013/0148398 A1 | 6/2013 | Baek et al. | |
| 2013/0162778 A1* | 6/2013 | Kurokawa | G01S 17/50 348/46 |
| 2013/0264631 A1 | 10/2013 | Alsmeier et al. | |
| 2014/0048868 A1 | 2/2014 | Kim et al. | |
| 2014/0264532 A1 | 9/2014 | Dennison et al. | |
| 2014/0264718 A1 | 9/2014 | Wada et al. | |
| 2015/0294977 A1 | 10/2015 | Kim et al. | |
| 2015/0380418 A1 | 12/2015 | Zhang et al. | |
| 2016/0012901 A1 | 1/2016 | Hsu et al. | |
| 2016/0035420 A1* | 2/2016 | Konno | G11C 13/0028 365/51 |
| 2016/0086970 A1 | 3/2016 | Peng | |
| 2016/0086972 A1 | 3/2016 | Zhang et al. | |
| 2016/0163389 A1 | 6/2016 | Zhang et al. | |
| 2016/0181259 A1 | 6/2016 | Van Houdt et al. | |
| 2016/0204117 A1 | 7/2016 | Liu et al. | |
| 2016/0284811 A1 | 9/2016 | Yu et al. | |
| 2016/0322368 A1 | 11/2016 | Sun et al. | |
| 2017/0040416 A1* | 2/2017 | Ota | H10B 43/50 |
| 2017/0117290 A1 | 4/2017 | Lee et al. | |
| 2017/0148517 A1 | 5/2017 | Harari | |
| 2017/0154894 A1 | 6/2017 | Yoshimizu et al. | |
| 2017/0213843 A1 | 7/2017 | Choi | |
| 2017/0213846 A1 | 7/2017 | Lee | |
| 2017/0236831 A1 | 8/2017 | Kim | |
| 2017/0301684 A1 | 10/2017 | Park et al. | |
| 2018/0083018 A1 | 3/2018 | Yamakita et al. | |
| 2018/0130823 A1 | 5/2018 | Kim | |
| 2018/0269210 A1 | 9/2018 | Tezuka et al. | |
| 2018/0301415 A1 | 10/2018 | Mizukami et al. | |
| 2018/0315794 A1 | 11/2018 | Kamalanathan et al. | |
| 2018/0350829 A1* | 12/2018 | Tezuka | G11C 11/5671 |
| 2018/0350837 A1 | 12/2018 | Yoo et al. | |
| 2019/0027493 A1 | 1/2019 | Kimura et al. | |
| 2019/0058109 A1 | 2/2019 | Chen et al. | |
| 2019/0067325 A1 | 2/2019 | Yano | |
| 2019/0102104 A1 | 4/2019 | Righetti et al. | |
| 2019/0123061 A1 | 4/2019 | Liu | |
| 2019/0148286 A1 | 5/2019 | Or-Bach et al. | |
| 2019/0148393 A1 | 5/2019 | Lue | |
| 2019/0157291 A1 | 5/2019 | Kam et al. | |
| 2019/0228734 A1* | 7/2019 | Gao | G02F 1/13624 |
| 2019/0295626 A1 | 9/2019 | Ikeda et al. | |
| 2019/0312050 A1 | 10/2019 | Lai et al. | |
| 2019/0326308 A1 | 10/2019 | Pu et al. | |
| 2020/0006433 A1 | 1/2020 | Majhi et al. | |
| 2020/0013791 A1 | 1/2020 | Or-Bach et al. | |
| 2020/0013799 A1 | 1/2020 | Herner et al. | |
| 2020/0026990 A1 | 1/2020 | Lue | |
| 2020/0035701 A1 | 1/2020 | Huang et al. | |
| 2020/0058673 A1 | 2/2020 | Nishikawa et al. | |
| 2020/0066756 A1 | 2/2020 | Yoo et al. | |
| 2020/0075631 A1 | 3/2020 | Dong et al. | |
| 2020/0083248 A1 | 3/2020 | Uchida | |
| 2020/0098774 A1 | 3/2020 | Yeh et al. | |
| 2020/0105773 A1 | 4/2020 | Morris et al. | |
| 2020/0111920 A1 | 4/2020 | Sills et al. | |
| 2020/0119025 A1 | 4/2020 | Jiang et al. | |
| 2020/0185409 A1 | 6/2020 | Baek et al. | |
| 2020/0185411 A1 | 6/2020 | Herner et al. | |
| 2020/0194451 A1 | 6/2020 | Lee et al. | |
| 2020/0203329 A1 | 6/2020 | Kanamori et al. | |
| 2020/0227439 A1 | 7/2020 | Sato | |
| 2020/0295033 A1 | 9/2020 | Sakamoto et al. | |
| 2020/0303300 A1 | 9/2020 | Kato | |
| 2020/0343252 A1 | 10/2020 | Lai et al. | |
| 2020/0402890 A1 | 12/2020 | Chary et al. | |
| 2021/0036009 A1 | 2/2021 | Jung et al. | |
| 2021/0036019 A1 | 2/2021 | Sharangpani et al. | |
| 2021/0065805 A1 | 3/2021 | Choi et al. | |
| 2021/0066344 A1 | 3/2021 | Son et al. | |
| 2021/0082943 A1* | 3/2021 | Jang | H01L 21/02266 |
| 2021/0313281 A1* | 10/2021 | Kaminaga | H10B 43/10 |
| 2021/0327422 A1* | 10/2021 | Tang | H10B 43/50 |
| 2021/0335805 A1 | 10/2021 | Kai et al. | |
| 2021/0375917 A1 | 12/2021 | Lu et al. | |
| 2021/0375927 A1 | 12/2021 | Chia et al. | |
| 2021/0375932 A1 | 12/2021 | Wang et al. | |
| 2021/0376153 A1 | 12/2021 | Lu et al. | |
| 2021/0391351 A1* | 12/2021 | Takimoto | H10B 41/10 |
| 2021/0391355 A1 | 12/2021 | Lill et al. | |
| 2021/0398593 A1 | 12/2021 | Song et al. | |
| 2021/0398997 A1* | 12/2021 | Luo | H10B 41/50 |
| 2021/0407569 A1 | 12/2021 | Young et al. | |
| 2021/0407845 A1 | 12/2021 | Wang et al. | |
| 2021/0407980 A1 | 12/2021 | Young et al. | |
| 2021/0408038 A1 | 12/2021 | Lin et al. | |
| 2021/0408044 A1 | 12/2021 | Chiang et al. | |
| 2021/0408045 A1 | 12/2021 | Chiang et al. | |
| 2021/0408046 A1 | 12/2021 | Chang et al. | |
| 2022/0005821 A1 | 1/2022 | Or-Bach et al. | |
| 2022/0036931 A1 | 2/2022 | Lin et al. | |
| 2022/0037253 A1 | 2/2022 | Yang et al. | |

(56) References Cited

U.S. PATENT DOCUMENTS

| | | | |
|---|---|---|---|
| 2022/0037361 A1 | 2/2022 | Lin et al. | |
| 2022/0037362 A1 | 2/2022 | Lin et al. | |

FOREIGN PATENT DOCUMENTS

| | | | |
|---|---|---|---|
| CN | 104112748 A | 10/2014 | |
| CN | 104170061 A | 11/2014 | |
| CN | 105359270 A | 2/2016 | |
| CN | 106158877 A | 11/2016 | |
| CN | 107871520 A | 4/2018 | |
| CN | 108401468 A | 8/2018 | |
| CN | 108962902 A | 12/2018 | |
| CN | 110114881 A | 8/2019 | |
| CN | 110268523 A | 9/2019 | |
| CN | 110416223 A | 11/2019 | |
| CN | 110520985 A | 11/2019 | |
| CN | 110800107 A | 2/2020 | |
| CN | 111048518 A | 4/2020 | |
| JP | 2007281199 A | 10/2007 | |
| JP | 2009016400 A | 1/2009 | |
| JP | 2011060958 A | 3/2011 | |
| JP | 2017103328 A | 6/2017 | |
| JP | 2019504479 A | 2/2019 | |
| KR | 20080096432 A | 10/2008 | |
| KR | 20140024632 A | 3/2014 | |
| KR | 20150118648 A | 10/2015 | |
| KR | 20170089378 A | 8/2017 | |
| KR | 20170093099 A | 8/2017 | |
| KR | 20180126323 A | 11/2018 | |
| KR | 20180131118 A | 12/2018 | |
| KR | 20190057065 A | 5/2019 | |
| KR | 20190058157 A | 5/2019 | |
| TW | 201114021 A | 4/2011 | |
| TW | 201205576 A | 2/2012 | |
| TW | 201624708 A | 7/2016 | |
| TW | 201803131 A | 1/2018 | |
| TW | I643317 B | 12/2018 | |
| TW | I643318 B | 12/2018 | |
| TW | 201909386 A | 3/2019 | |
| TW | 201913963 A | 4/2019 | |
| TW | 201926642 A | 7/2019 | |
| TW | 201931577 A | 8/2019 | |
| TW | 201944543 A | 11/2019 | |
| TW | 681548 B | 1/2020 | |
| TW | I692038 B | 4/2020 | |
| TW | 202029353 A | 8/2020 | |
| WO | 2016093947 A1 | 6/2016 | |
| WO | 2017091338 A1 | 6/2017 | |
| WO | 2019125352 A1 | 6/2019 | |
| WO | 2019152226 A1 | 8/2019 | |

OTHER PUBLICATIONS

Park, J. et al., "A hybrid ferroelectric-flash memory cells," J_Appl. Phys. 116, 124512, Sep. 29, 2014, 8 pages.

Wu, B. et al., "High aspect ratio silicon etch: A review," J. Appl. Phys. 108, 051101 (2010): https://doi.,Jrg/10.1063/1.3474652, Sep. 9, 2010, 21 pages.

Karouta, "A practical approach to reactive ion etching," Journal of Physics D: Applied Physics, vol. 47, Mar. 2014, pp. 14.

\* cited by examiner

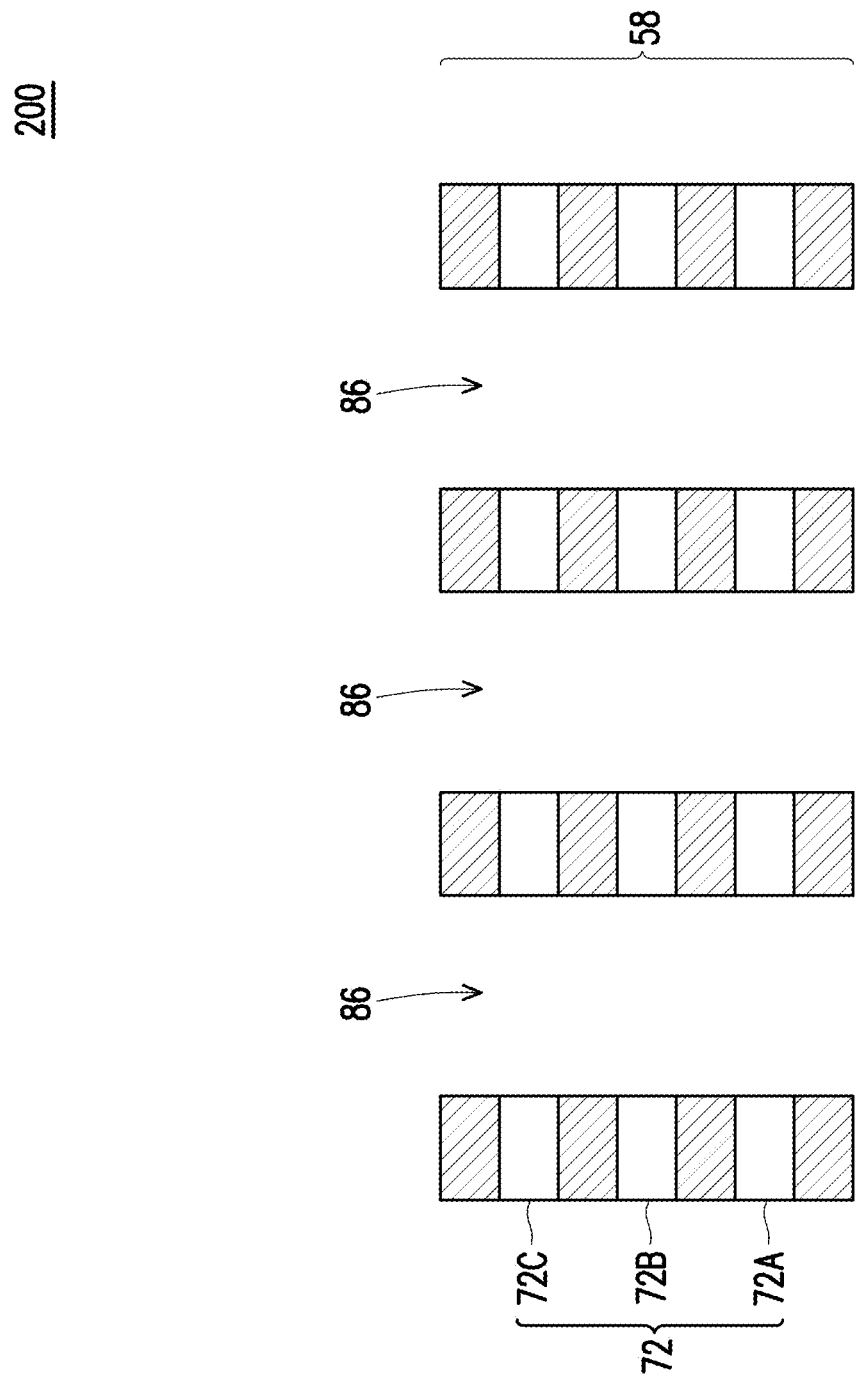

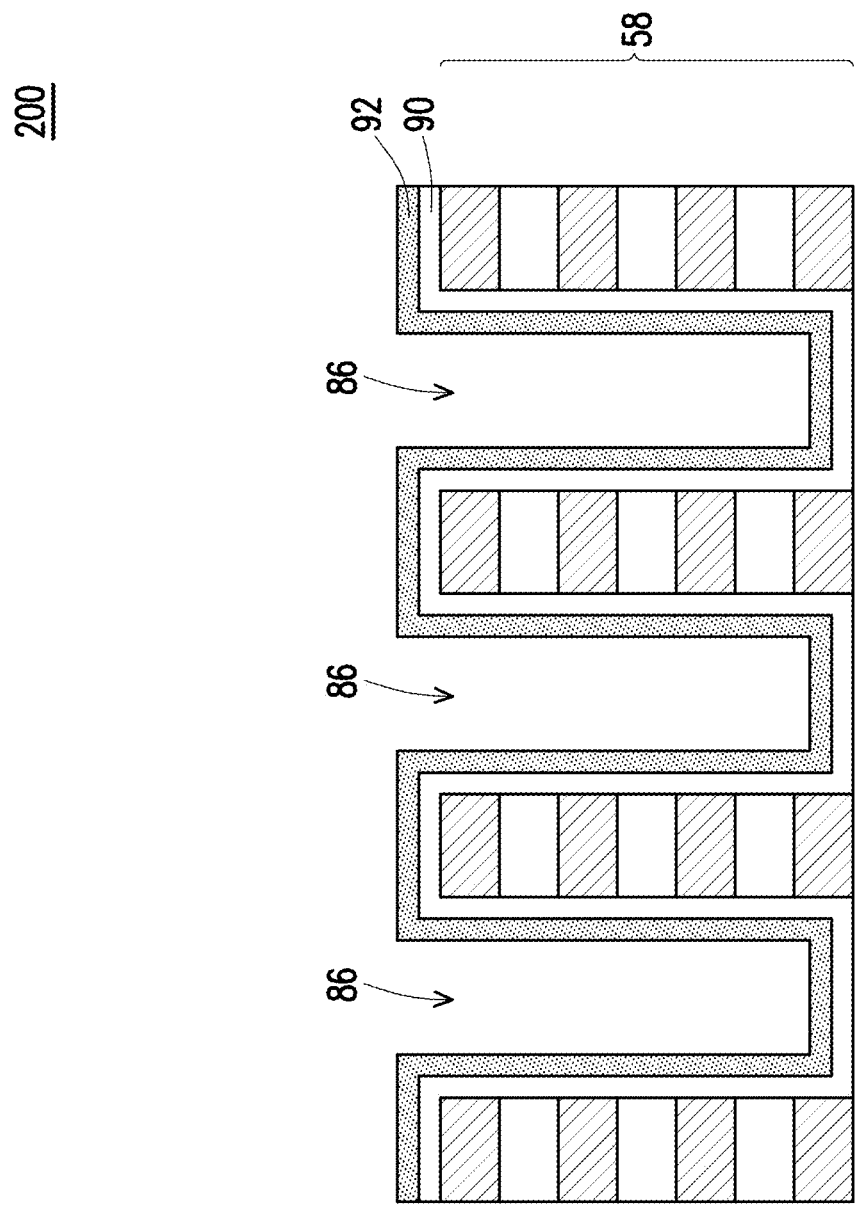

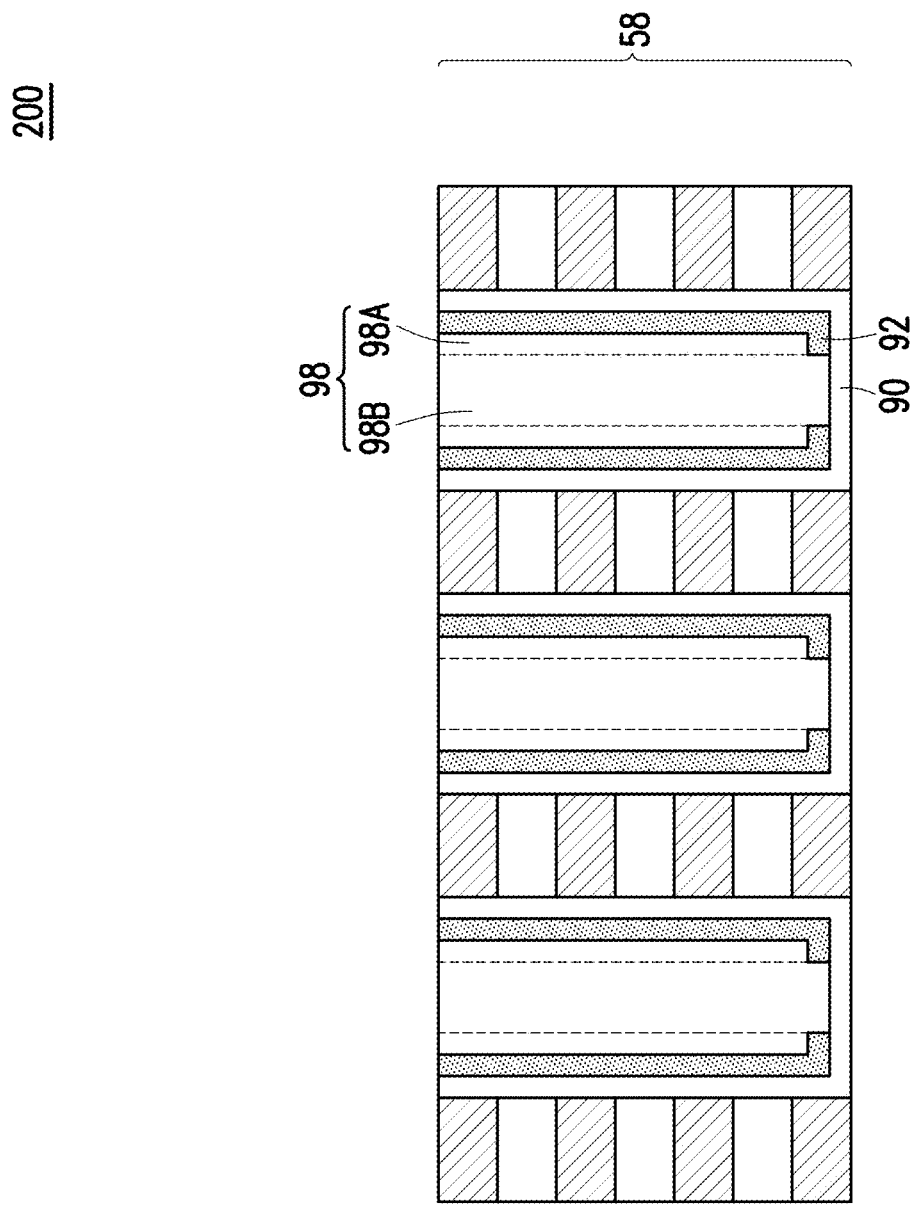

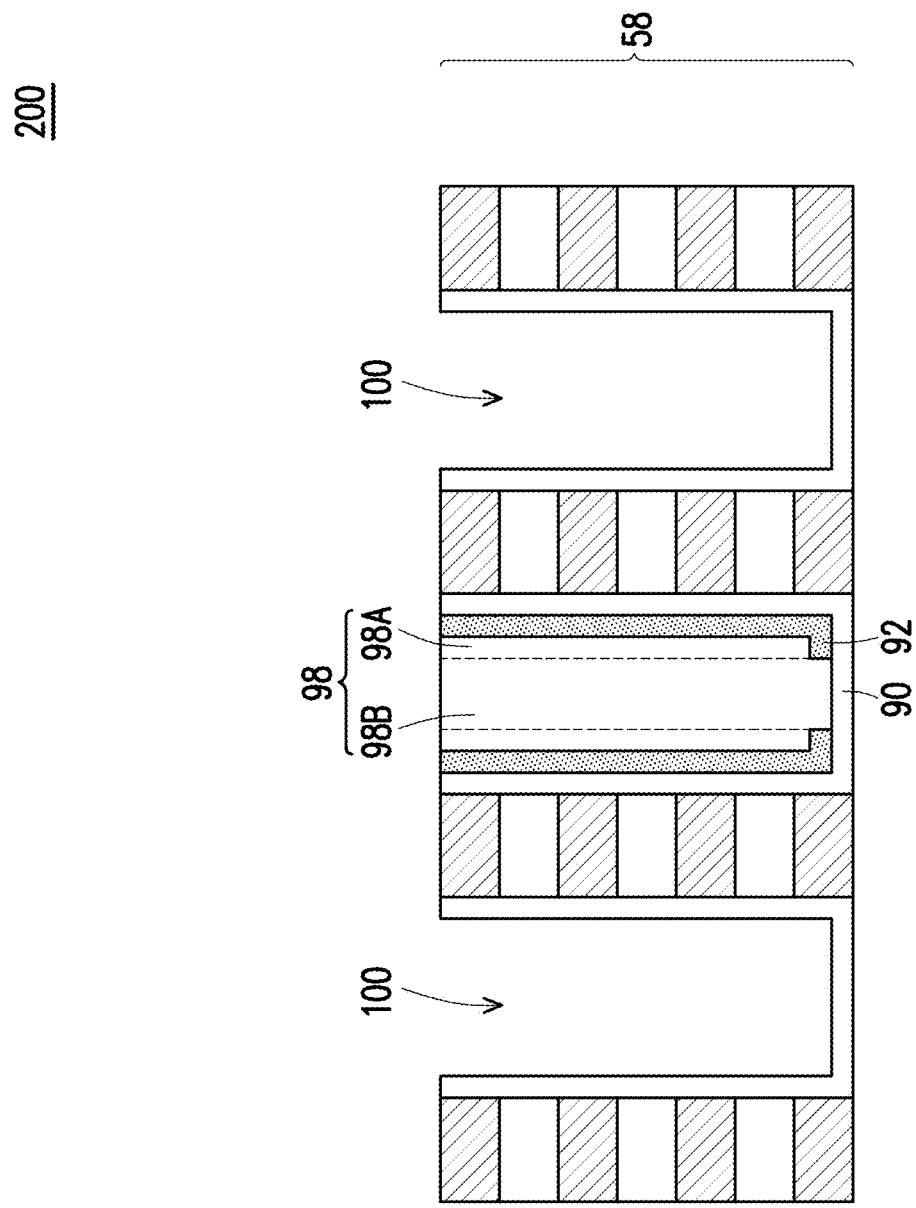

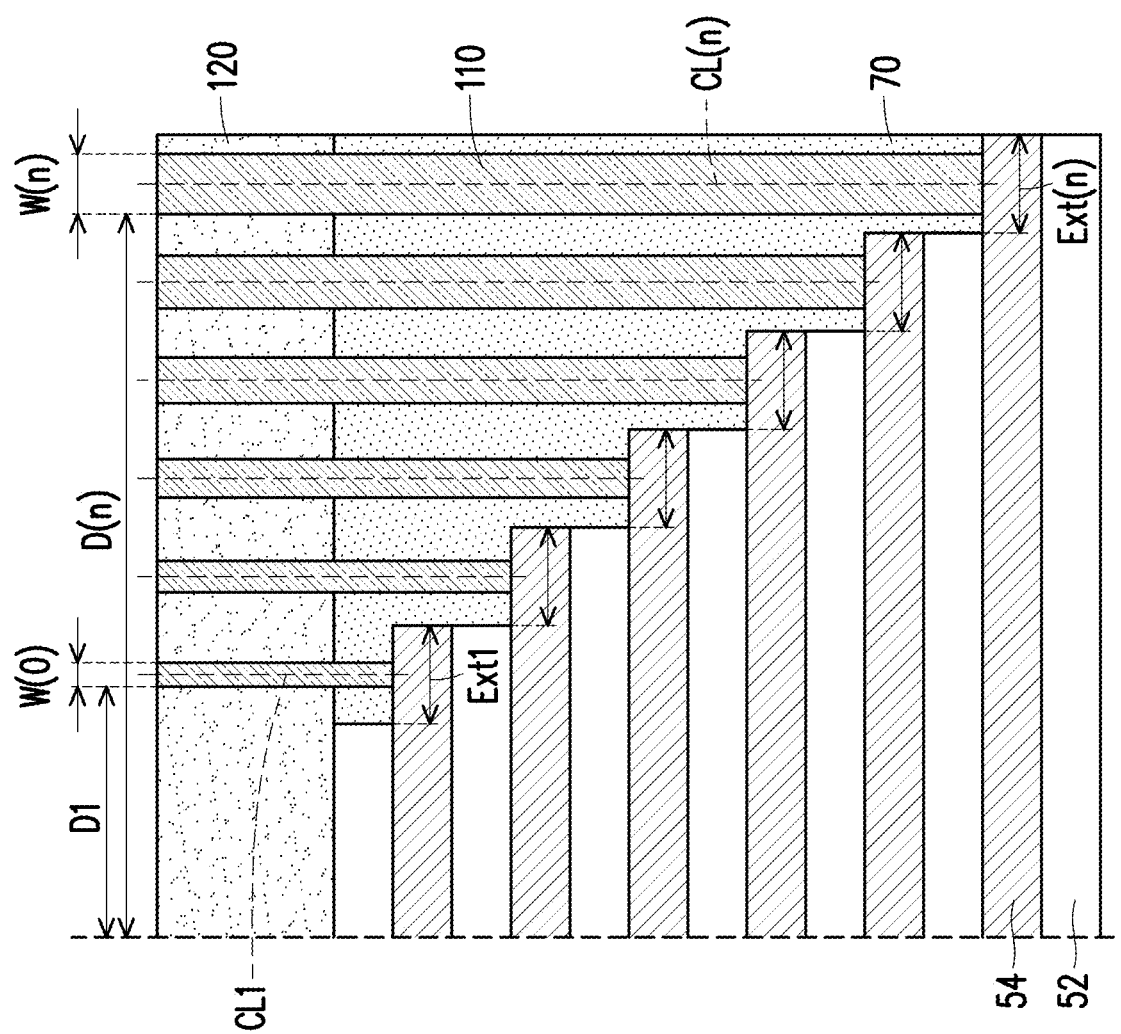

3D MEMORY ARRAY CONTACT STRUCTURES

PRIORITY CLAIM AND CROSS-REFERENCE

This application claims the benefit of U.S. Provisional Application No. 63/044,092, filed on Jun. 25, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6, 7, 8, 9, 10, 11, 12A, 12B, 13, 14, 15, 16, 17A, 17B, 18A, 18B, 19A, 19B, 20, 21, 22, 23A, 23B, 23C, 24A, 24B, 24C, 25A, 25B, 25C, 26A, 26B, 26C, 27A, 27B, and 27C illustrate varying views of manufacturing a memory array in accordance with some embodiments.

FIGS. 29, 30, and 31 illustrate various views of manufacturing the staircase contact structure in accordance with some embodiments.

DETAILED DESCRIPTION

Figure 1A:
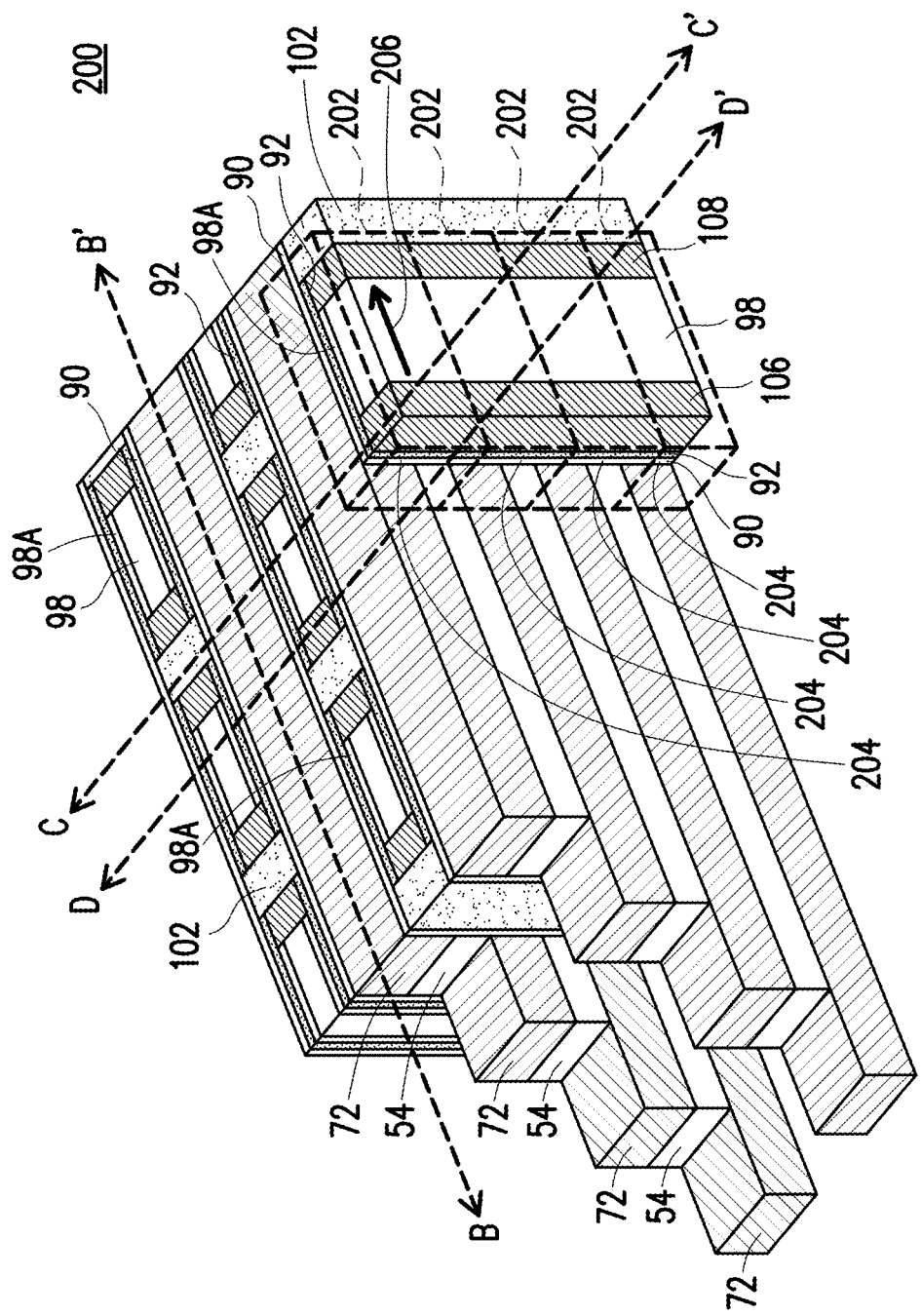
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D stacked memory array with a plurality of vertically stacked memory cells. Each memory cell includes thin film transistor (TFT) having a word line region acting as a gate electrode, a bit line region acting as a first source/drain electrode, and a source line region acting as a second source/drain electrode. Each TFT further includes an insulating memory film (e.g., as a gate dielectric) and an oxide semiconductor (OS) channel region.

In some embodiments, a contact staircase structure is formed from a stack of conductive layers separated by dielectric layers. The staircase structure provides word lines for the memory array, and conductive vias are formed to extend down and electrically connect to each of the conductive layers. The conductive vias may vary in width. For example, the conductive vias may increase in width as the vias are spaced farther from the transistor area of the memory array. An etching loading effect (e.g., wider staircase via critical dimensions are used for deeper etching depths and narrow staircase via critical dimensions are used for shallow etching depths) is used to prevent over etching of the openings and upper-layer word line shorts for the staircase vias due to a large difference in step heights between upper and lower layers. Material savings (e.g., mask materials), lower costs of manufacturing, and easy process flows may be achieved for producing a 3D stacked memory array device with reliable word line contact connectivity.

Figure 1B:
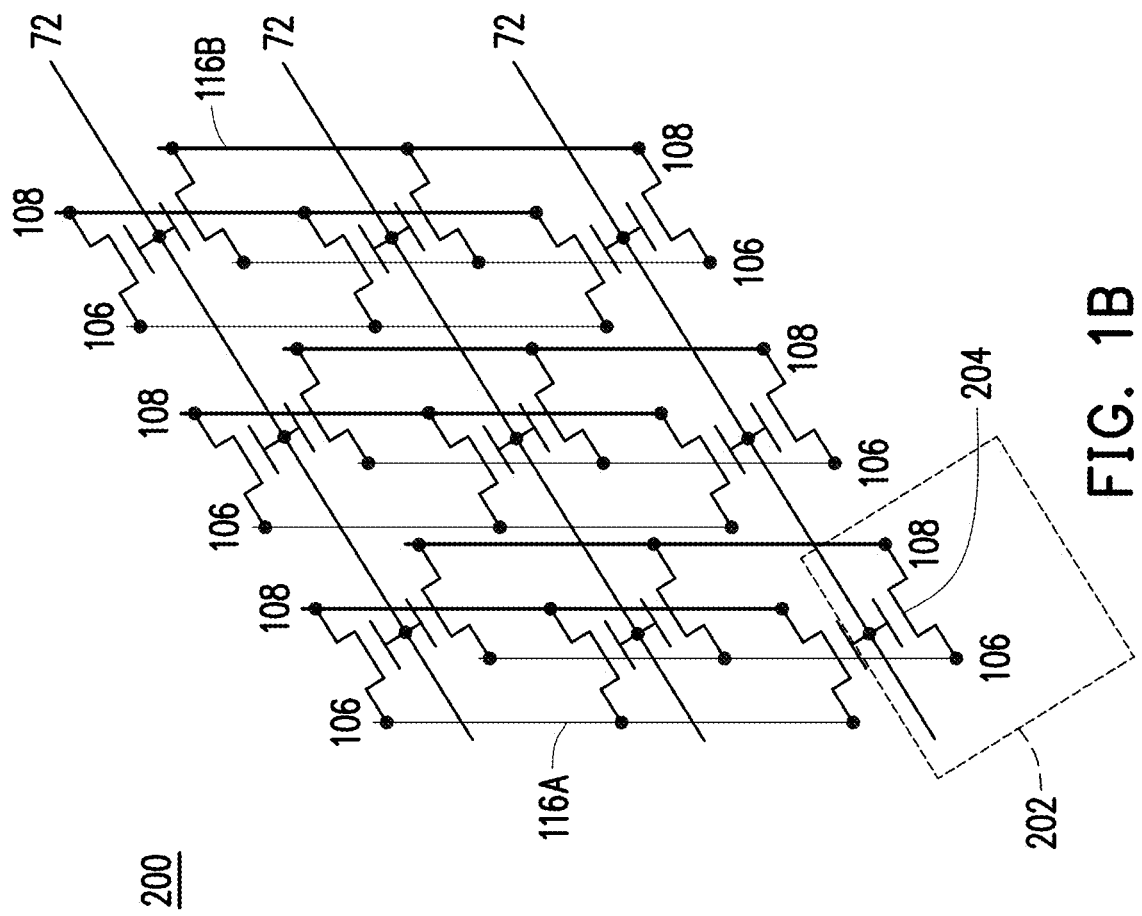
Figure 1C:
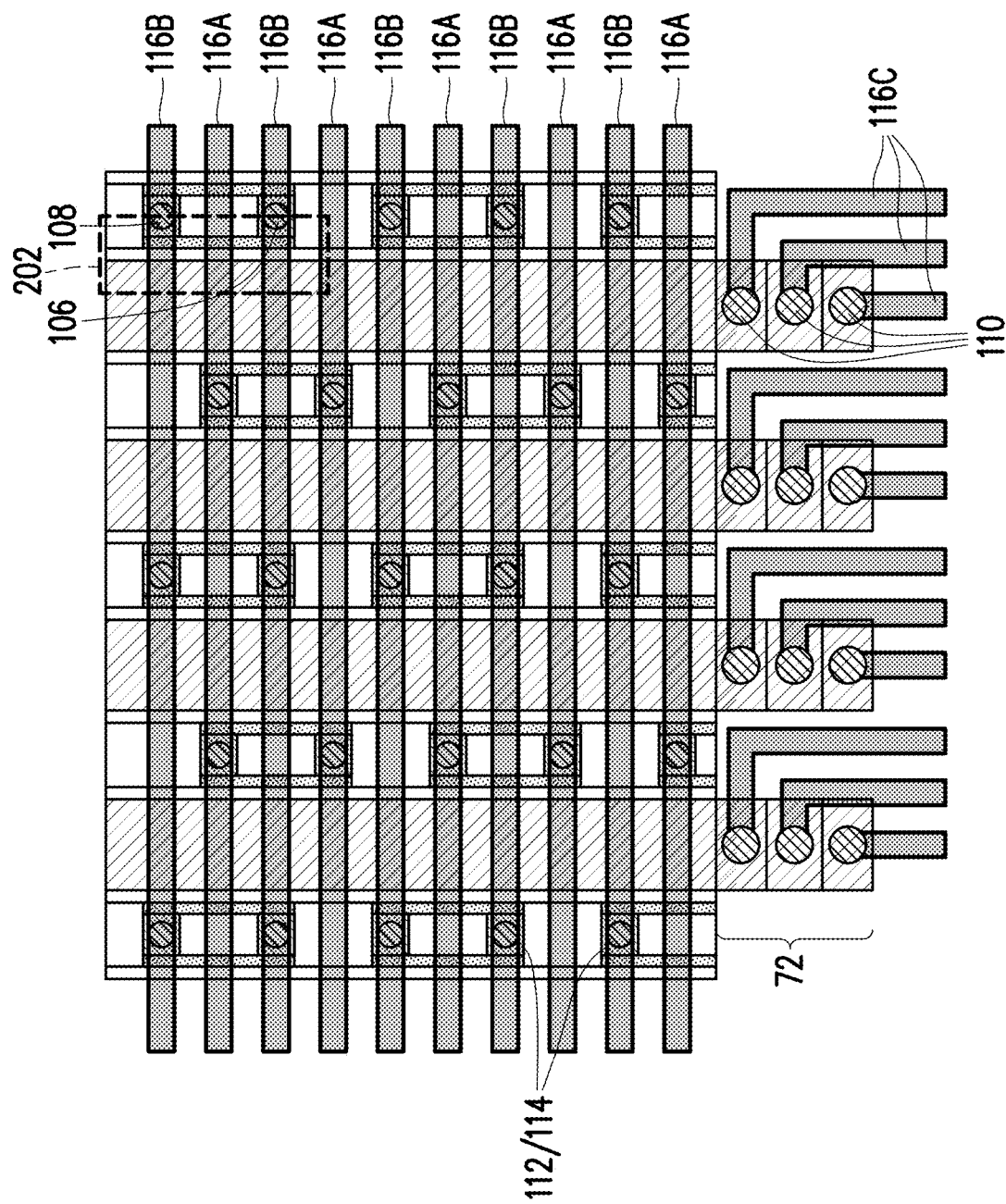

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 is a flash memory array, such as a NOR flash memory array, or the like. Each memory cell 202 may include a thin film transistor (TFT) 204 with an insulating, memory film 90 as a gate dielectric. In some embodiments, a gate of each TFT 204 is electrically coupled to a respective word line (e.g., conductive lines 72), a first source/drain region of each TFT 204 is electrically coupled to a respective bit line (e.g., conductive line 106), and a second source/drain region of each TFT 204 is electrically coupled to a respective source line (e.g., conductive line 108), which electrically couples the second source/drain region to ground. The memory cells 202 in a same vertical column of the memory array 200 may share a common bit line (BL) 116A and a common source line (SL) 116B while the memory cells 202 in a same horizontal row of the memory array 200 may share a common word line (WL) 116C.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., common bit lines 116A) and conductive lines 108 (e.g., common source lines 116B). The conductive lines 106 and 108 may each extend in a direction perpendicular to the conductive lines 72. A dielectric material 98 is disposed between and isolates adjacent ones of the conductive lines 106 and the conductive lines 108. In some embodiments, at least a portion of the dielectric material 98 is a low-hydrogen material formed using a hydrogen-comprising precursor that is introduced at a reduced flowrate. For example, at least portions of the dielectric material 98 (e.g., dielectric material 98A) in physical contact with an oxide semiconductor (OS) layer 92 (described below) may have a relatively low hydrogen concentration, such as, a less than 3 atomic percent (at %). The low hydrogen concentration (e.g., in the above range) may reduce hydrogen diffusion into the OS layer 92, thereby reducing defects and improving device stability. For example, by reducing hydrogen diffusion with the dielectric material 98, the threshold voltage ($V_{th}$) curve of the TFTs 204 may shift in a positive bias direction, enhancing stability of the TFTs 204, according to an embodiment. A relatively low hydrogen concentration can be achieved in the dielectric material 98 by, for example, reducing a flowrate of hydrogen-comprising precursor(s) used to deposit the dielectric material 98. For example, in embodiments where the dielectric material 98 comprises silicon oxide, silicon nitride, or the like, the dielectric material 98 may be deposited by a process with a relatively low SiH4 precursor flowrate to suppress Ho or H+ diffusion into the dielectric material 98 and the OS layer 92.

Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the memory array 200 may also include an oxide semiconductor (OS) layer 92. The OS layer 92 may provide channel regions for the TFTs 204 of the memory cells 202. For example, when an appropriate voltage (e.g., higher than a respective threshold voltage ($V_{th}$) of a corresponding TFT 204) is applied through a corresponding conductive lines 72, a region of the OS layer 92 that intersects the conductive lines 72 may allow current to flow from the conductive lines 106 to the conductive lines 108 (e.g., in the direction indicated by arrow 206). The OS layer 92 may have a relatively low hydrogen concentration, such as in a range of about 1020 to about 1022 atoms per cubic centimeter as measured by Time-of-Flight Secondary Ion Mass Spectrometry (ToF-SIMS) analysis. As a result, stability of the TFTs 204 may be improved compared to TFTs with OS layers having a higher concentration of hydrogen.

A memory film 90 is disposed between the conductive lines 72 and the OS layer 92, and the memory film 90 may provide gate dielectrics for the TFTs 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a ferroelectric random access memory (FERAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding TFT 204 varies, and a digital value (e.g., 0 or 1) can be stored. For example, when a region of the memory film 90 has a first electrical polarization direction, the corresponding TFT 204 may have a relatively low threshold voltage, and when the region of the memory film 90 has a second electrical polarization direction, the corresponding TFT 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive lines 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding TFT 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive lines 72 (e.g., the world line). Depending on the polarization direction of the corresponding region of the memory film 90, the TFT 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Cross-section B-B' is along a longitudinal axis of conductive lines 72 and in a direction, for example, parallel to the direction of current flow of the TFTs 204. Cross-section C-C' is perpendicular to cross-section B-B' and is parallel to a longitudinal axis of the conductive lines 72. Cross-section C-C' extends through the conductive lines 106. Cross-section D-D' is parallel to cross-section C-C' and extends through the dielectric material 102. Subsequent figures refer to these reference cross-sections for clarity.

Figure 2:
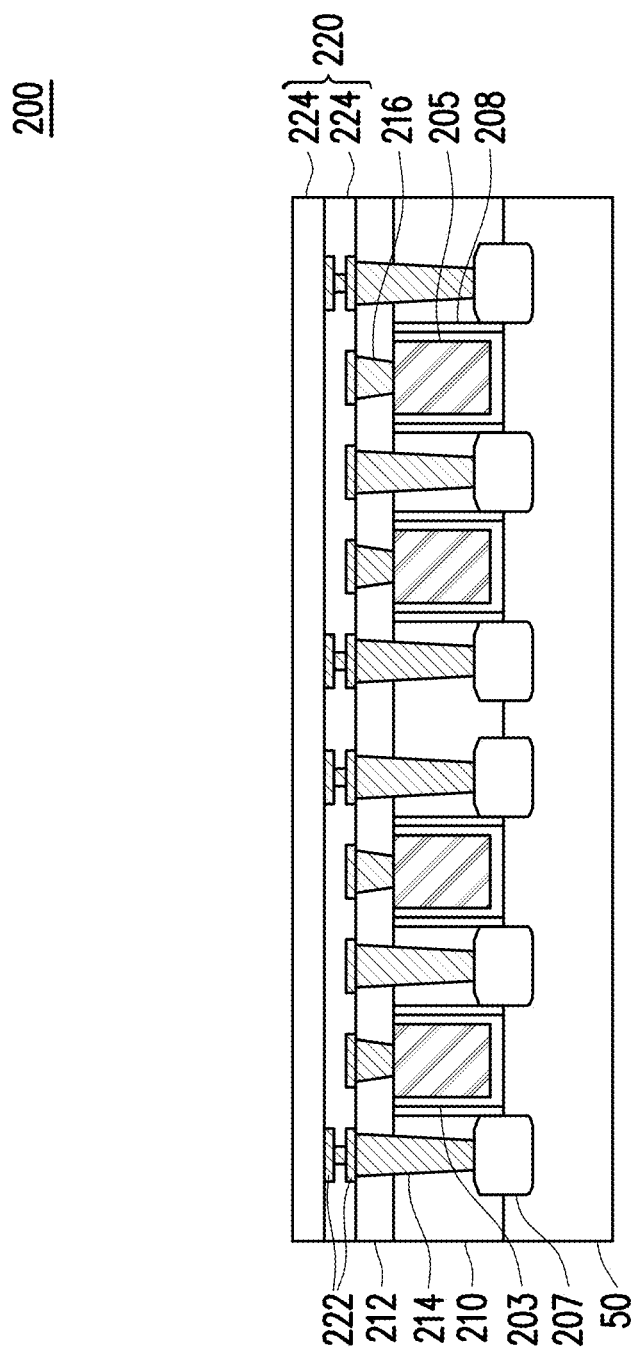

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 203 over top surfaces of the substrate 50 and gate electrodes 205 over the gate dielectric layers 203. Source/drain regions 207 are disposed in the substrate 50 on opposite sides of the gate dielectric layers 203 and the gate electrodes 205. Gate spacers 208 are formed along sidewalls of the gate dielectric layers 203 and separate the source/drain regions 207 from the gate electrodes 205 by appropriate lateral distances. In some embodiments, the transistors may be planar field effect transistors (FETs), fin field effect transistors (finFETs), nano-field effect transistors (nanoFETs), or the like.

A first ILD 210 surrounds and isolates the source/drain regions 207, the gate dielectric layers 203, and the gate electrodes 205 and a second ILD 212 is over the first ILD 210. Source/drain contacts 214 extend through the second ILD 212 and the first ILD 210 and are electrically coupled to the source/drain regions 207 and gate contacts 216 extend through the second ILD 212 and are electrically coupled to the gate electrodes 205. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
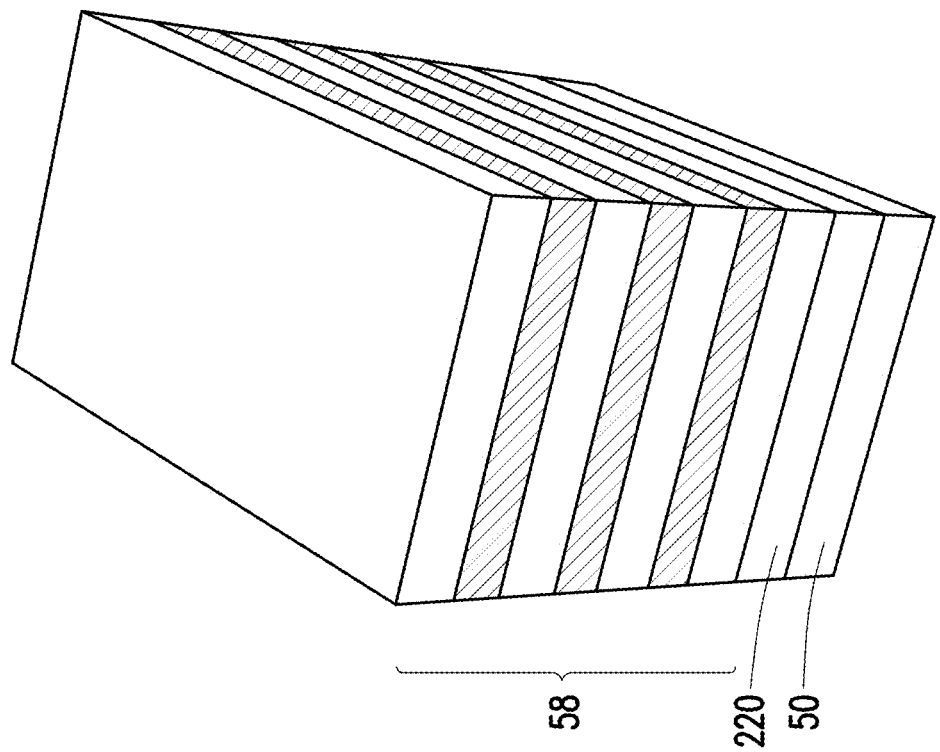
Figure 3B:
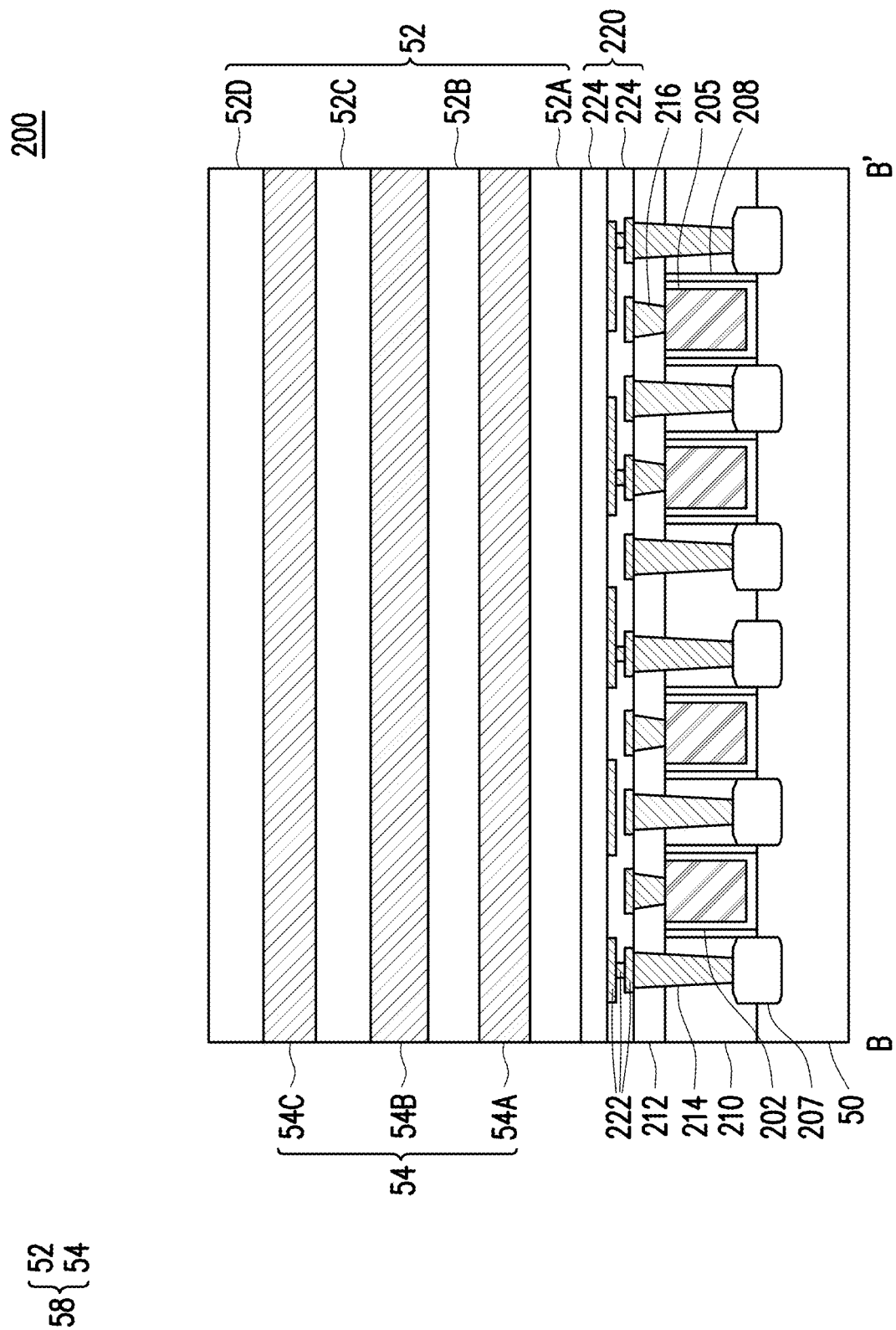

In FIGS. 3A and 3B, a multilayer stack 58 is formed over the interconnect structure 220 of FIG. 2. The substrate 50, the transistors, the ILDs, and the interconnect structure 220 may be omitted from subsequent drawings for the purposes of simplicity and clarity. Although the multilayer stack 58 is illustrated as contacting the dielectric layers 224 of the interconnect structure 220, any number of intermediate layers may be disposed between the substrate 50 and the multilayer stack 58. For example, one or more additional interconnect layers comprising conductive features in insulting layers (e.g., low-k dielectric layers) may be disposed between the substrate 50 and the multilayer stack 58. In some embodiments, the conductive features may be patterned to provide power, ground, and/or signal lines for the active devices on the substrate 50 and/or the memory array 200 (see FIGS. 1A and 1B).

The multilayer stack 58 includes alternating layers of conductive layers 54A-C (collectively referred to as conductive layers 54) and dielectric layers 52A-D (collectively referred to as dielectric layers 52). The conductive layers 54 may be patterned in subsequent steps to define the conductive lines 54 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52. Furthermore, the multilayer stack 58 may comprise any number of suitable types of material layers and the number and ordering of the material layers may be based on a desired device intended to be formed in the multilayer stack 58.

FIGS. 4 through 12B are views of intermediate stages in the manufacturing a staircase structure 68 of the memory array 200, in accordance with some embodiments. FIGS. 4 through 11 and 12B are illustrated along reference cross-section B-B' illustrated in FIG. 1. FIG. 12A is illustrated in a three-dimensional view.

Figure 4:
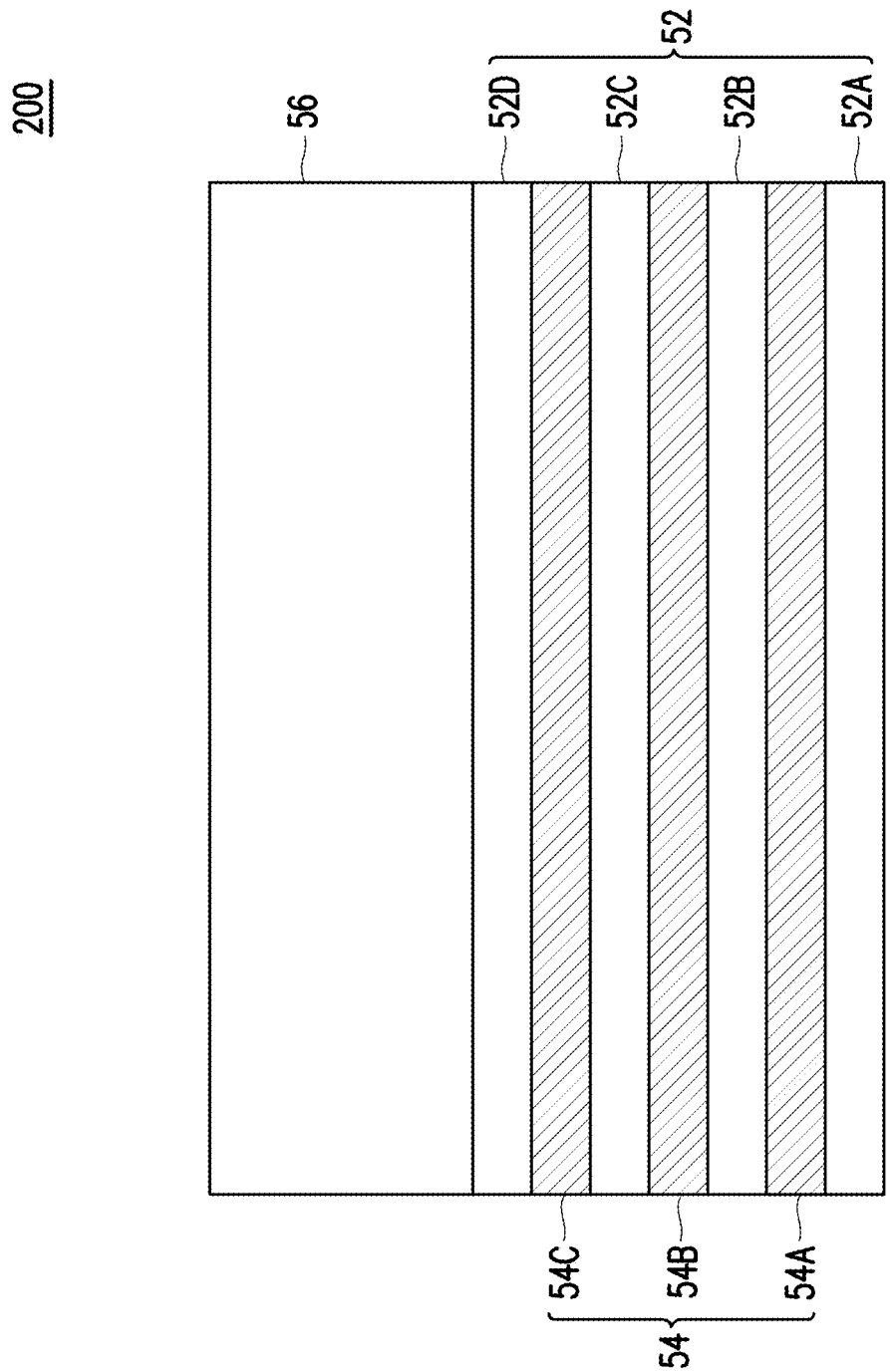

In FIG. 4 a photoresist 56 is formed over the multilayer stack 58. As discussed above, the multilayer stack 58 may comprise alternating layers of the conductive layers 54 (labeled 54A, 54B, and 54C) and the dielectric layers 52 (labeled 52A, 52B, 52C, and 52D). The photoresist 56 can be formed by using a spin-on technique.

Figure 5:
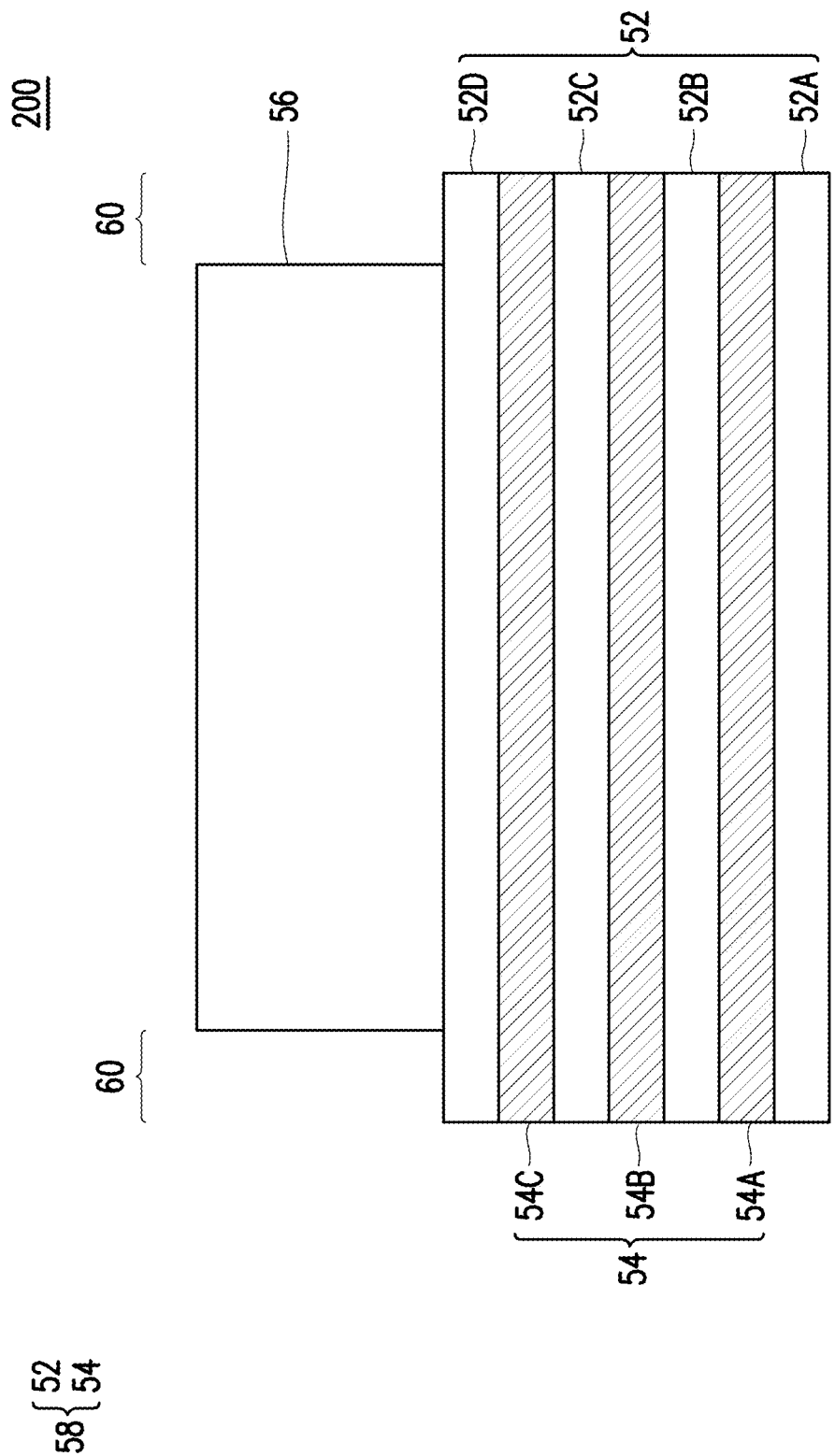

In FIG. 5, the photoresist 56 is patterned to expose the multilayer stack 58 in regions 60 while masking remaining portions of the multilayer stack 58. For example, a topmost layer of the multilayer stack 58 (e.g., dielectric layer 52D) may be exposed in the regions 60. The photoresist 56 may be patterned using acceptable photolithography techniques.

Figure 6:
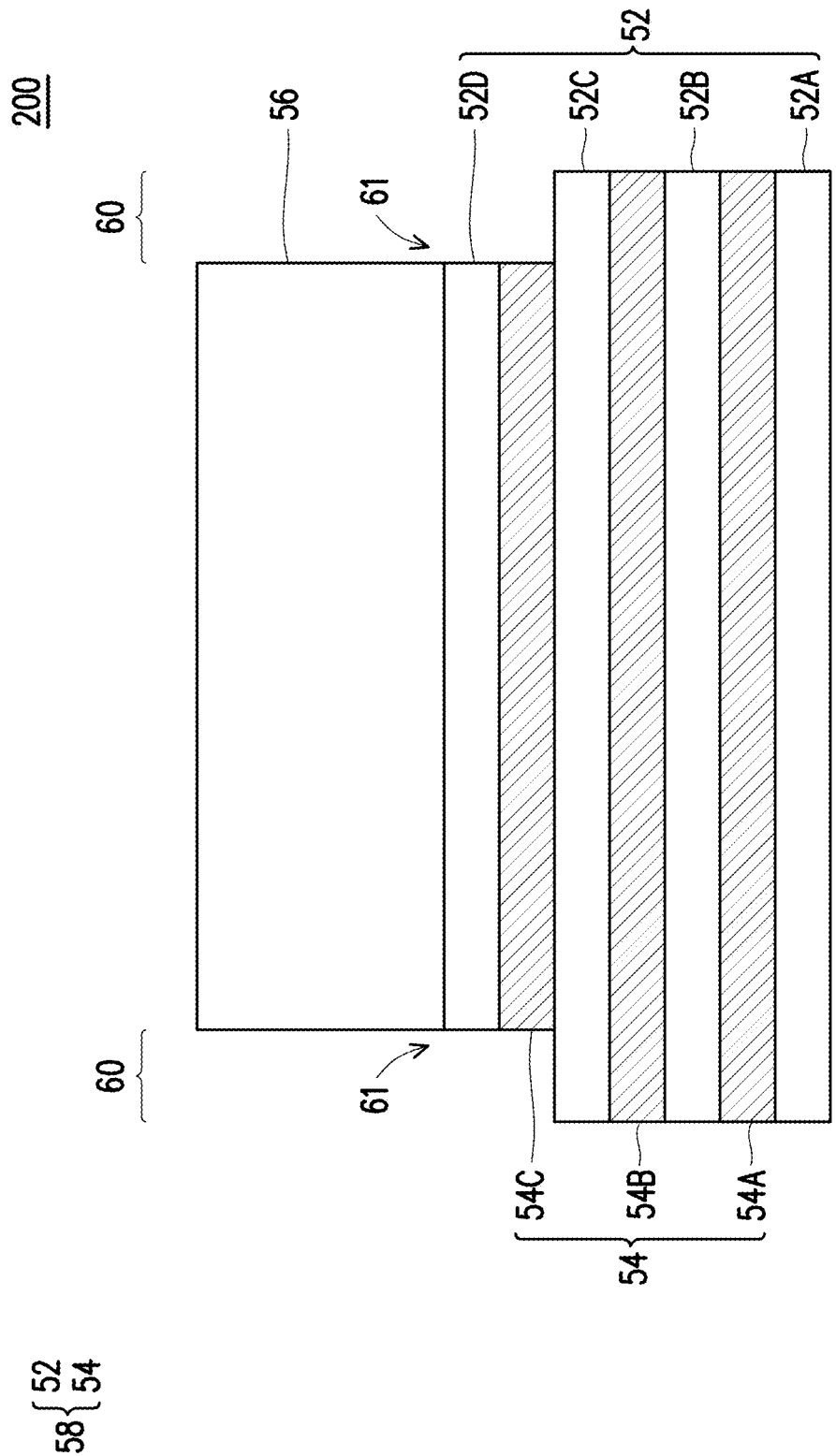

In FIG. 6, the exposed portions of the multilayer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the dielectric layer 52D and the conductive layer 54C in the regions 60 to define openings 61. Because the dielectric layer 52D and the conductive layer 54C have different material compositions, etchants used to remove exposed portions of these layers may be different. In some embodiments, the conductive layer 54C acts as an etch stop layer while etching the dielectric layer 52D, and the dielectric layer 52C acts as an etch stop layer while etching the conductive layer 54C. As a result, the portions of the dielectric layer 52D and the conductive layer 54C may be selectively removed without removing remaining layers of the multilayer stack 58, and the openings 61 may be extended to a desired depth. Alternatively, a timed etch processes may be used to stop the etching of the openings 61 after the openings 61 reach a desired depth. In the resulting structure, the dielectric layer 52C is exposed in the regions 60.

Figure 7:
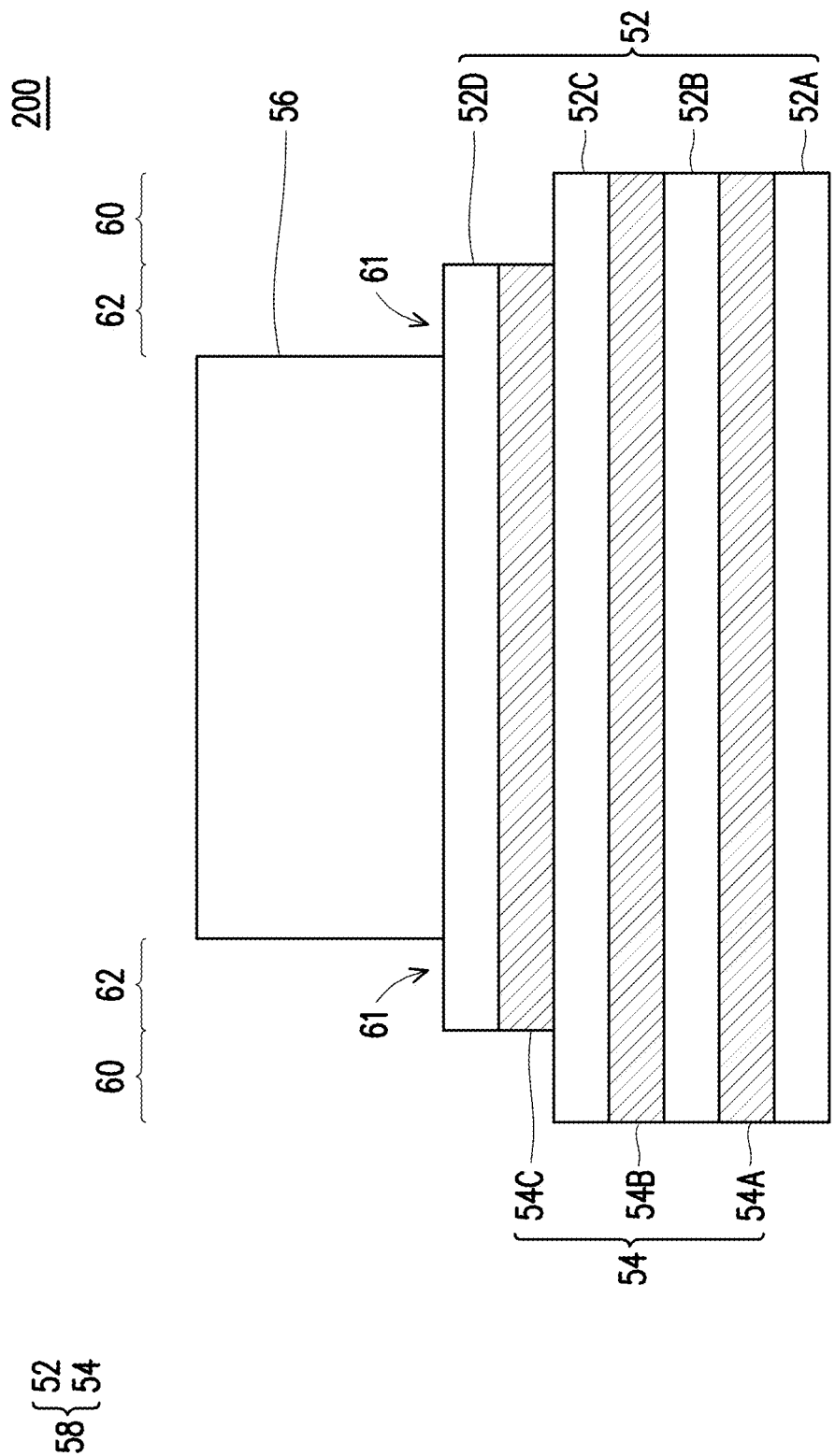

In FIG. 7, the photoresist 56 is trimmed to expose additional portions of the multilayer stack 58. The photoresist can be trimmed using acceptable photolithography techniques. As a result of the trimming, a width of the photoresist 56 is reduced, and portions the multilayer stack 58 in regions 60 and 62 may be exposed. For example, a top surface of the dielectric layer 52C may be exposed in the regions 60, and a top surface of the dielectric layer 52D may be exposed in the regions 62.

Figure 8:
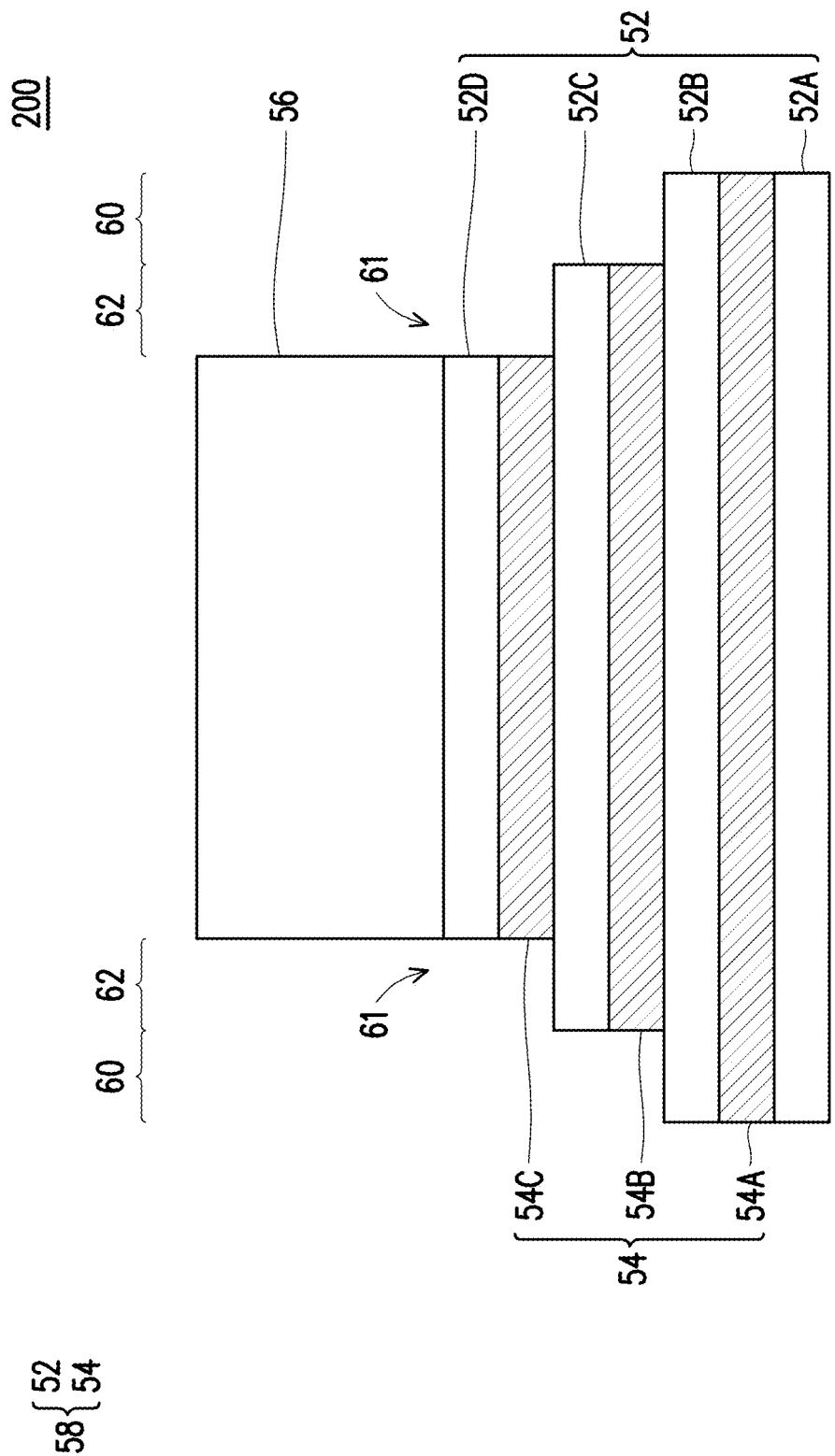

In FIG. 8, portions of the dielectric layer 52D, the conductive layer 54C, the dielectric layer 52C, and the conductive layer 54B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multilayer stack 58. Because the dielectric layers 52D/52C and the conductive layers 54C/54B have different material compositions, etchants used to remove exposed portions of these layers may be different. In some embodiments, the conductive layer 54C acts as an etch stop layer while etching the dielectric layer 52D; the dielectric layer 52C acts as an etch stop layer while etching conductive layer 54C; the conductive layer 54B acts as an etch stop layer while etching the dielectric layer 52C; and the dielectric layer 52B acts as an etch stop layer while etching the conductive layer 54B. As a result, portions of the dielectric layer 52D/52C and the conductive layers 54B/54C may be selectively removed without removing remaining layers of the multilayer stack 58, and the openings 61 may be extended to a desired depth. Further, during the etching processes, unetched portions of the conductive layers 54 and dielectric layers 52 act as a mask for underlying layers, and as a result a previous pattern of the dielectric layer 52D and the conductive layer 54C (see FIG. 7) may be transferred to the underlying dielectric layer 52C and the conductive layer 54B. In the resulting structure, the dielectric layer 52B is exposed in the regions 60, and the dielectric layer 52C is exposed in the regions 62.

Figure 9:
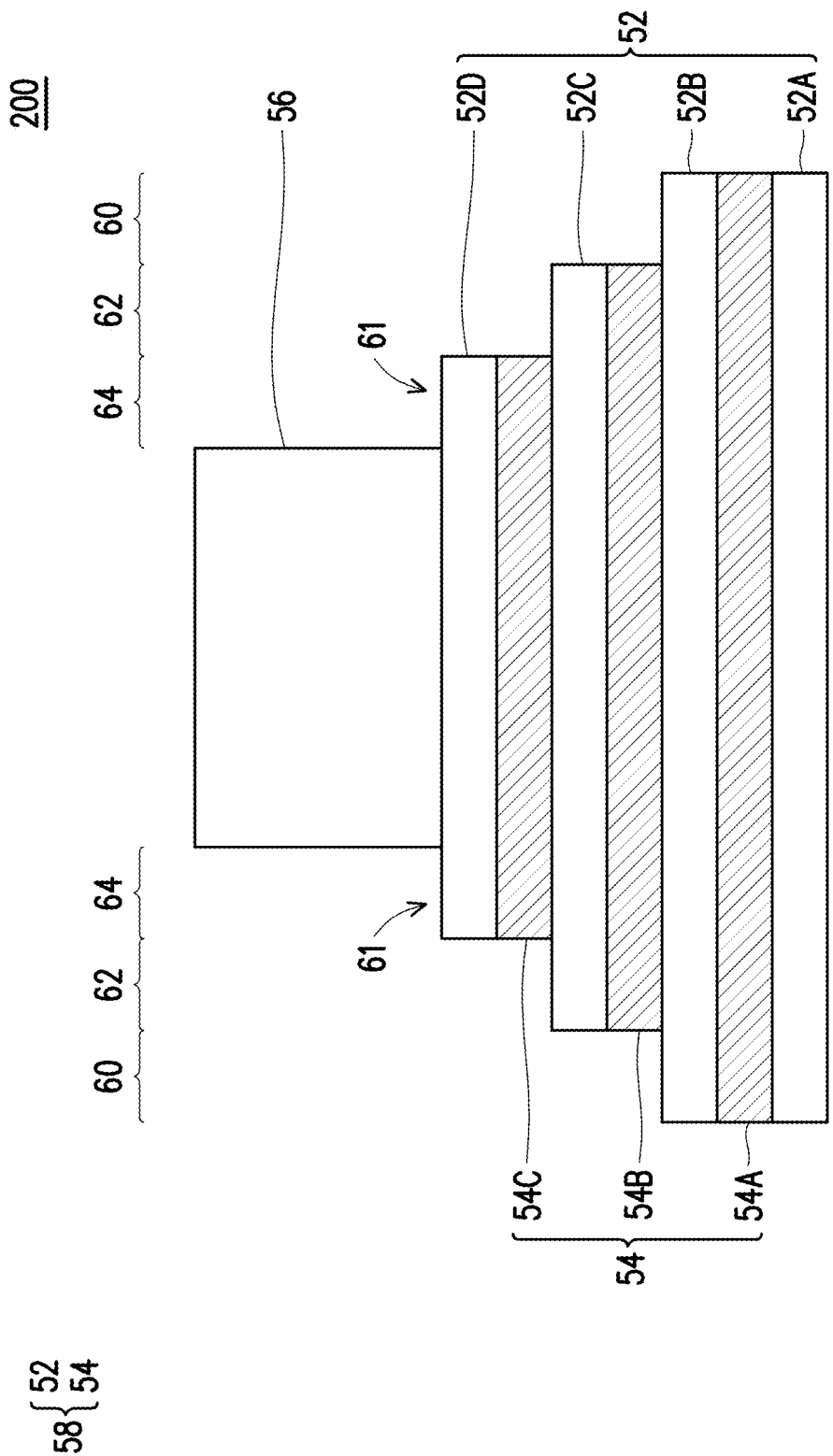

In FIG. 9, the photoresist 56 is trimmed to expose additional portions of the multilayer stack 58. The photoresist can be trimmed using acceptable photolithography techniques. As a result of the trimming, a width of the photoresist 56 is reduced, and portions the multilayer stack 58 in regions 60, 62, and 64 may be exposed. For example, a top surface of the dielectric layer 52B may be exposed in the regions 60; a top surface of the dielectric layer 52C may be exposed in the regions 62; and a top surface of the dielectric layer 52D may be exposed in the regions 64.

Figure 10:
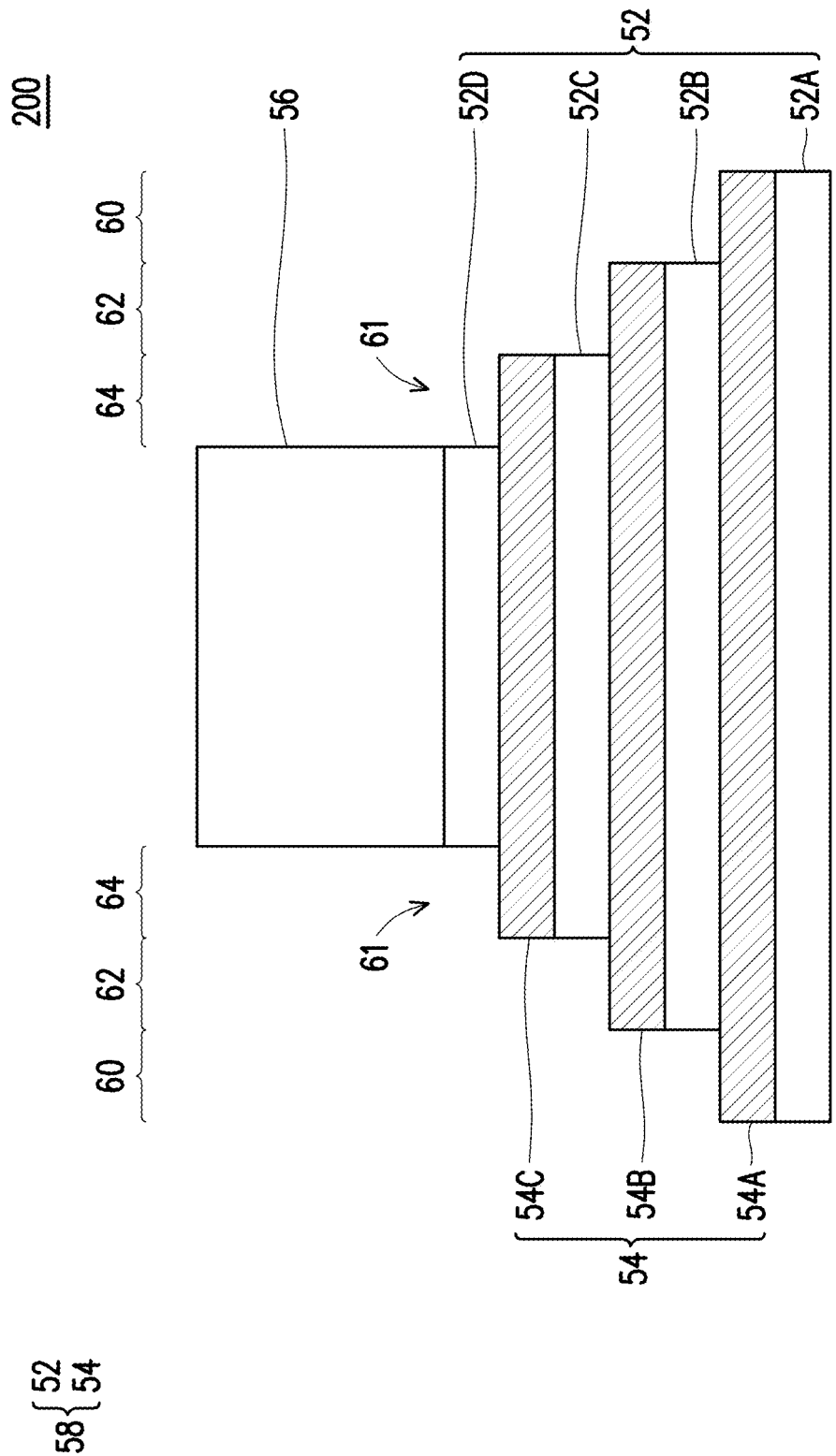

In FIG. 10, portions of the dielectric layers 52D, 52C, and 52B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multilayer stack 58. In some embodiments, the conductive layer 54C acts as an etch stop layer while etching the dielectric layer 52D; the conductive layer 54B acts as an etch stop layer while etching the dielectric layer 52C; and the conductive layer 54A acts as an etch stop layer etching the dielectric layer 52B. As a result, portions of the dielectric layers 52D, 52C, and 52B may be selectively removed without removing remaining layers of the multilayer stack 58, and the openings 61 may be extended to a desired depth. Further, during the etching processes, each of the conductive layers 54 act as a mask for underlying layers, and as a result a previous pattern of the conductive layers 54C/54B (see FIG. 9) may be transferred to the underlying dielectric layers 52C/52B. In the resulting structure, the conductive layer 54A is exposed in the regions 60; the conductive layer 54B is exposed in the regions 62; and the conductive layer 54C is exposed in the regions 64.

Figure 11:
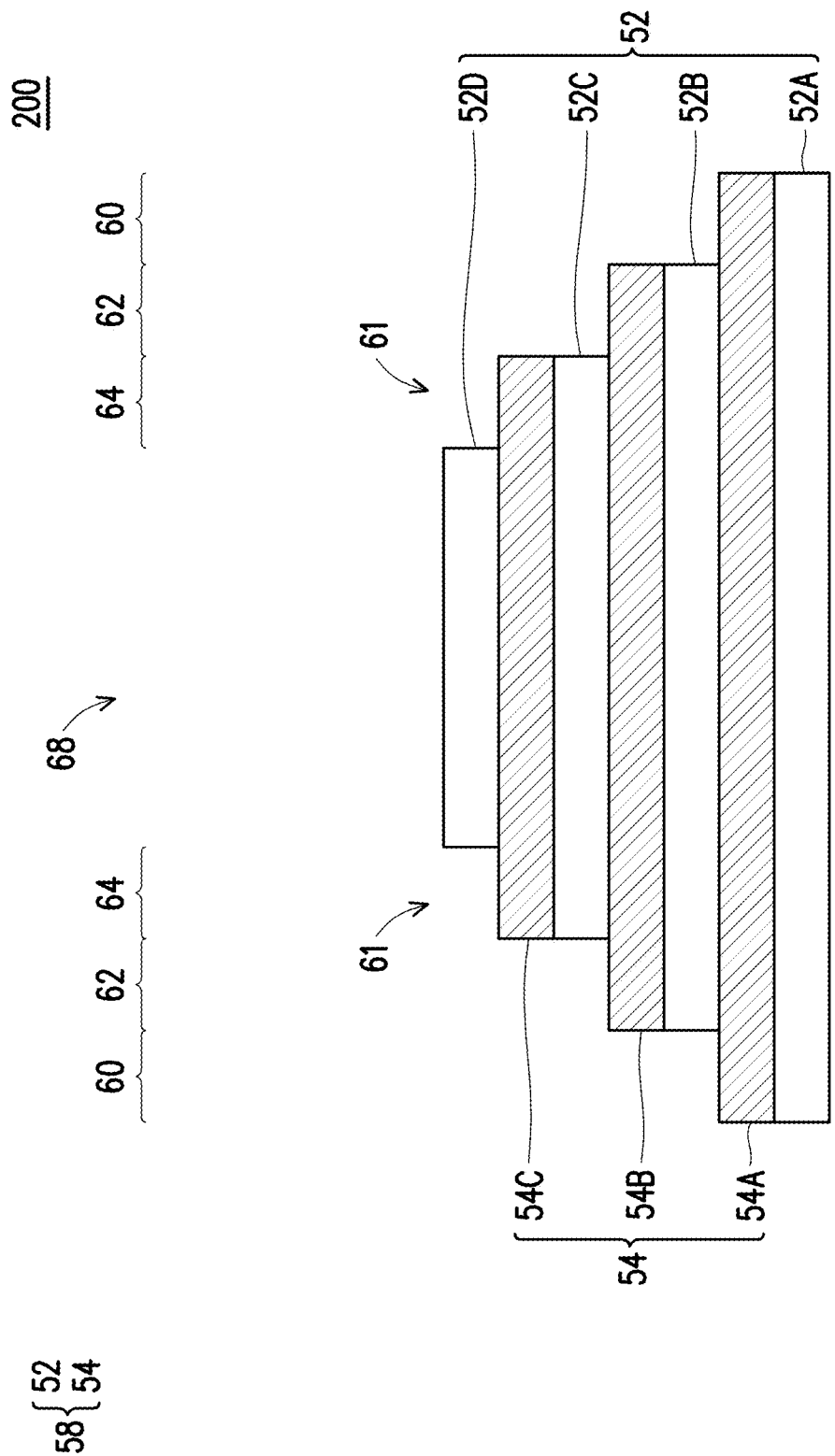

In FIG. 11, the photoresist 56 may be removed, such as by an acceptable ashing or wet strip process. Thus, a staircase structure 68 is formed. The staircase structure 68 comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive line 54A may longer than the conductive line 54B; the conductive line 54B may be longer than the conductive line 54C; and the conductive line 54C may be longer than the conductive line 54D. As a result, conductive contacts can be made from above the staircase contact structures 68 to each of the conductive layers 54 in subsequent processing steps.

Figure 12A:
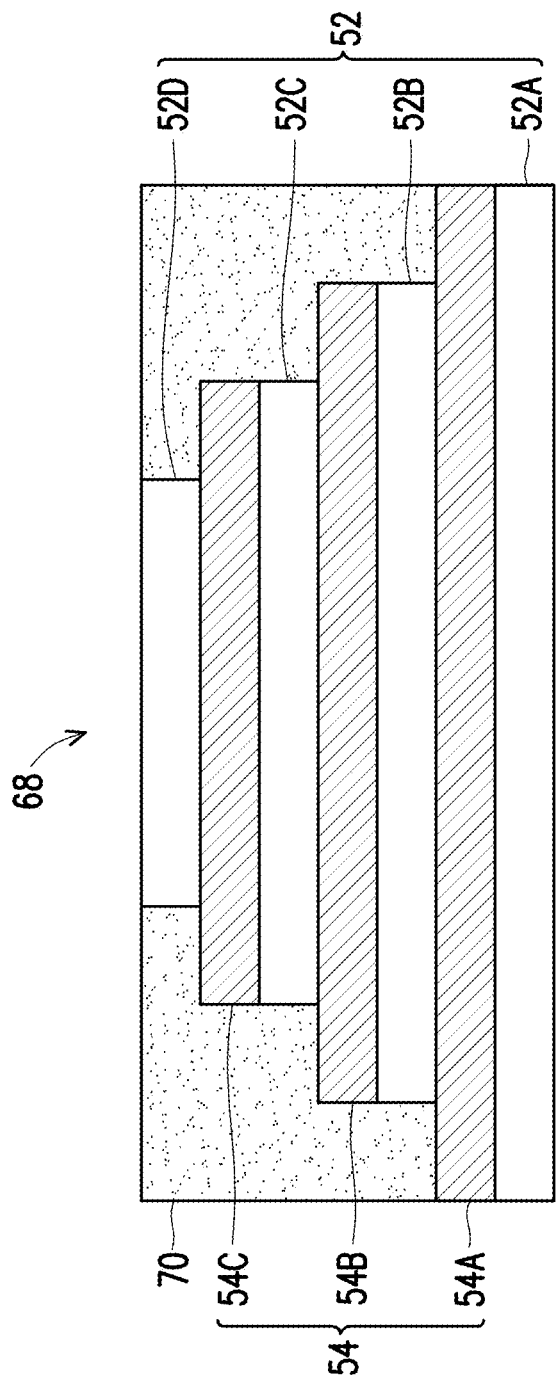

In FIG. 12A, an inter-metal dielectric (IMD) 70 is deposited over the multilayer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

As further illustrated in FIG. 12A, a removal process is then applied to the IMD 70 to remove excess dielectric material over the multilayer stack 58. In some embodiments, a planarization process such as a chemical mechanical polish (CMP), an etch-back process, combinations thereof, or the like may be utilized. According to some embodiments, the planarization process exposes the multilayer stack 58 such that top surfaces of the multilayer stack 58 and IMD 70 are level after the planarization process is complete. In other embodiments, the planarization process planarizes the IMD 70 to a desired height above a topmost layer (e.g., dielectric layer 52D) of the multilayer stack 58.

Figure 12B:
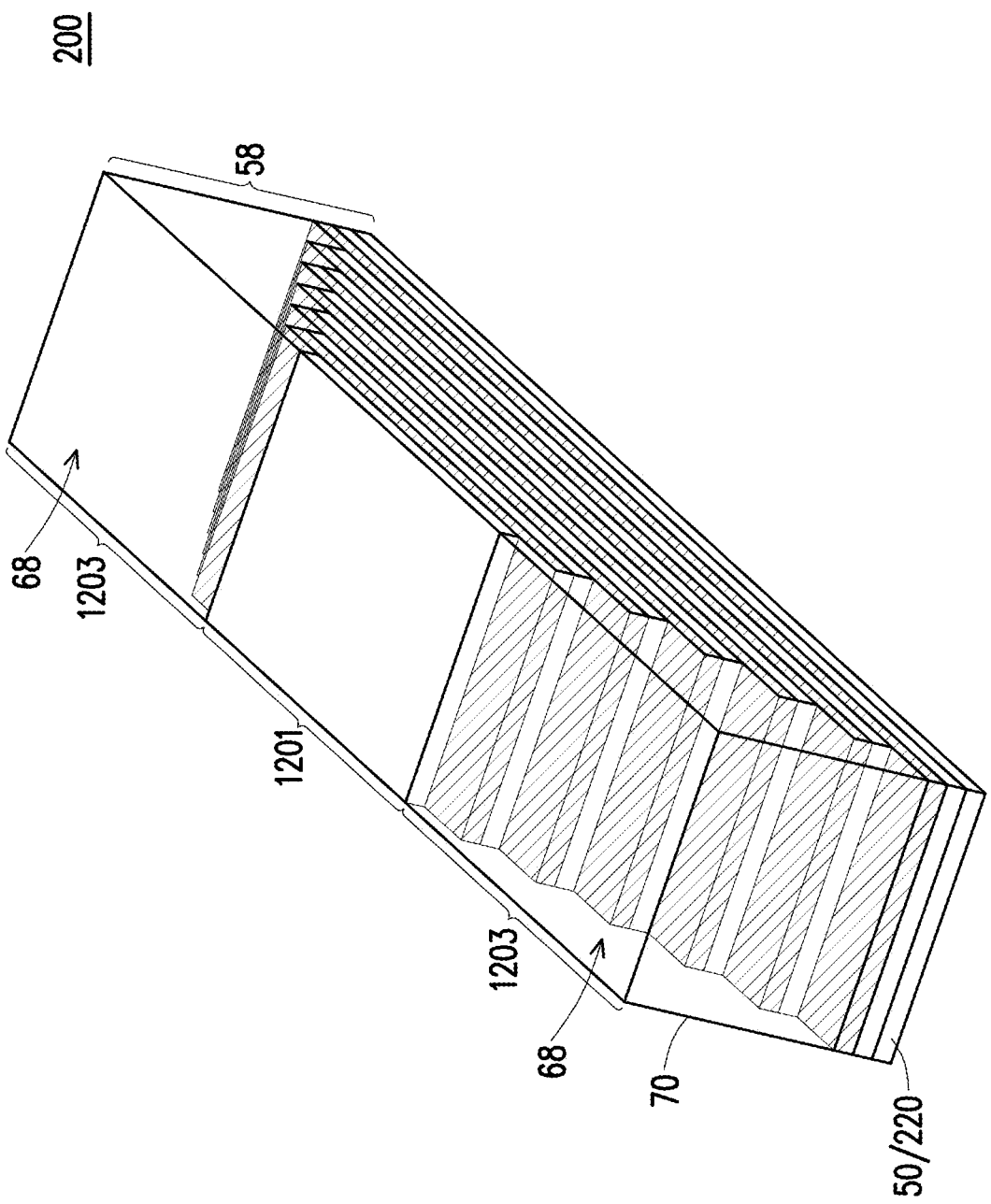

FIG. 12B is a perspective view of the staircase structure 68, according to some embodiments. In particular, FIG. 12B illustrates the staircase contact structures 68 having been formed from a multilayer stack 58 comprising four of the dielectric layers 52 and five of the conductive lines 54. In addition, FIG. 12B illustrates a note, according to some embodiments. Although embodiments of the staircase structures 68 have been illustrated as comprising a particular number of the conductive lines 54 and the dielectric layers 52, it is understood that the staircase contact structures 68 may be formed to have any other suitable material layers and may have any number of conductive lines 54 and dielectric layers 52.

FIGS. 13 through 17B are views of intermediate stages in the manufacturing of the memory array 200 using the multilayer stack 58 of FIG. 3A, in accordance with some embodiments. In FIGS. 13 through 17B the multilayer stack 58 is formed and trenches are formed in the multilayer stack 58, thereby defining the conductive lines 72. The conductive lines 72 may correspond to word lines in the memory array 200, and the conductive lines 72 may further provide gate electrodes for the resulting TFTs of the memory array 200. FIG. 17A is illustrated in a three-dimensional view. FIGS. 13 through 16 and 17B are illustrated along reference cross-section C-C' illustrated in FIG. 1A.

Figure 13:
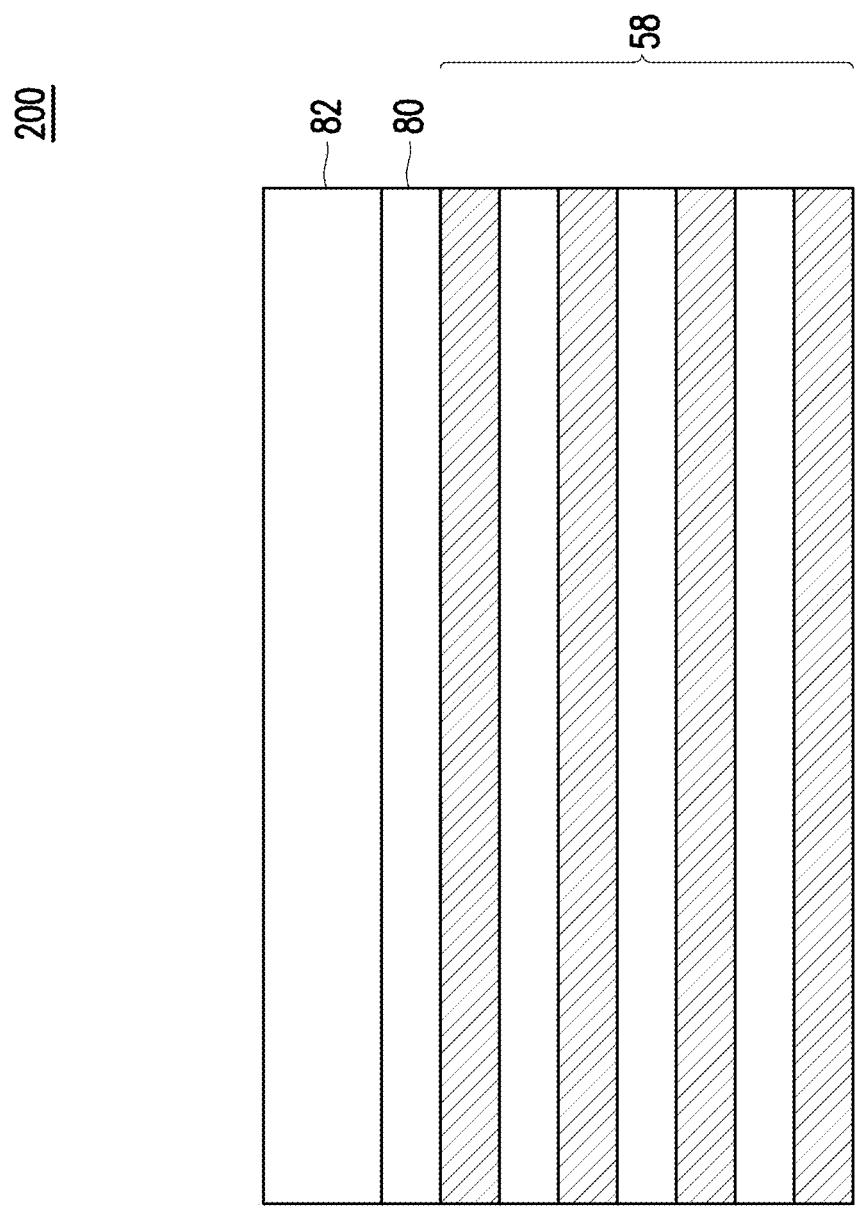

In FIG. 13, a hard mask 80 and a photoresist 82 are deposited over the multilayer stack 58. The hard mask 80 may include, for example, silicon nitride, silicon oxynitride, or the like, which may be deposited by CVD, PVD, ALD, PECVD, or the like. The photoresist 82 can be formed by using a spin-on technique, for example.

Figure 14:
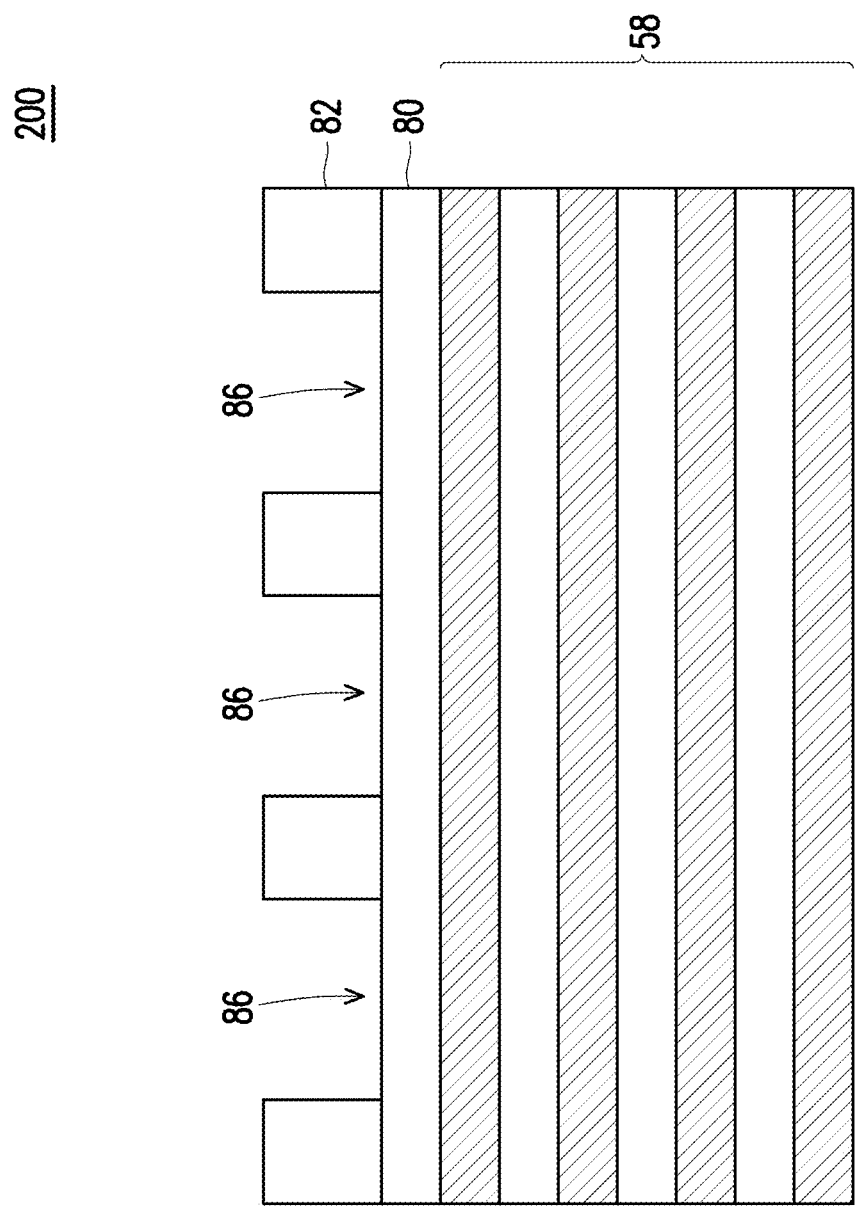

In FIG. 14, the photoresist 82 is patterned to form the trenches 86. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the trenches 86.

Figure 15:
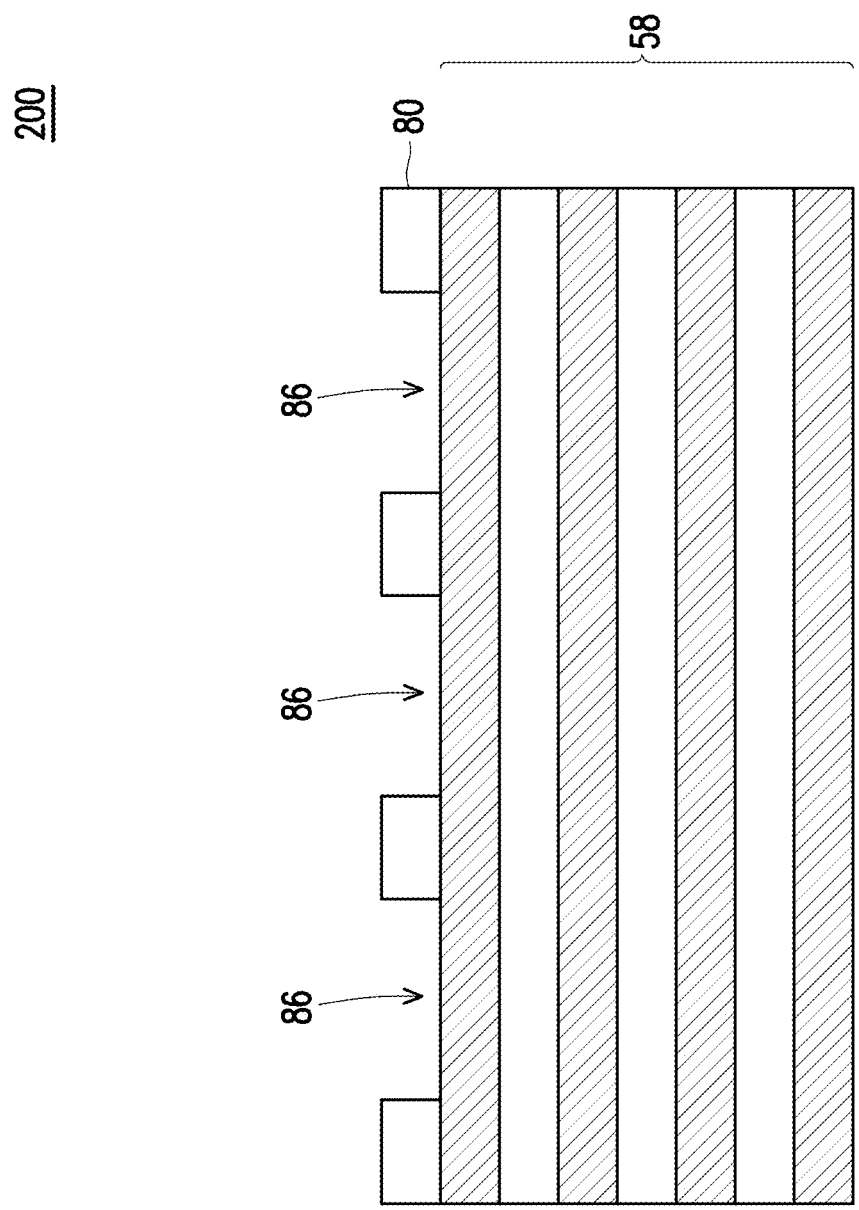

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

Figure 16:
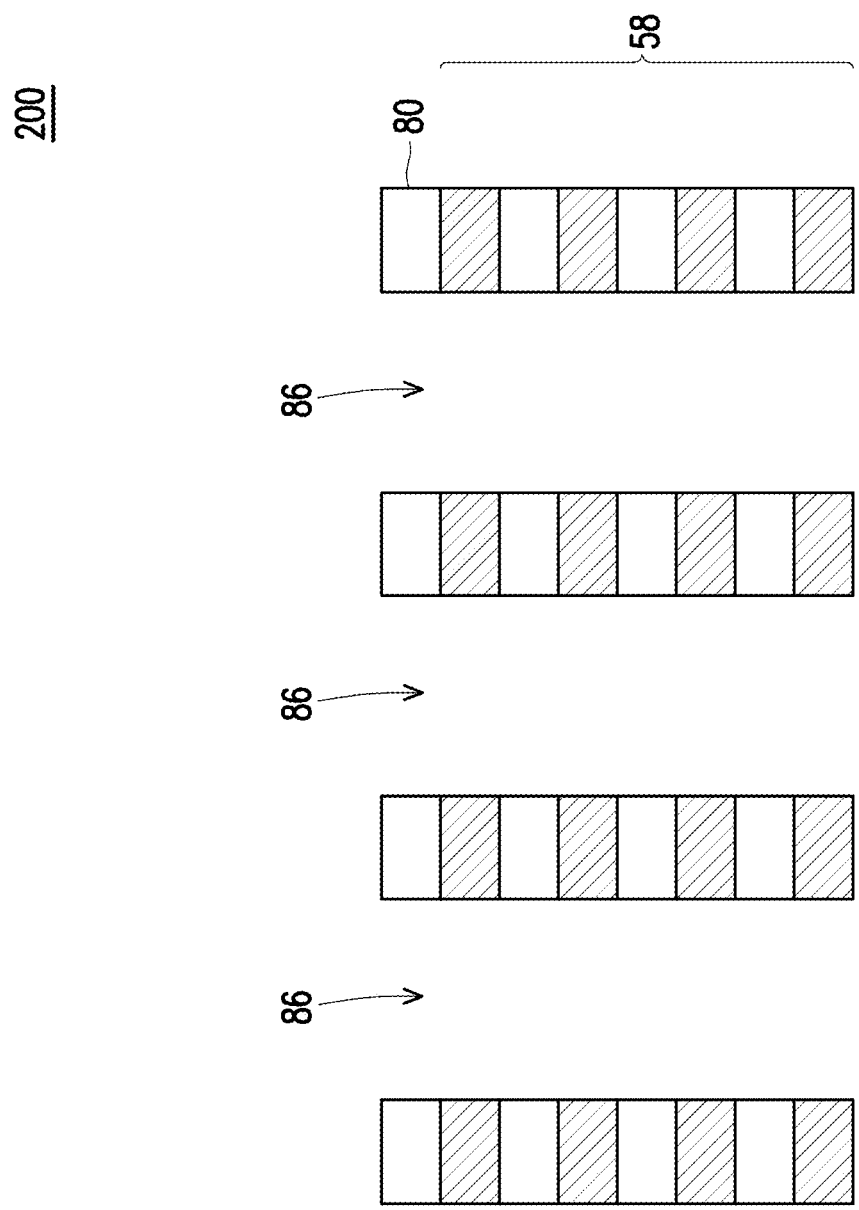

In FIG. 16, a pattern of the hard mask 80 is transferred to the multilayer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multilayer stack 58, and the conductive lines 72 (e.g., word lines) are formed from the conductive layers 54. By etching trenches 86 through the conductive layers 54, adjacent conductive lines 72 can be separated from each other.

Figure 17A:
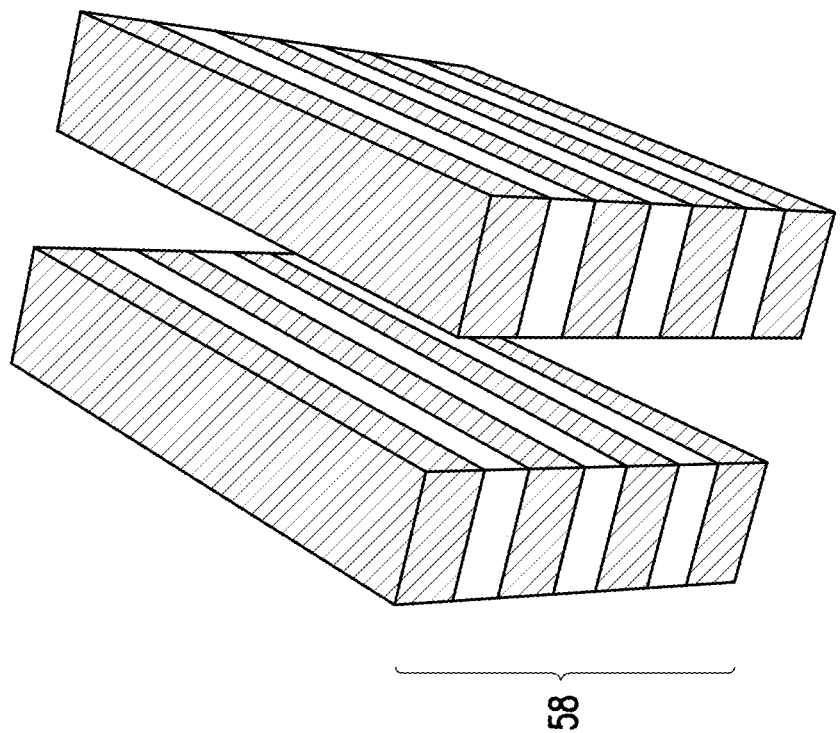

Subsequently, in FIGS. 17A and 17B, the hard mask 80 may then be removed by an acceptable process, such as a wet etching process, a dry etching process, a planarization process, combinations thereof, or the like. Due to the staircase shape of the multilayer stack 58 (see e.g., FIG. 12A), the conductive lines 72 may have varying lengths that increase in a direction towards the substrate 50. For example, the conductive lines 72A may be longer than the conductive lines 72B; and the conductive lines 72B may be longer than the conductive lines 72C.

Figure 18A:
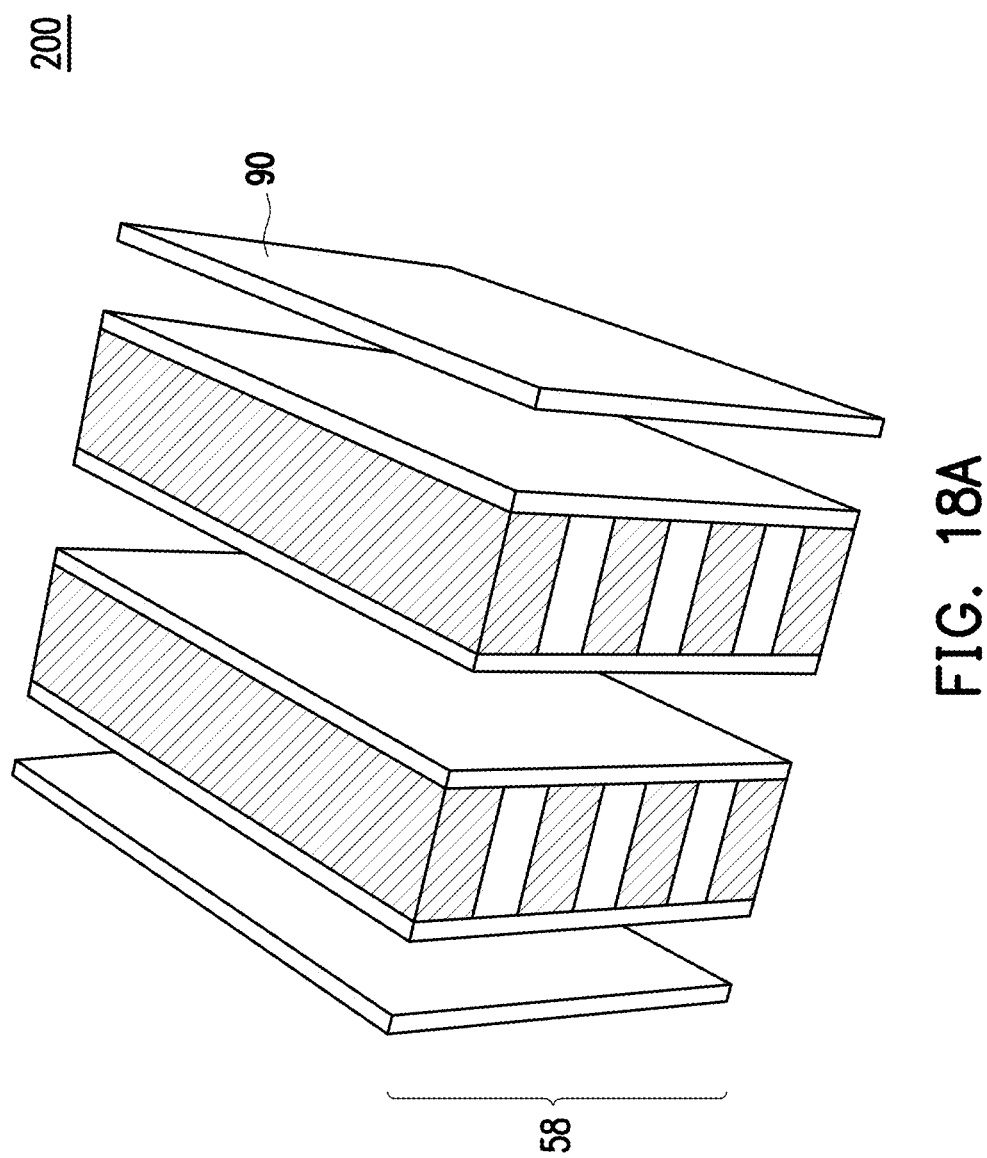
Figure 21:
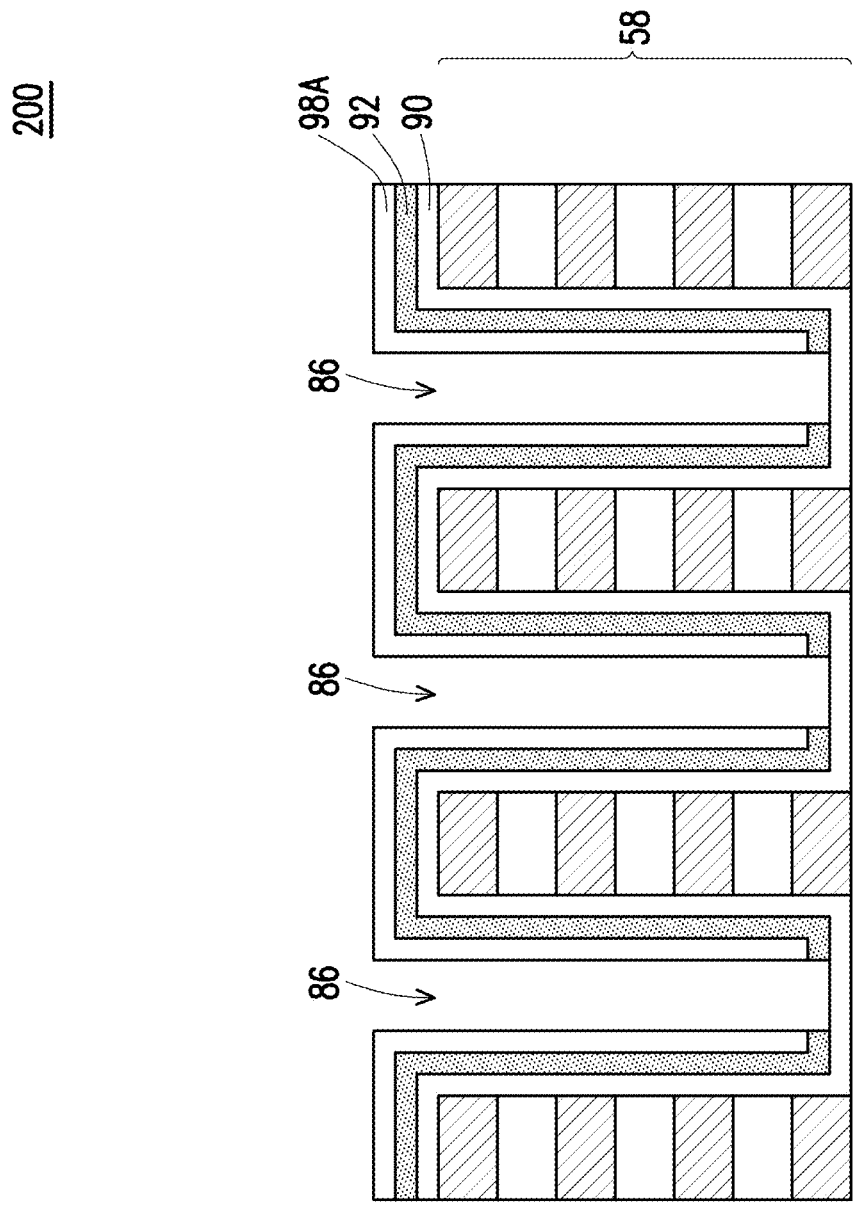
Figure 22:
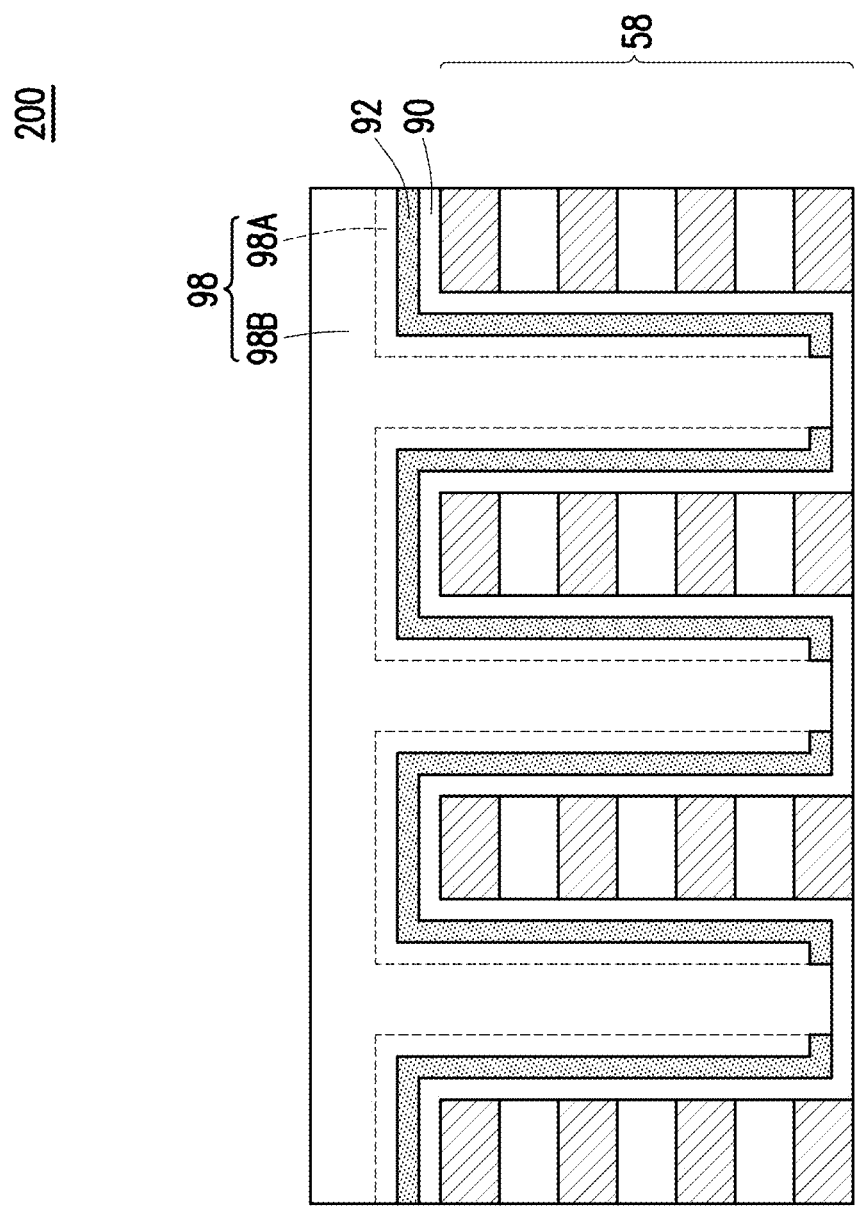
Figure 23A:
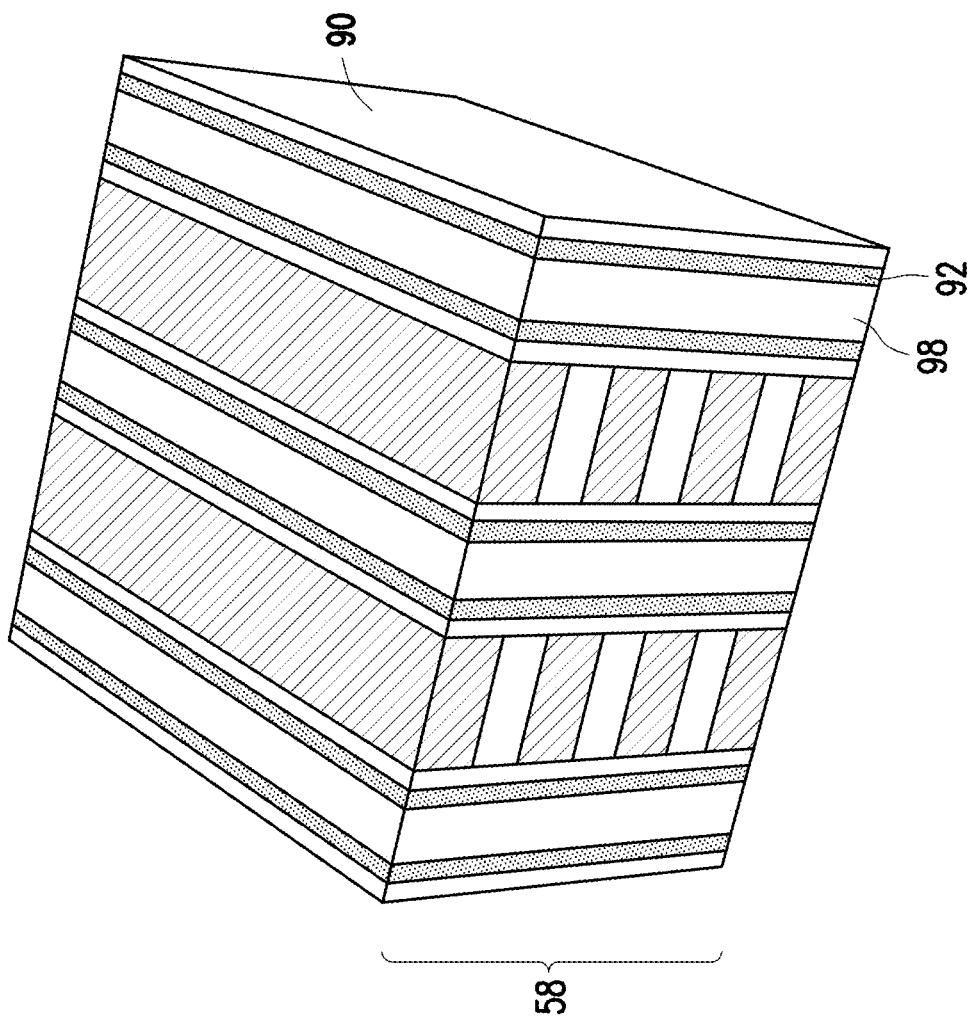
Figure 23C:
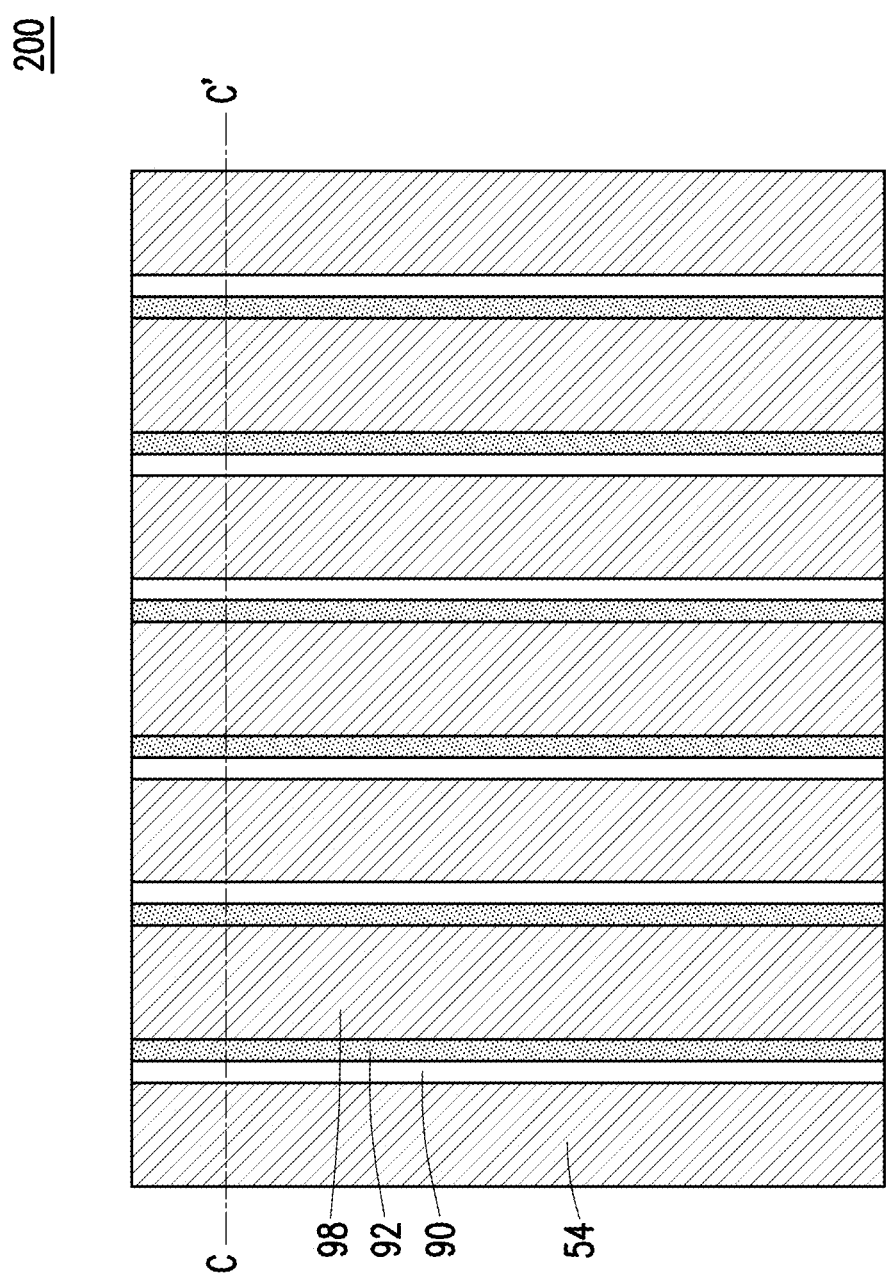

FIGS. 18A through 23C illustrate forming and patterning channel regions for the TFTs 204 (see FIG. 1A) in the trenches 86. FIGS. 18A, 19A, and 23A are illustrated in a three-dimensional view. In FIGS. 18B, 19B, 20, 21, 22A, 22B, and 23B, cross-sectional views are provided along line C-C' of FIG. 1A. FIG. 23C illustrates a corresponding top-down view of the TFT structure.

Figure 18B:
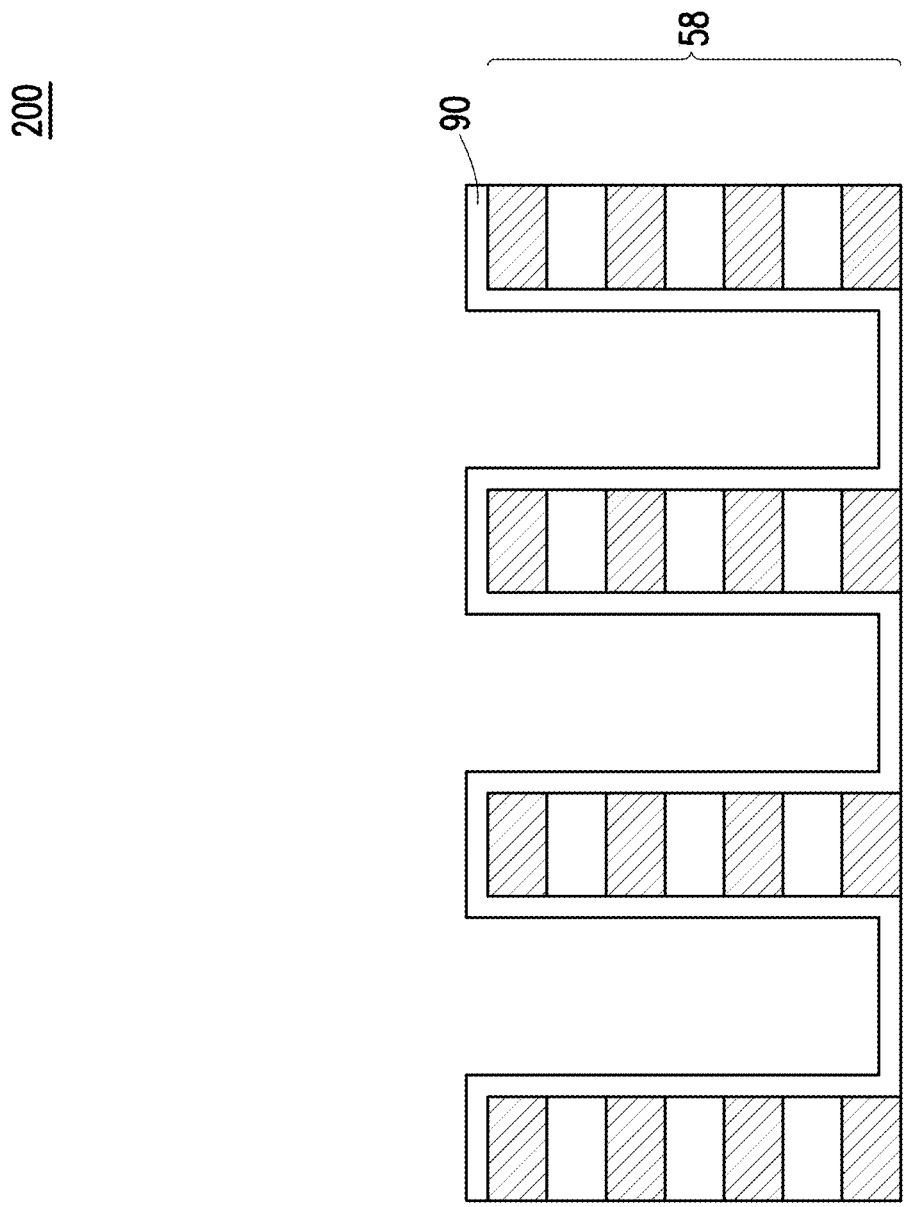

In FIGS. 18A and 18B, a memory film 90 is conformally deposited in the trenches 86. In FIG. 18A, the memory film 90 has been omitted at the bottoms of the trenches 86 and over the top surfaces of the multilayer stack 58 for visual clarity. The memory film 90 may have a material that is capable of storing a bit, such as material capable of switching between two different polarization directions by applying an appropriate voltage differential across the memory film 90. For example, the polarization of the memory film 90 may change due to an electric field resulting from applying the voltage differential.

For example, the memory film 90 may be a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory film 90 may be a multilayer structure comprising a layer of $SiN_x$ between two $SiO_x$ layers (e.g., an ONO structure). In still other embodiments, the memory film 90 may comprise a different ferroelectric material or a different type of memory material. The memory film 90 may be deposited by CVD, PVD, ALD, PECVD, or the like to extend along sidewalls and a bottom surface of the trenches 86. After the memory film 90 is deposited, an annealing step (e.g., at a temperature range of about 300° C. to about 600° C.) in may be performed to achieve a desired crystalline phase, improve film quality, and reduce film-related defects/impurities for the memory film 90. In some embodiments, the annealing step may further be below 400° C. to meet a BEOL thermal budget and reduce defects that may result in other features from high-temperature annealing processes.

Figure 19A:
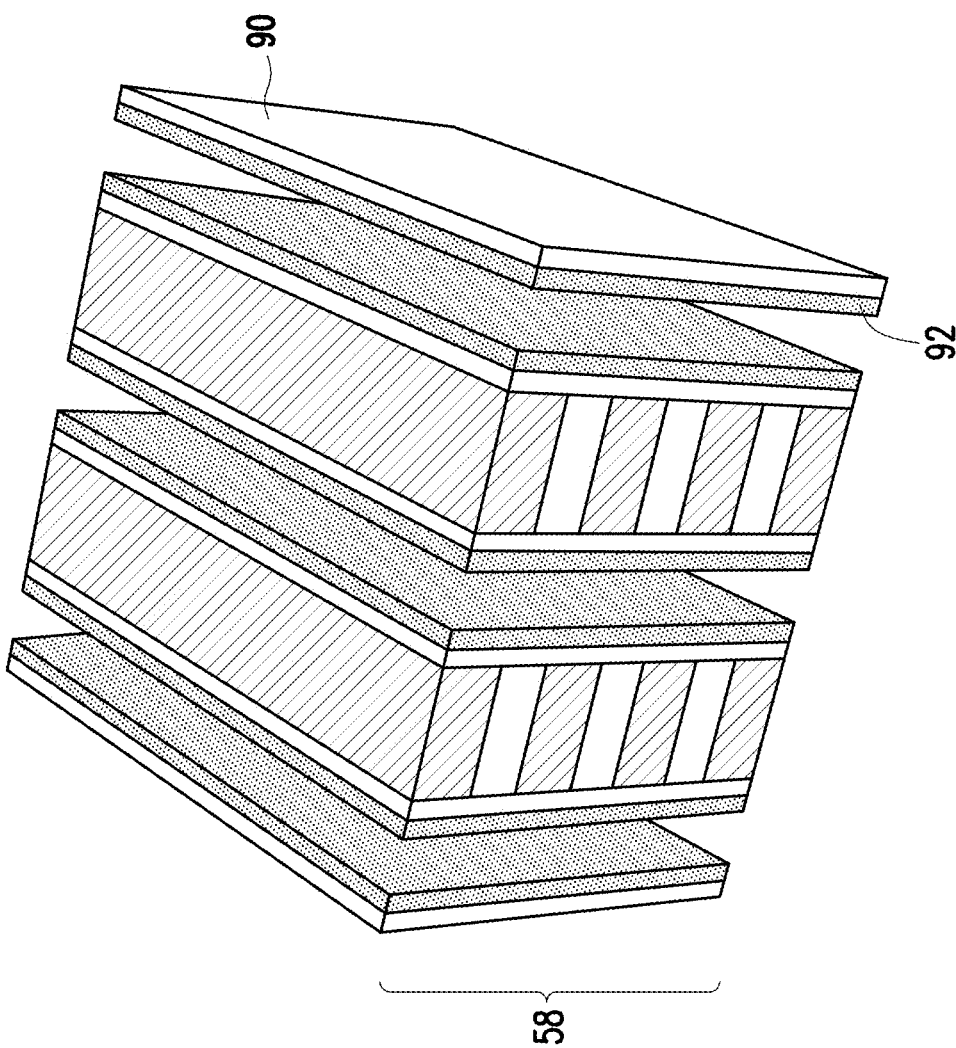

In FIGS. 19A and 19B, the OS layer 92 is conformally deposited in the trenches 86 over the memory film 90. In FIG. 19A, the OS layer 92 and the memory film 90 have been omitted at the bottoms of the trenches 86 and over the top surfaces of the multilayer stack 58 for visual clarity. The OS layer 92 comprises a material suitable for providing a channel region for a TFT (e.g., TFTs 204, see FIG. 1A). In some embodiments, the OS layer 92 comprises an indium-comprising material, such as $In_xGa_yZn_zMO$, where M may be Ti, Al, Ag, Si, Sn, or the like. X, Y, and Z may each be any value between 0 and 1. In other embodiments, a different semiconductor material may be used for the OS layer 92. The OS layer 92 may be deposited by CVD, PVD, ALD, PECVD, or the like. The OS layer 92 may extend along sidewalls and a bottom surface of the trenches 86 over the memory film 90. After the OS layer 92 is deposited, an annealing step (e.g., at a temperature range of between about 300° C. and about 450° C.) in oxygen-related ambient may be performed to activate the charge carriers of the OS layer 92.

Figure 20:
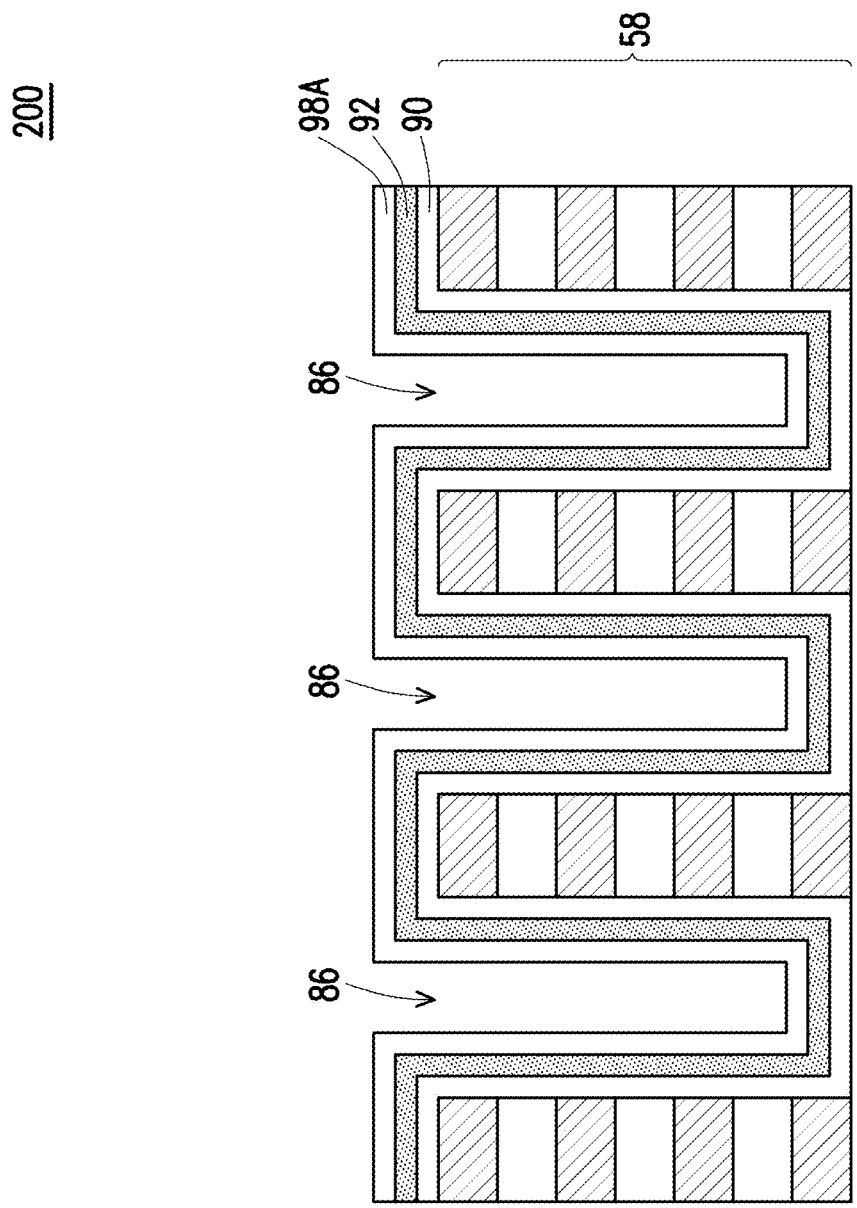

In FIG. 20, a dielectric material 98A is deposited on sidewalls and a bottom surface of the trenches 86 and over the OS layer 92. The dielectric material 98A may comprise, for example, silicon oxide, silicon nitride, silicon oxynitride, or the like, which may be deposited by CVD, PVD, ALD, PECVD, or the like.

In FIG. 21, bottom portions of the dielectric material 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 21, the dielectric material 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. Etching the OS layer 92 may expose portions of the memory film 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

In FIG. 22, an additional dielectric material 98B may be deposited to fill remaining portions of the trenches 86. The dielectric material 98B may comprise, for example, silicon oxide, silicon nitride, silicon oxynitride, or the like, which may be deposited by CVD, PVD, ALD, PECVD, or the like. In some embodiments, the dielectric material 98B may have a same material composition and be formed using a same process as the dielectric material 98A. Alternatively, the dielectric material 98B may have a different material composition and/or be formed by a different process than the dielectric material 98A.

Subsequent figures illustrate further processing based on the embodiment of FIG. 22 (e.g., where the dielectric material 98B and the dielectric material 98A have a same material composition) for ease of illustration. The dielectric material 98B and the dielectric material 98A may be referred to collectively as the dielectric material 98 herein after. It should be understood that similar processing may be applied to the embodiments wherein the dielectric material 98B and the dielectric material 98A have different material compositions.

In FIGS. 23A through 23C, a removal process is then applied to the dielectric material 98, the OS layer 92, and the memory film 90 to remove excess material over the multilayer stack 58. In some embodiments, a planarization process such as a chemical mechanical polish (CMP), an etch-back process, combinations thereof, or the like may be utilized. The planarization process exposes the multilayer stack 58 such that top surface of the multilayer stack 58 is level after the planarization process is complete. FIG. 23C illustrates a corresponding top-down view of the structure illustrated in FIG. 23A.

FIGS. 24A through 27C illustrate intermediate steps of manufacturing conductive lines 106 and 108 (e.g., source lines and bit lines) in the memory array 200. The conductive lines 106 and 108 may extend along a direction perpendicular to the conductive lines 54 such that individual cells of the memory array 200 may be selected for read and write operations. In FIGS. 24A through 27C, figures ending in "A" illustrate a 3D view; figures ending in "B" illustrate a top down view, and figures ending in "C" illustrate a corresponding cross-sectional view parallel to line C-C' of FIG. 1A.

Figure 24A:
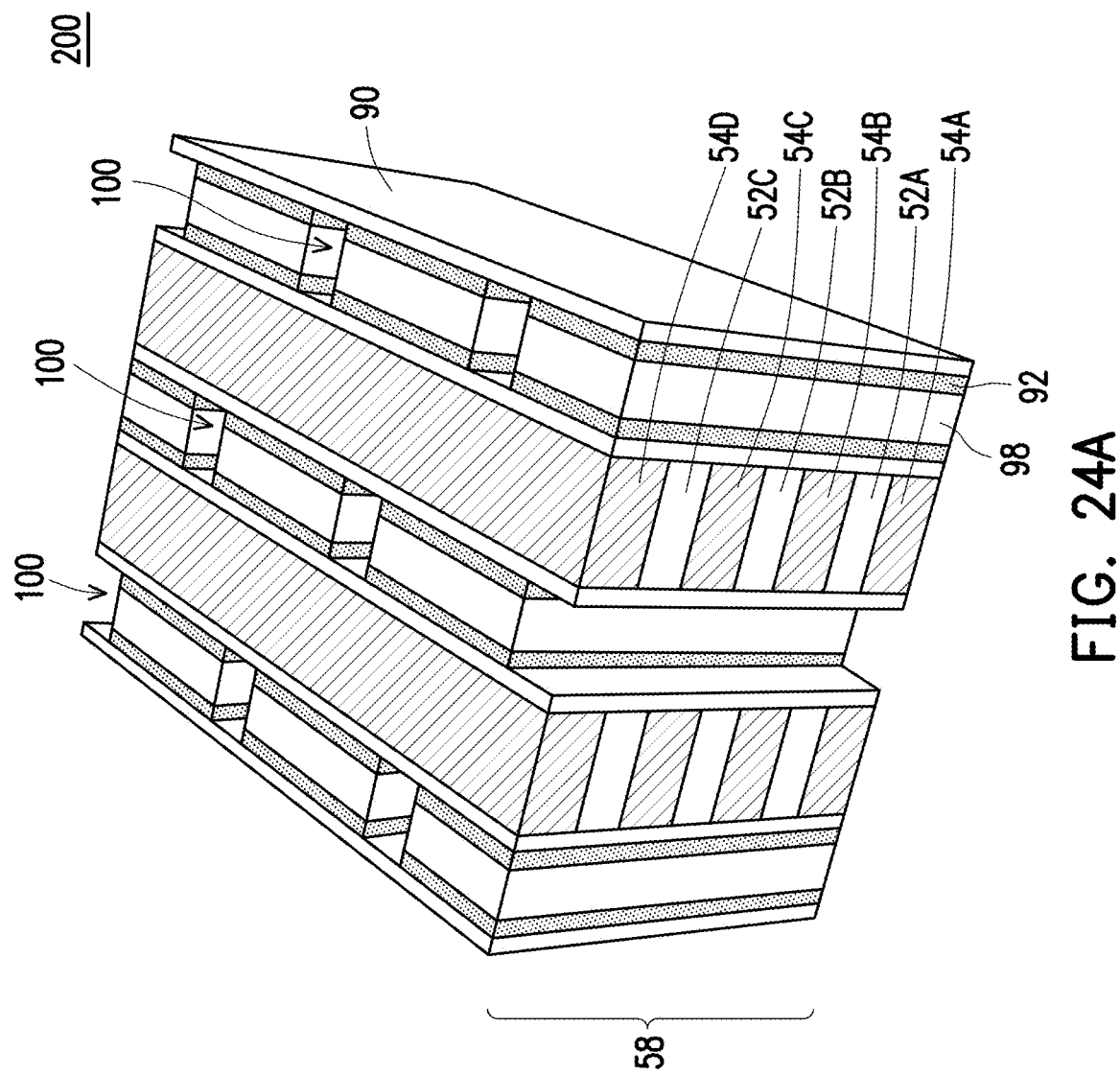
Figure 24B:
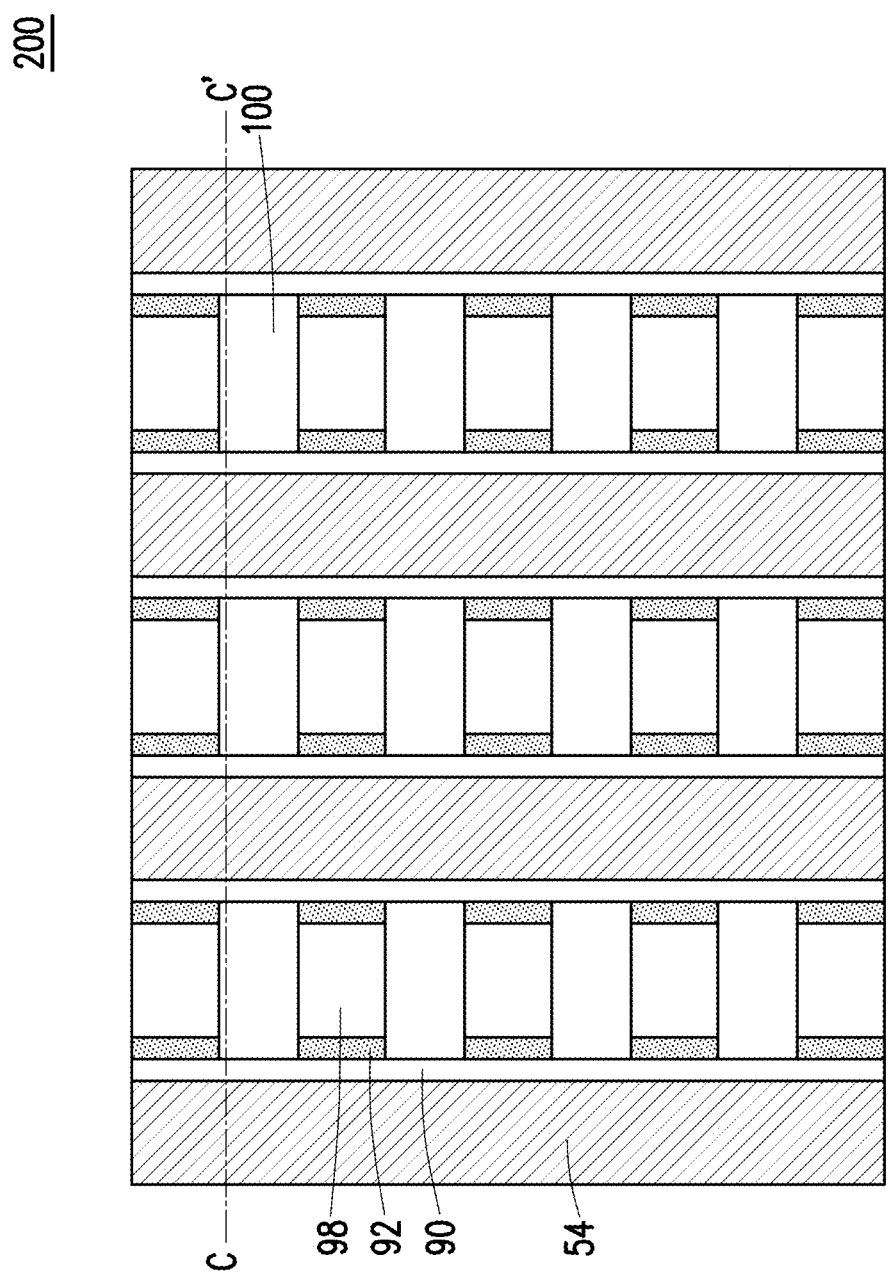

In FIGS. 24A, 24B, and 24C, trenches 100 are patterned through the OS layer 92 and the dielectric material 98 (including the dielectric material 98A and the dielectric material 98B). FIG. 24C illustrates a cross-section view of line C-C' in FIG. 24B. Patterning the trenches 100 may be performed through a combination of photolithography and etching, for example. The trenches 100 may be disposed between opposing sidewalls of the memory film 90, and the trenches 100 may physically separate adjacent stacks of memory cells in the memory array 200 (see FIG. 1A).

Figure 25A:
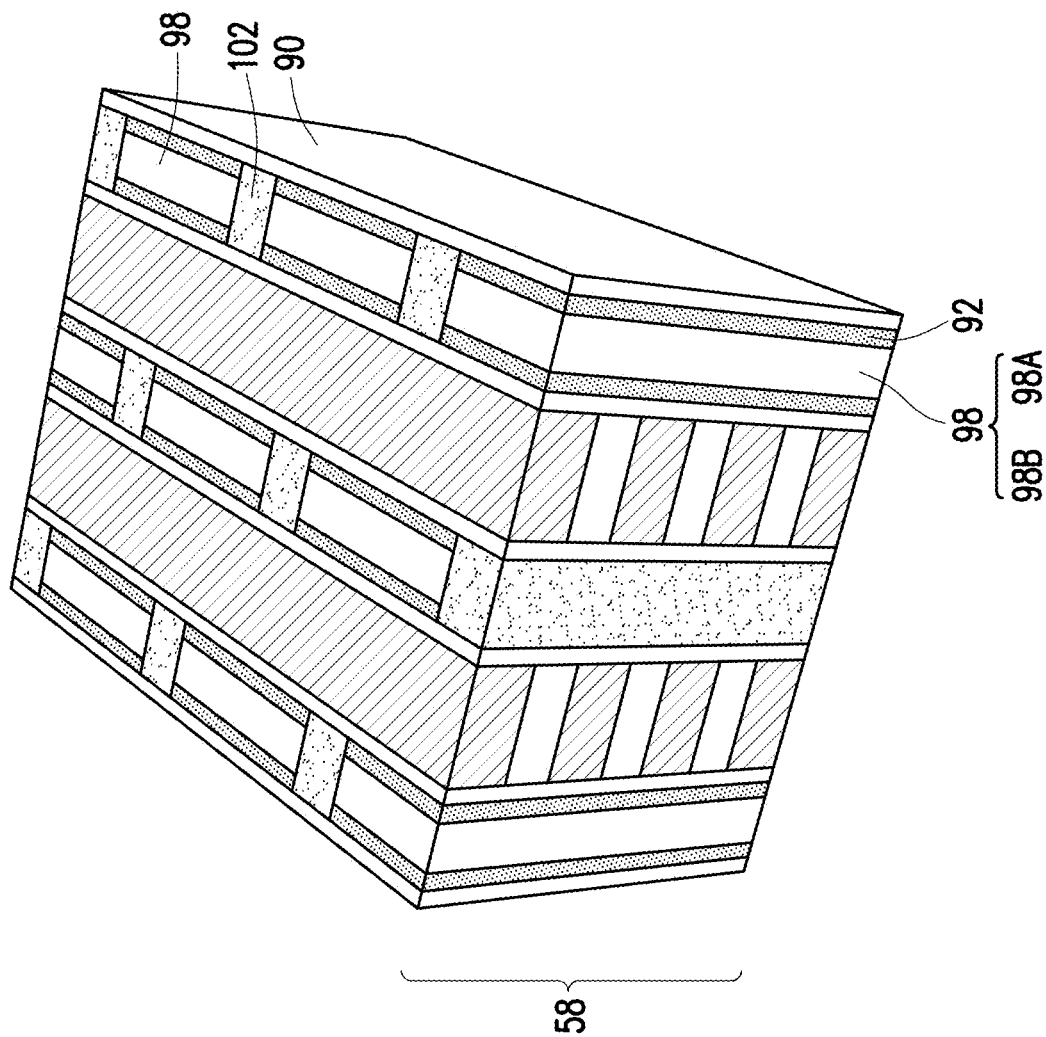
Figure 25B:
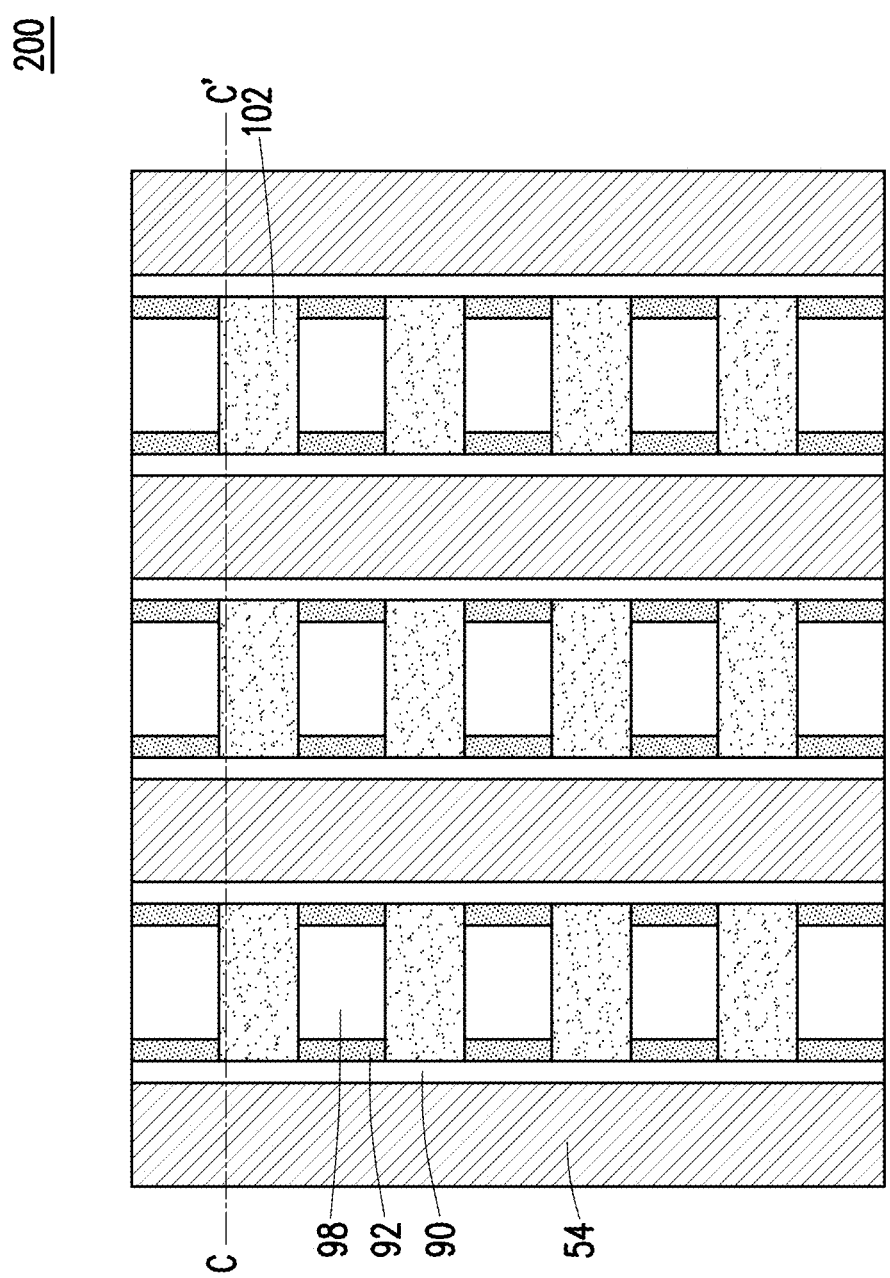
Figure 25C:
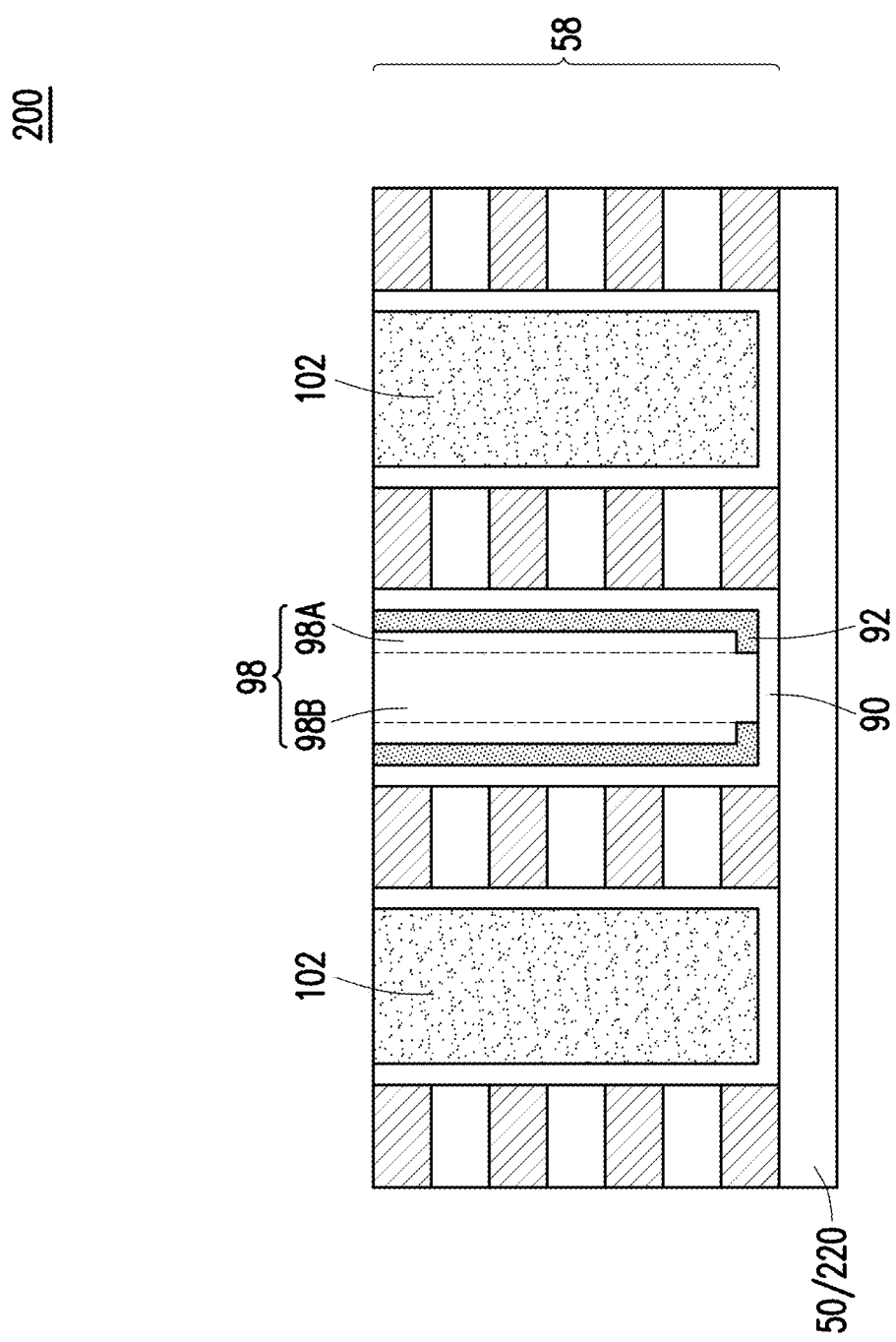

In FIGS. 25A, 25B, and 25C, a dielectric material 102 is deposited in and fills the trenches 100. FIG. 25C illustrates a cross-sectional view of line C-C' in FIG. 25B. The dielectric material 102 may include, for example, silicon oxide, silicon nitride, silicon oxynitride, or the like, which may be deposited by CVD, PVD, ALD, PECVD, or the like. The dielectric material 102 may extend along sidewalls and a bottom surface of the trenches 100 over the OS layer 92. After deposition, a planarization process (e.g., a CMP, etch back, or the like) may be performed to remove excess portions of the dielectric material 102. In the resulting structure, top surfaces of the multilayer stack 58, the memory film 90, the OS layer 92, and the dielectric material 102 may be substantially level (e.g., within process variations). In some embodiments, materials of the dielectric materials 98 and 102 may be selected so that they may be etched selectively relative each other. For example, in some embodiments, the dielectric material 98 is an oxide and the dielectric material 102 is a nitride. In some embodiments, the dielectric material 98 is a nitride and the dielectric material 102 is an oxide. Other materials are also possible.

Figure 26A:
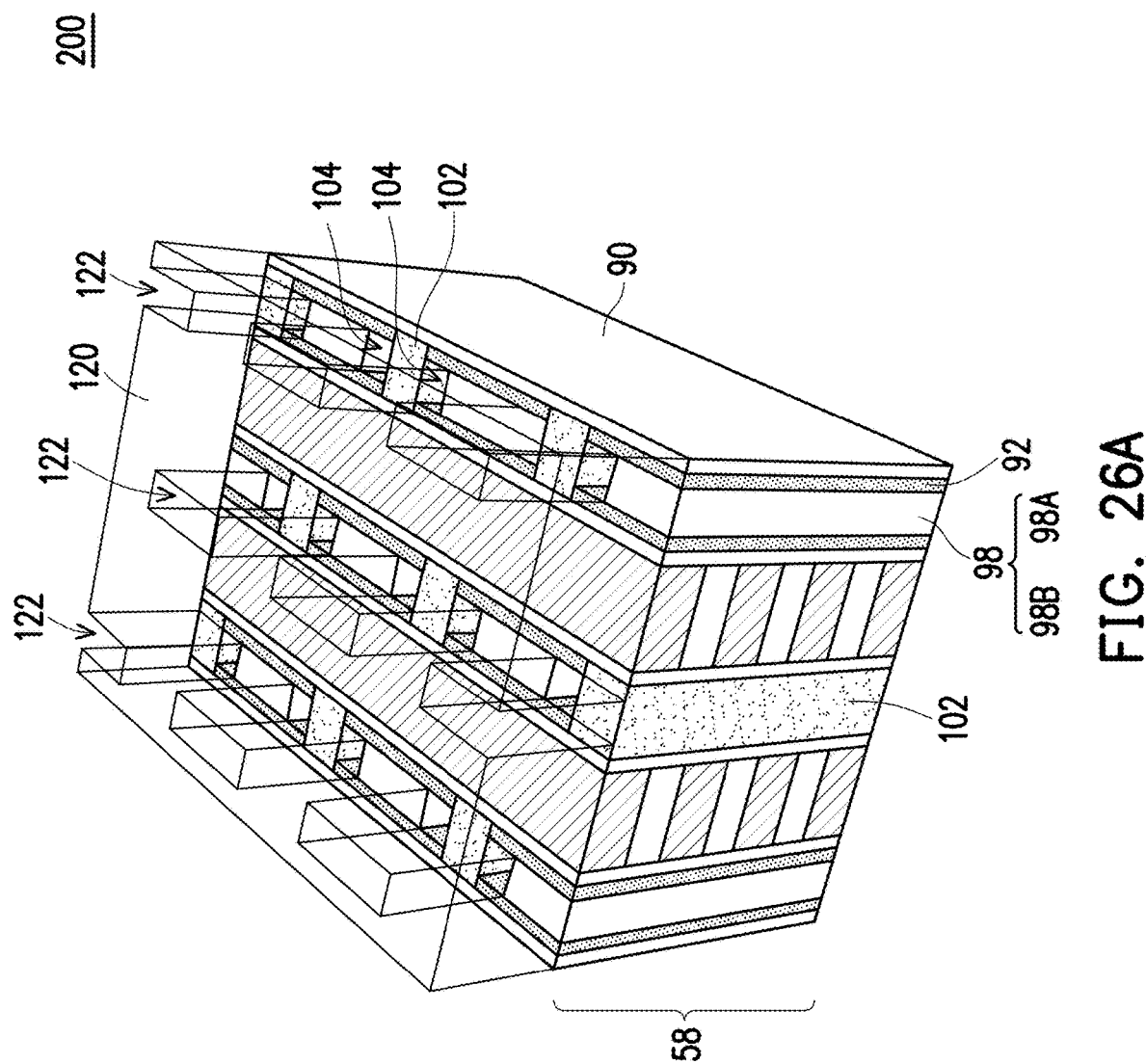
Figure 26B:
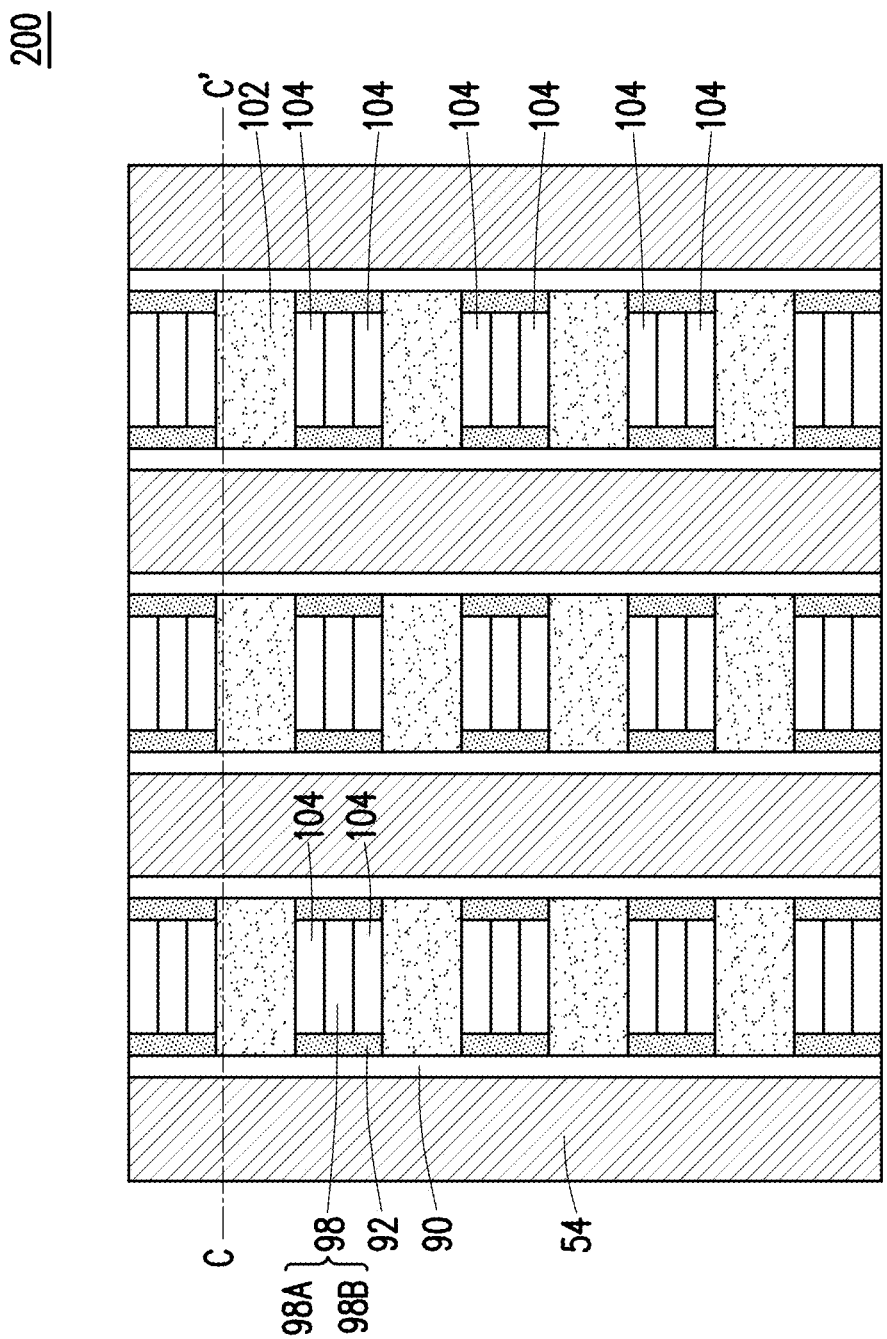
Figure 26C:
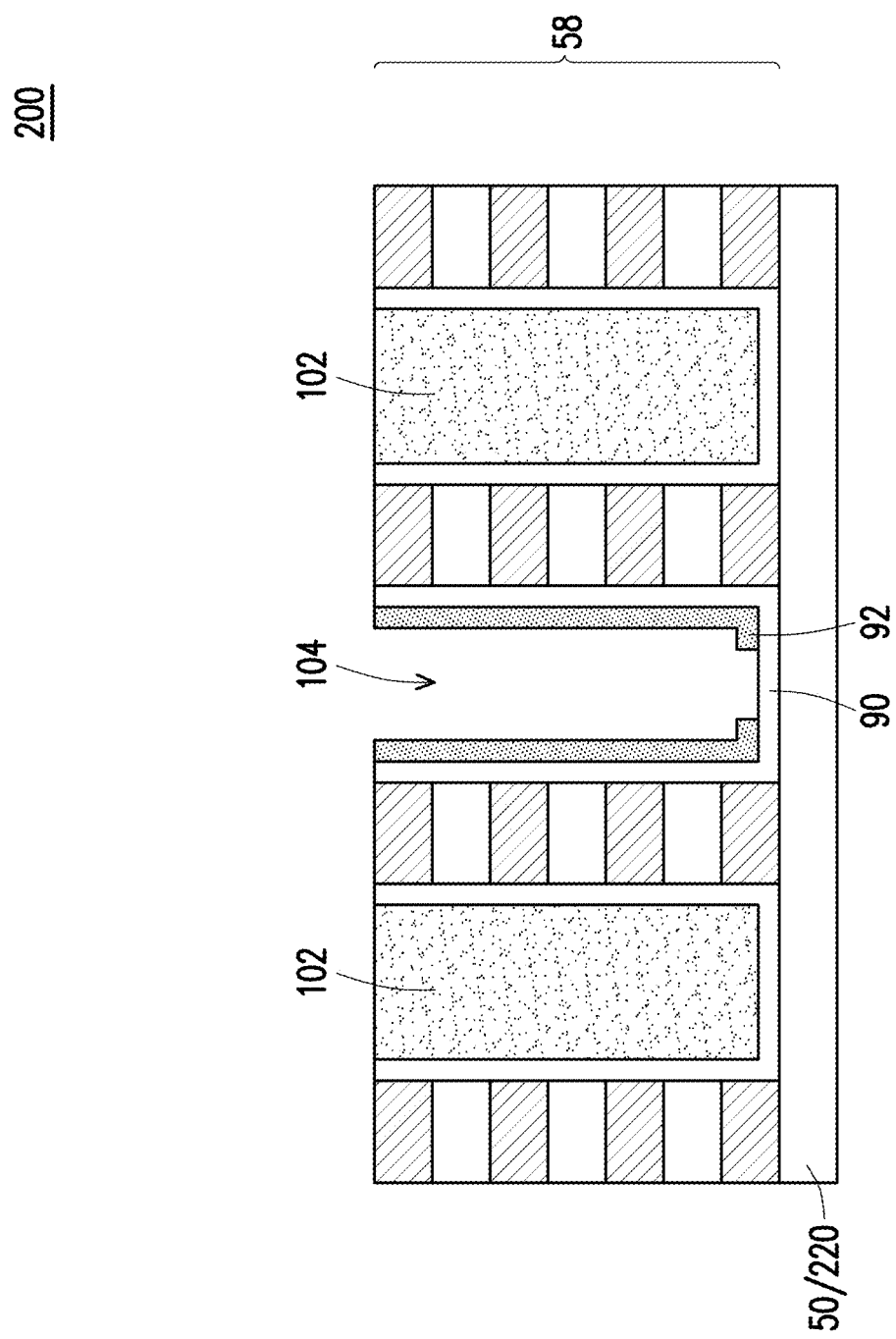

In FIGS. 26A, 26B, and 26C, trenches 104 are patterned for the conductive lines 106 and 108. FIG. 26C illustrates a cross-sectional view of line C-C' in FIG. 26B. The trenches 104 are formed by patterning the dielectric material 98 (including the dielectric material 98A and the dielectric material 98B) using a combination of photolithography and etching, for example.

For example, a photoresist 120 may be deposited over the multilayer stack 58, the dielectric material 98, the dielectric material 102, the OS layer 92, and the memory film 90. The photoresist 120 can be formed by using a spin-on technique, for example. The photoresist 120 is patterned to define openings 122. Each of the openings 122 may overlap a corresponding region of the dielectric material 102, and each of the openings 122 may further partially expose two separate regions of the dielectric material 98. For example, each opening 122 may expose a region of the dielectric material 102; partially expose a first region of the dielectric material 98; and partially expose a second region of the dielectric material 98 that is separated from the first region of the dielectric material 98 by the region of the dielectric material 102 that is exposed by the opening 122. In this way, each of the openings 122 may define a pattern of a conductive line 106 and an adjacent conductive line 108 that are separated by the dielectric material 102. The photoresists can be patterned using acceptable photolithography techniques. For example, the photoresist 120 be exposed to light for patterning. After the exposure process, the photoresist 120 may be developed to remove exposed or unexposed portions of the photo resist depending on whether a negative or positive resist is used, thereby defining a patterning of the form openings 122.

Subsequently, portions of the dielectric material 98 exposed by the openings 122 may be removed by etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric material 98 without significantly etching the dielectric material 102. As a result, even though the openings 122 expose the dielectric material 102, the dielectric material 102 may not be significantly removed. A pattern of the trenches 104 may correspond to the conductive lines 106 and 108 (see FIGS. 27A, 27B, and 27C). For example, a portion of the dielectric material 98 may remain between each pair of the trenches 104, and the dielectric material 102 may be disposed between adjacent pairs of the trenches 104. After the trenches 104 are patterned, the photoresist 120 may be removed by ashing, for example.

Figure 27A:
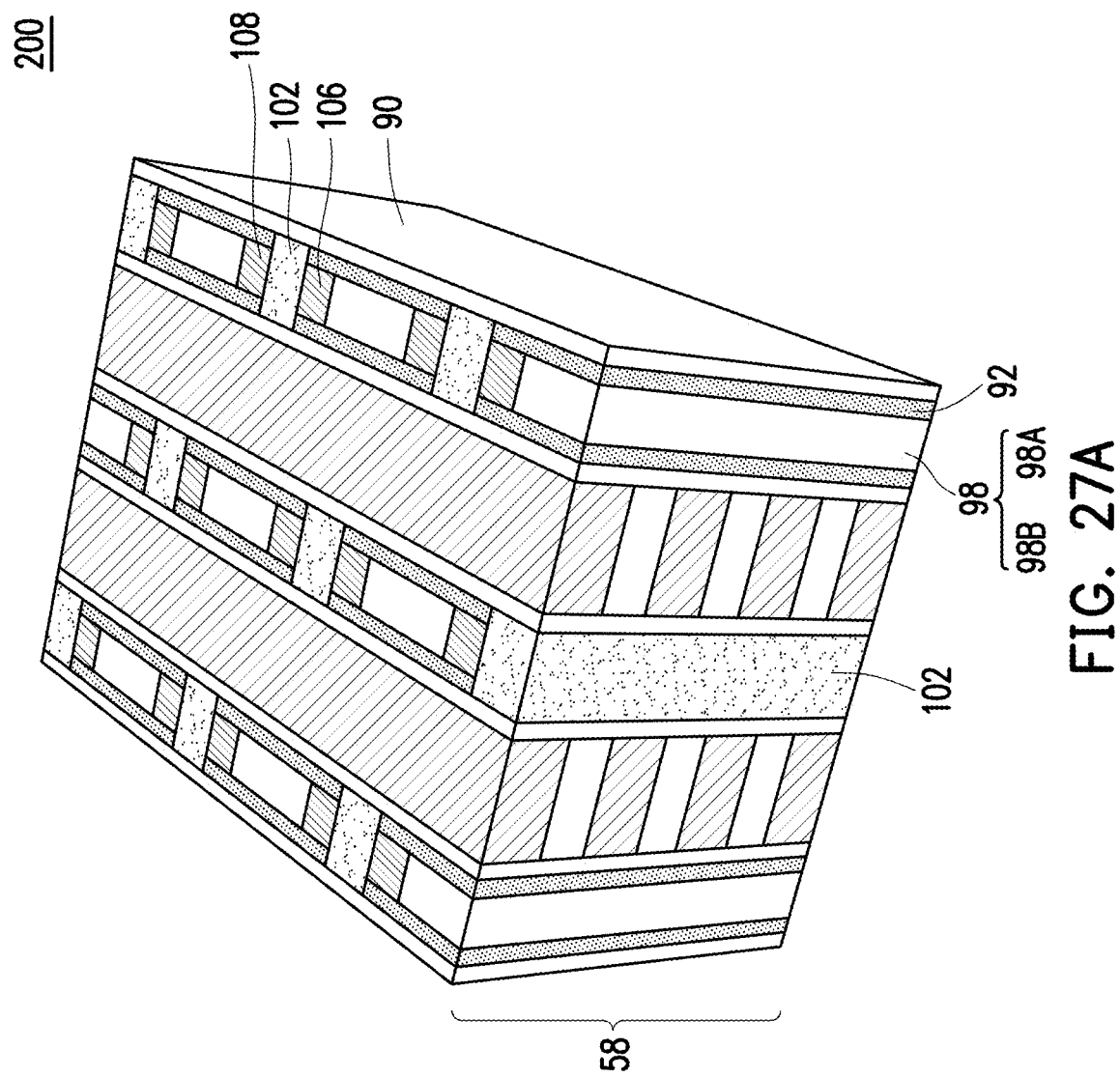
Figure 27B:
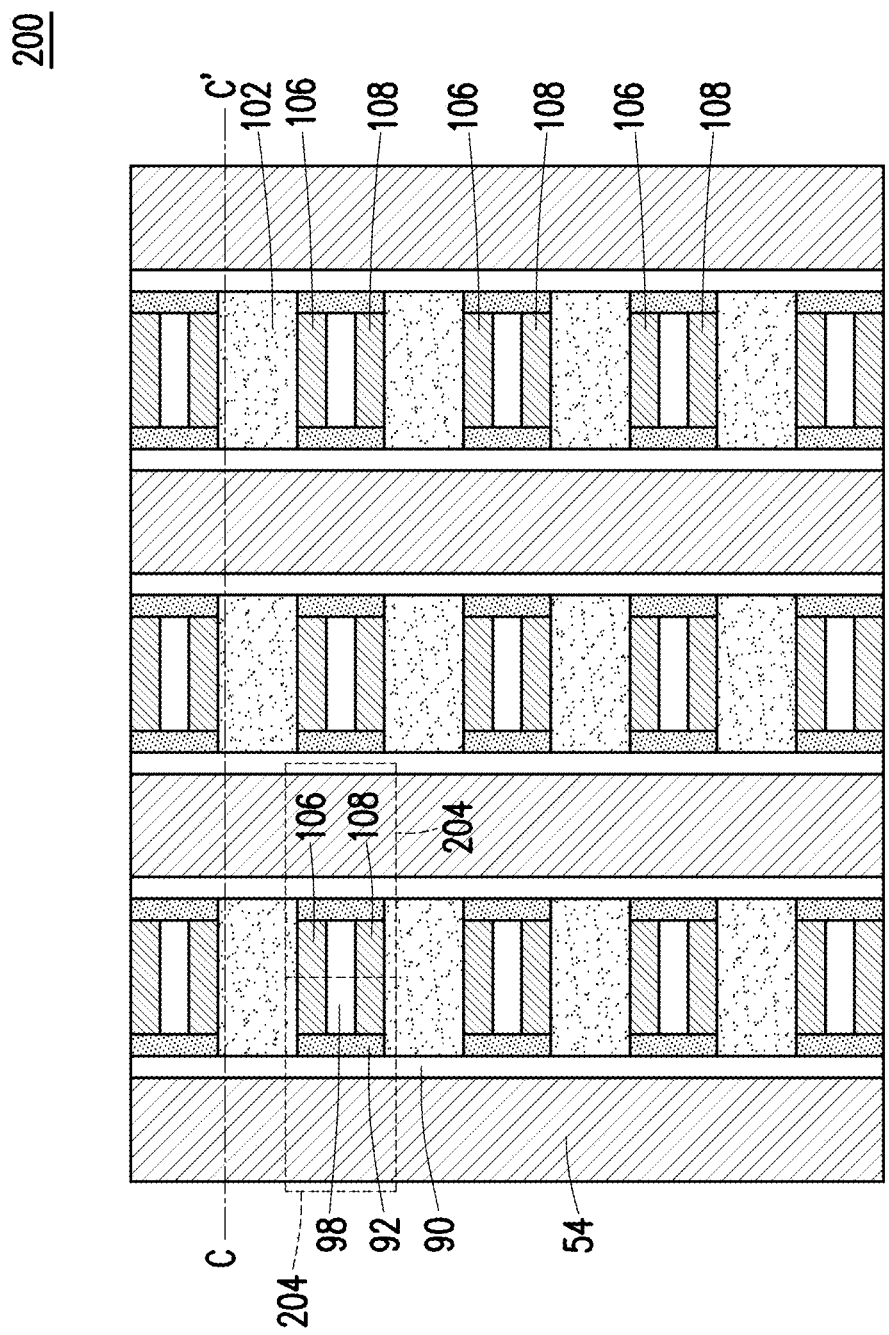
Figure 27C:
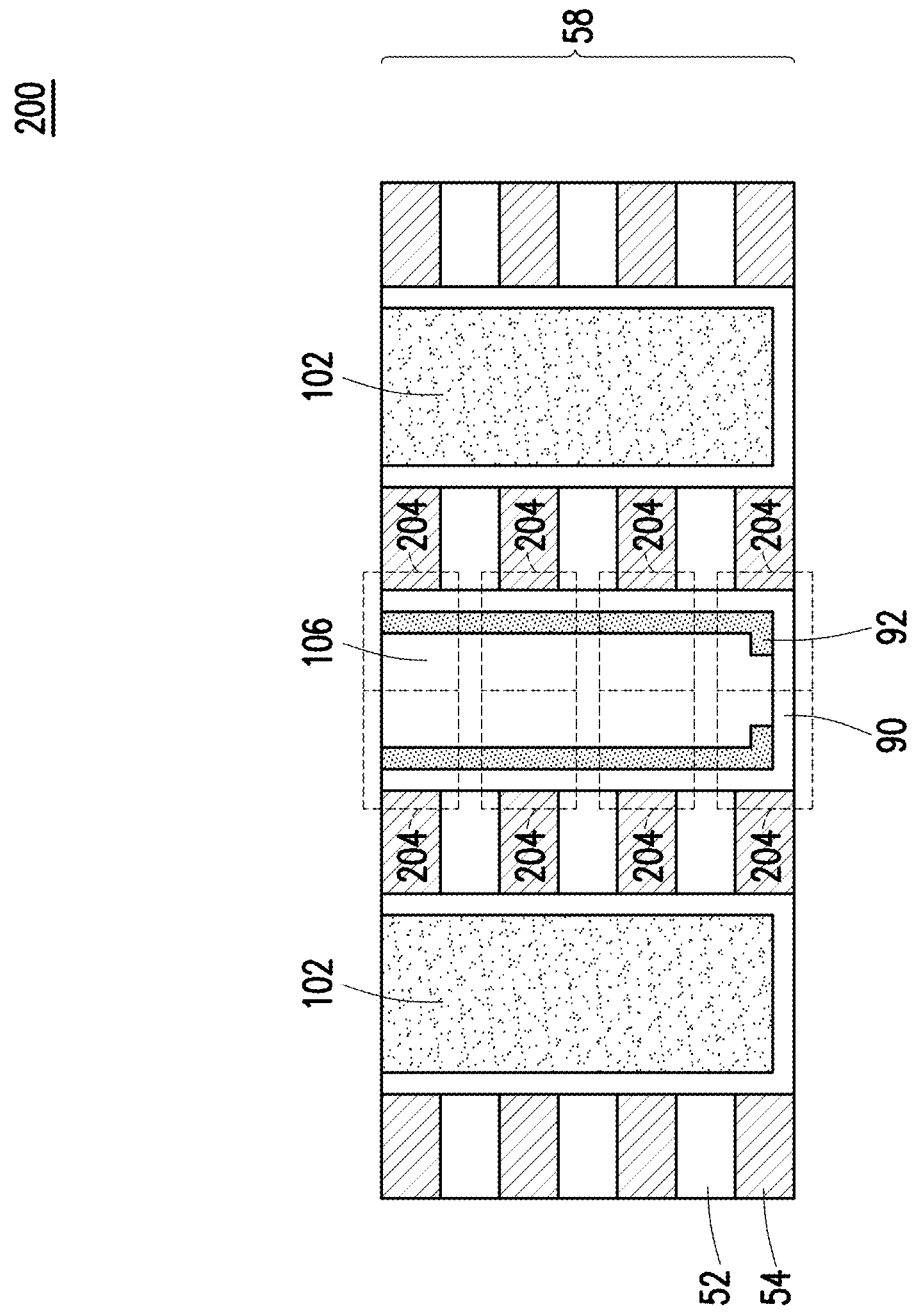

In FIGS. 27A, 27B, and 27C the trenches 104 are filled with a conductive material to form the conductive lines 106 and 108. FIG. 27C illustrates a cross-sectional view of line C-C' in FIG. 27B. The conductive lines 106 and 108 may each comprise a conductive material, such as, copper, titanium, titanium nitride, tantalum, tantalum nitride, tungsten, ruthenium, aluminum, combinations thereof, or the like, which may be each formed using, for example, CVD, ALD, PVD, PECVD, or the like. After the conductive lines 106 and 108 are deposited, a planarization (e.g., a CMP, etch back, or the like) may be performed to remove excess portions of the conductive material, thereby forming the conductive lines 106 and 108. In the resulting structure, top surfaces of the multilayer stack 58, the memory film 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Although FIG. 27C illustrates a cross-sectional view that only shows the conductive lines 106, a cross-sectional view of the conductive lines 108 may be similar.

Thus stacked TFTs 204 may be formed in the memory array 200. Each TFT 204 comprises a gate electrode (e.g., a portion of a corresponding conductive line 54), a gate dielectric (e.g., a portion of a corresponding memory film 90), a channel region (e.g., a portion of a corresponding OS layer 92), and source and drain electrodes (e.g., portions of corresponding conductive lines 106 and 108). The dielectric material 102 isolates adjacent TFTs 204 in a same column and at a same vertical level. The TFTs 204 may be disposed in an array of vertically stacked rows and columns.

Figure 28A:
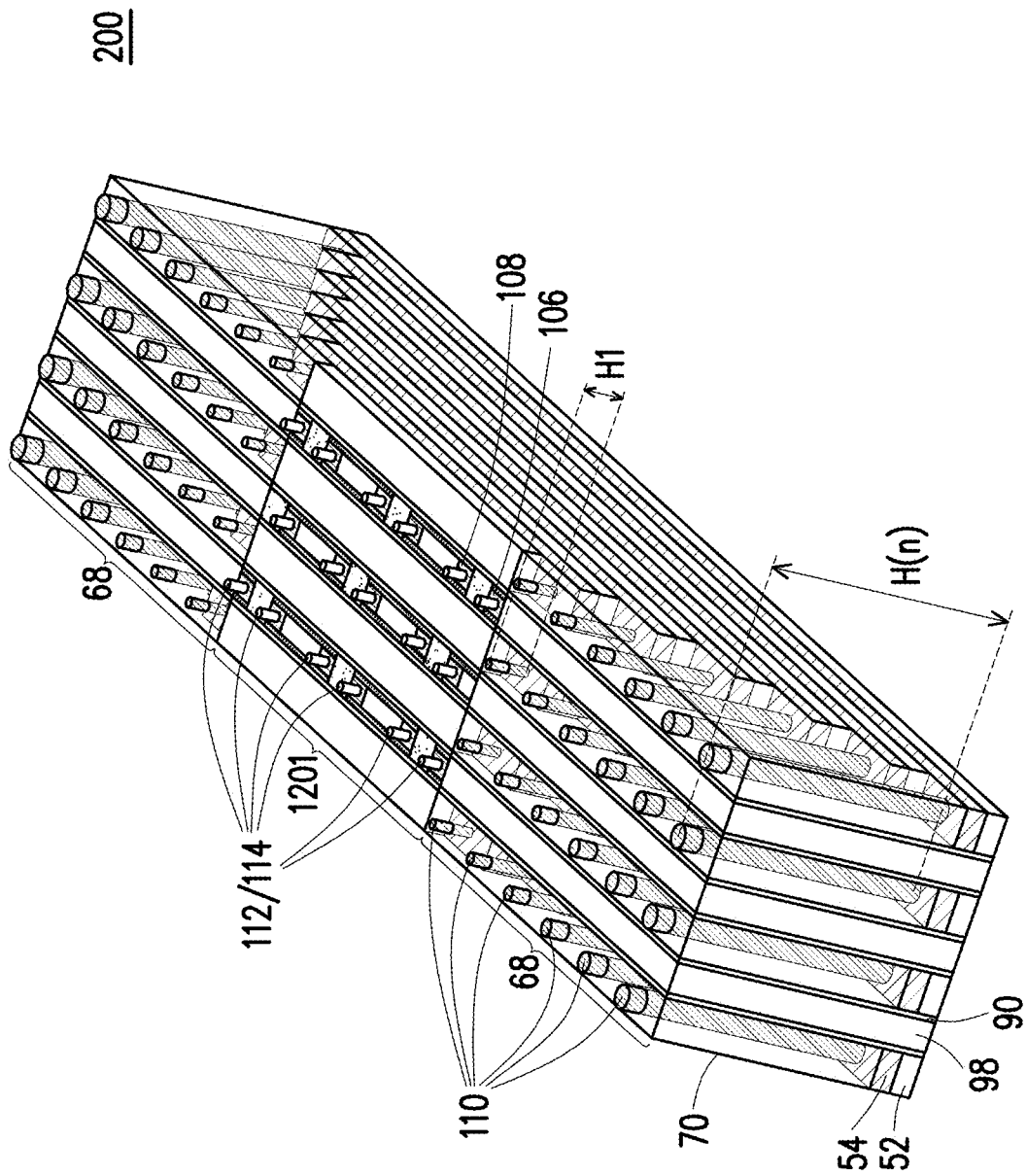
FIGS. 28A and 28B illustrate a perspective view of a memory array and adjoining staircase contact structure and at top down view of the staircase contact structure in accordance with some embodiments.
Figure 28B:
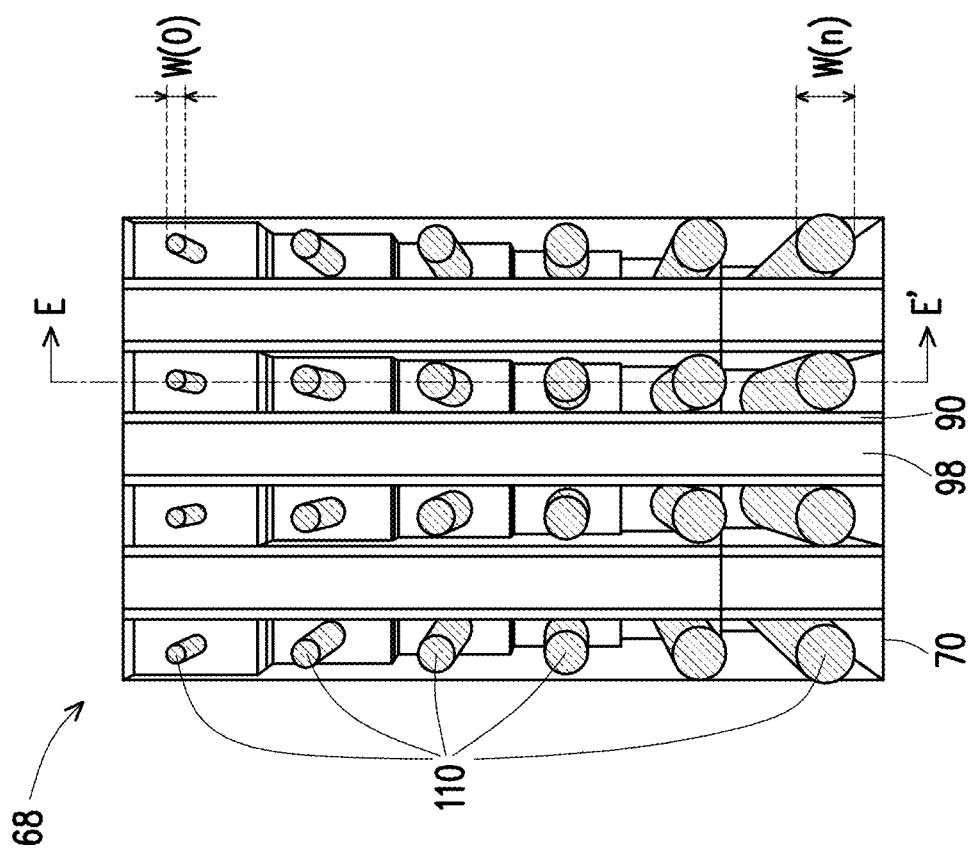

In FIGS. 28A and 28B, staircase vias 110 are made to the conductive lines 54 (e.g., word lines WL) and source/bit line contacts 112 and 114 are made to the conductive lines 106 and 108 (e.g., source lines SL and bit lines BL). FIG. 28A illustrates a perspective view of the memory array 200 and two of the staircase contact structures 68 adjacent the memory array 200, according to some embodiments. In some embodiments, the staircase contact structures 68 are formed on opposite sides of the transistor stack region 1201 of the memory array 200. FIG. 28B illustrates a top-down view of the staircase contact structure 68 in FIG. 28A.

In the illustrated embodiment, the multilayer stack 58 comprises six of the conductive lines 54 separated by seven of the dielectric layers 52, which may be formed by repeating steps described above. In some embodiments, the staircase shape of the multilayer stack 58 may provide a surface on each of the conductive lines 54 for the staircase vias 110 to land on.

As also illustrated by the perspective view of FIG. 28A, source/bit line contacts 112 and 114 may also be made to the conductive lines 106 and the conductive lines 108, respectively. The source/bit line contacts 112 and 114 may be formed using any of the materials and techniques suitable for forming the staircase vias 110.

In the illustrated embodiment, the IMD 70 is shown recessed as compared to the staircase vias 110 in FIG. 28A; however, the levels of the staircase vias 110 and the IMD 70 may be coplanar. In other embodiments, the IMD 70 may be formed coplanar with the memory array 200 and an optional dielectric layer 120 (see FIG. 29) may be formed over the IMD 70 and the memory array 200. In such embodiments, the openings for the staircase vias 110 are formed through the optional dielectric layer and the IMD 70 and the openings for the source/bit line contacts 112 and 114 are formed through the optional dielectric layer.

According to some embodiments, the size of the staircase vias 110 increases as the height of the staircase vias 110 increases from the uppermost conductive line 54 to the bottommost conductive line 54. For example, a diameter of the staircase vias 110 at a topmost surface of the staircase vias 110 may increase as a distance from transistor stack region 120 increases. As such, diameters of the staircase vias 110 nearest the transistor stack region 1201 are smaller than the diameters of the staircase vias 110 furthest from the transistor stack region 1201. In FIGS. 28A and 28B, the staircase vias 110 nearest the transistor stack region 1201 may have a first height H1 and the staircase vias 110 furthest from the transistor stack region 1201 may have an $n^{th}$ height H(n). The $n^{th}$ height H(n) being greater than the first height H1. Furthermore, the staircase vias 110 nearest the transistor stack region 1201 may have a first diameter W(0) and the staircase vias 110 furthest from the transistor stack region 1201 may have an $n^{th}$ diameter W(n). The $n^{th}$ diameter W(n) being greater than the first diameter W(0).

Furthermore, the source/bit line contacts 112 and 114 may be formed to any suitable size (e.g., height and diameter) used for the staircase vias 110. Although the source/bit line contacts 112 and 114 are illustrated as being the same size (e.g., first height H1 and first width W(0)), the sizes of the source/bit line contacts 112 and 114 may also be different. FIG. 28B further illustrates cutline E-E' through the staircase vias 110 of the staircase contact structure 68.

Figure 29:
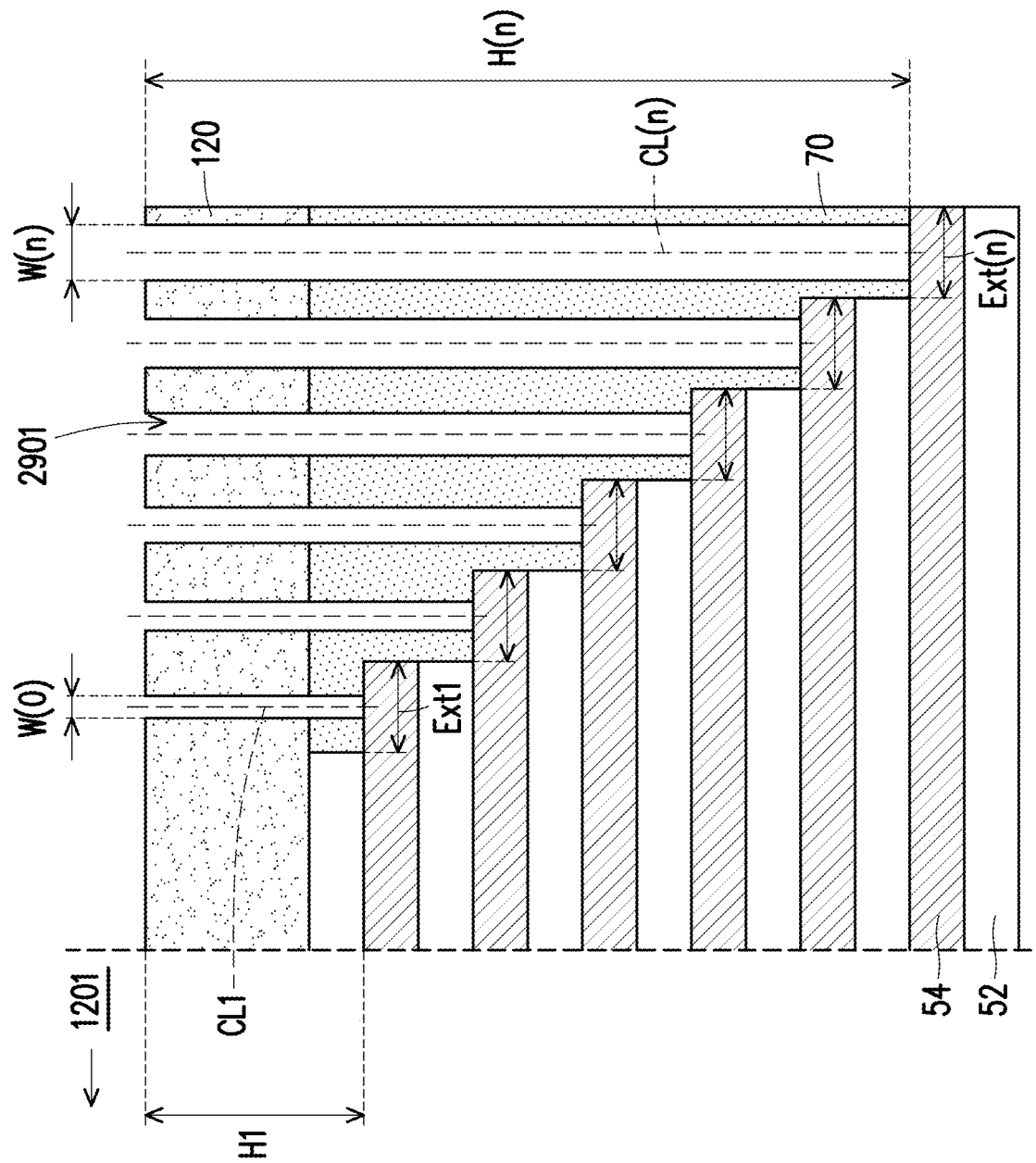
Figure 30:
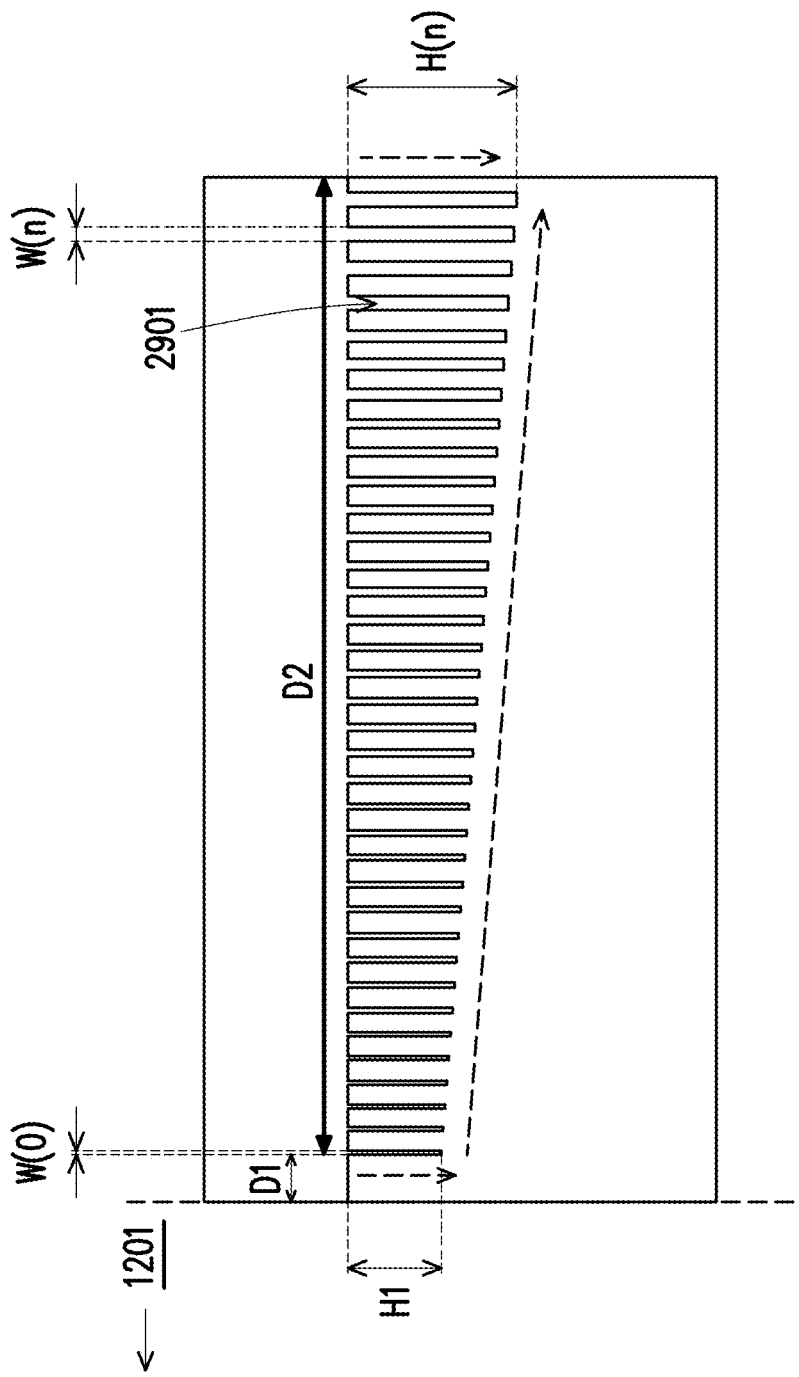

FIGS. 29-31 illustrate intermediate steps in the formation of the staircase vias 110, according to some embodiments. FIGS. 29-31 illustrates cross-sectional views of the staircase contact structure 68 along line E-E' of FIG. 28B.

In particular, FIG. 29 illustrates forming openings 2901 through the IMD 70 in desired locations of the staircase vias 110 according to some embodiments. In some embodiments, the shape of the staircase structures 68 may provide a surface on each of the conductive lines 54 for the staircase vias 110 to land on. Forming the staircase vias 110 may include patterning openings in the IMD 70 and the dielectric layers 52 to expose portions of the conductive lines 54 using a combination of photolithography and etching, for example. In some embodiments, the openings 2901 may be patterned to have substantially vertical sidewalls. In such embodiments, the widths of the openings 2901 may be consistent from the tops of the openings to the bottoms of the openings. In other embodiments, the openings 2901 may be patterned to have angled sidewalls. In such embodiments, the widths of the openings 2901 may be greater at the tops of the openings than the widths at the bottoms of the openings.

Once the openings 2901 have been formed, extensions Ext1 to Ext(n) of the conductive lines 54 are exposed. The extensions Ext1 to Ext(n) may refer to a portion of a respective one of the conductive lines 54 that extend beyond an overlying one of the dielectric layers 52 and/or an overlying one of the conductive lines 54. In some embodiments, the extensions Ext1 to Ext(n) are of equal lengths. In other embodiments, the extensions Ext1 to Ext (n) may have different lengths. FIG. 29 further illustrates centerlines CL1 to CL(n) of the openings 2901, which may be aligned with centers of the extensions Ext1 to Ext(n) in the illustrated embodiment. According to some embodiments, the openings 2901 may have different widths (e.g., W(0) to W(n) and H1 to H(n)), and each of the openings 2901 are centered over an associated extension (e.g., Ext1 to Ext(n)) of the conductive lines 54.

Turning now to FIG. 30, this figure illustrates an etching loading effect of the openings 2901 according to some embodiments. According to some embodiments, a first opening may be located a first distance D1 from the transistor stack region 1201 and the remaining openings are formed at locations along a line up to a second distance D2 from the first opening. In some embodiments, the openings 2901 are formed at locations along the line at a regular pitch P1. In other embodiments, the openings 2901 may be formed at any suitable locations along the line between the first distance D1 and the second distance D2.

In particular, FIG. 30 illustrates a correlation between a desired width and a desired depth of the openings 2901 as a result of etching processes used to pattern the openings 2901, according to some embodiments. For example, as the second distance D2 increases, the width of the openings 2901 increase (e.g., W(0) to W(n)) and the etching depths (e.g., H1 to H(n)) of the openings 2901 also increase, wherein n is a positive integer. According to some embodiments, the widths (e.g., W(0) to W(n)) of the openings 2901 may be between about 10 nm and about 500 nm. In some embodiments, the heights (e.g., H1 to H(n)) of the openings 2901 may be between about 50 nm and about 5,000 nm. However, any suitable width and heights may be used for the openings 2901. As a result of the etch loading effect, openings 2901 of different widths can be patterned using a single patterning step due to the difference of depths to which each of the openings 2901 extends.

Continuing to FIG. 31, this figure illustrates forming the staircase vias 110 in the openings 2901, according to some embodiments. Forming the staircase vias 110 may include forming a liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 120. The remaining liner and conductive material form the staircase vias 110 in the openings 2901. In some embodiments, the IMD 120 may be omitted and the planarization process levels top surfaces of the staircase vias 110 and the IMD 70.

Furthermore, FIG. 31 illustrates that the centerlines CL1 to CL(n) of the staircase vias 110 may be centered over the extensions of the conductive lines 54, according to some embodiments. Further still, according to some embodiments, the first staircase via 110 is located a first distance D1 from the transistor stack region 1201. According to some embodiments, the widths (e.g., W(0) to W(n)) of the staircase vias 110 may increase as the second distance D2 increases from the first staircase via 110. Any suitable distances may be used for the first distance D1 and the second distance D2. In the illustrated embodiment, the staircase vias 110 are planarized with the IMD 120. As such, the tops of the staircase vias 110 are exposed in a coplanar surface of the IMD 120, according to some embodiments.

Figure 32A:
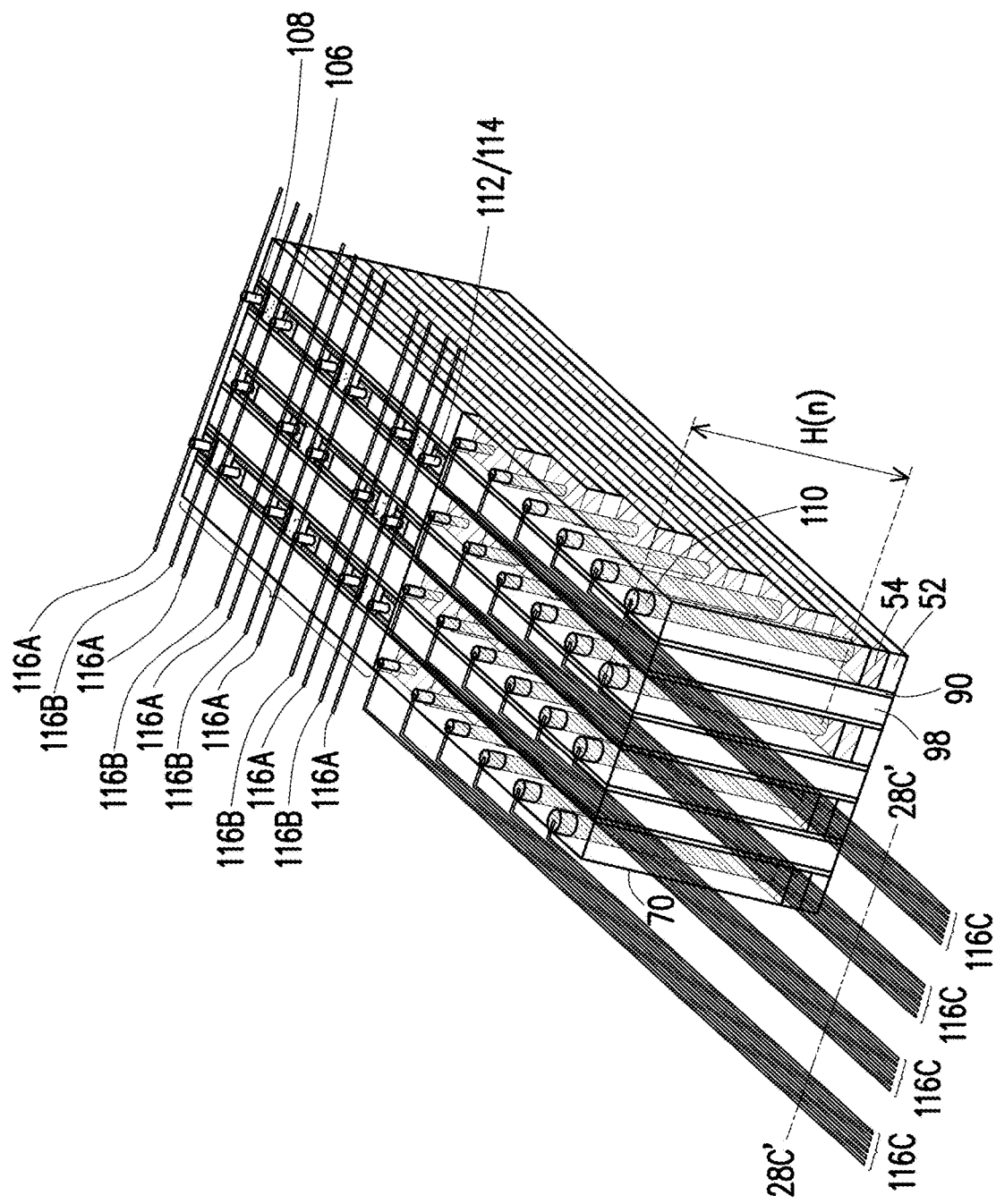
FIGS. 32A, 32B, 32C, and 32D illustrate various views of the formation of conductive lines to the word lines, source lines, and bit lines of the memory array and to conductive vias in a redistribution structure in accordance with some embodiments.
Figure 32B:
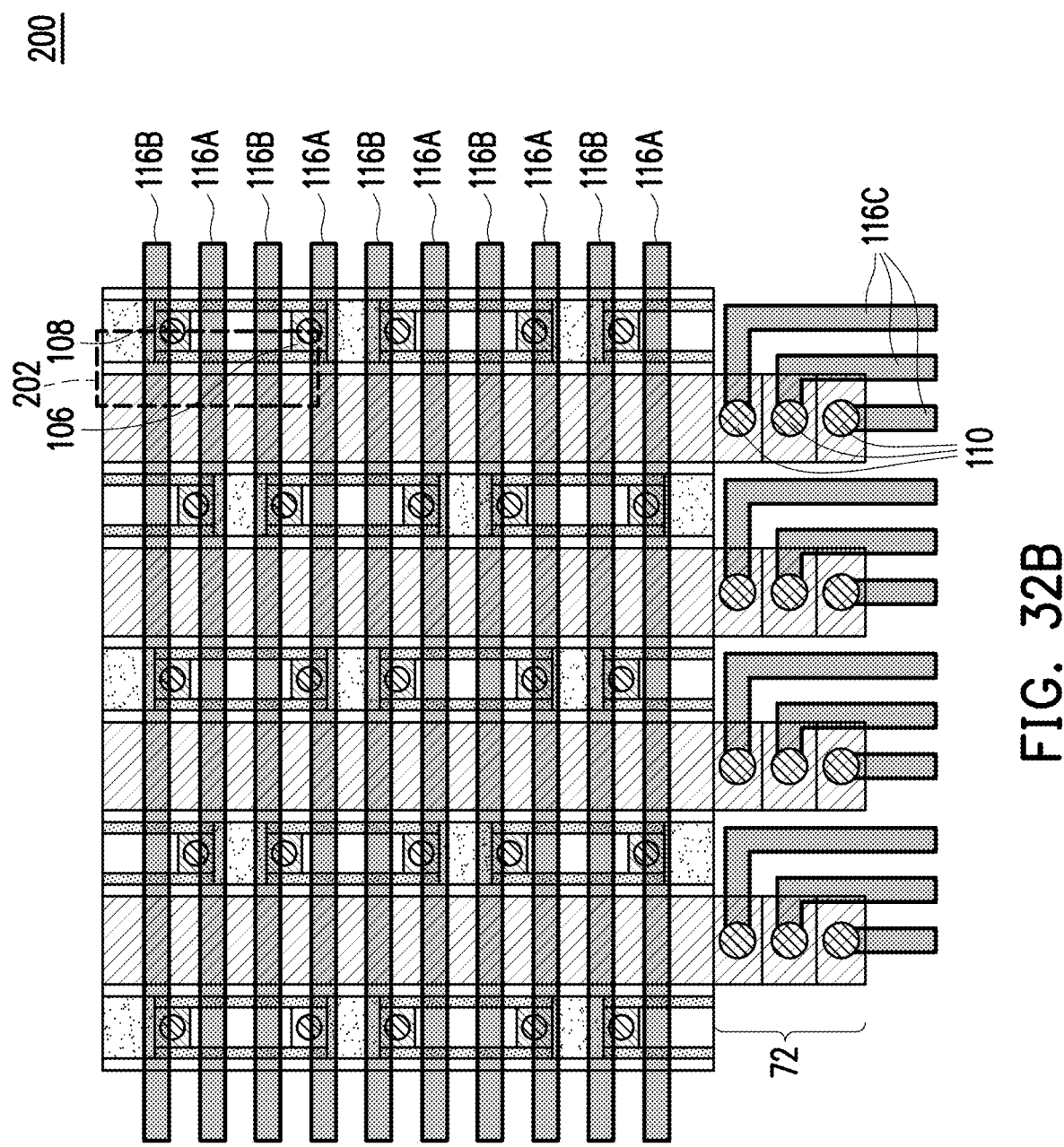
Figure 32C:
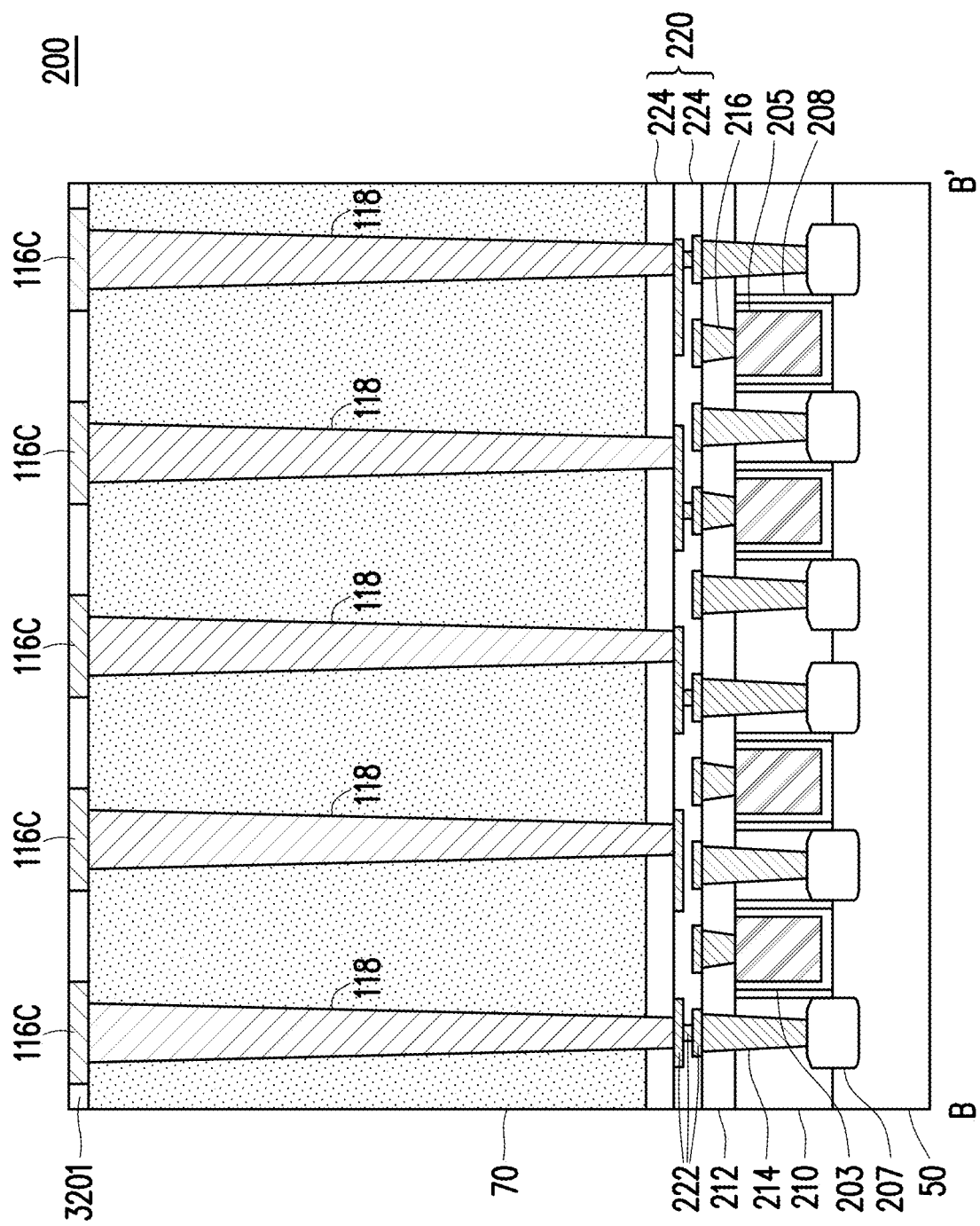
Figure 32D:
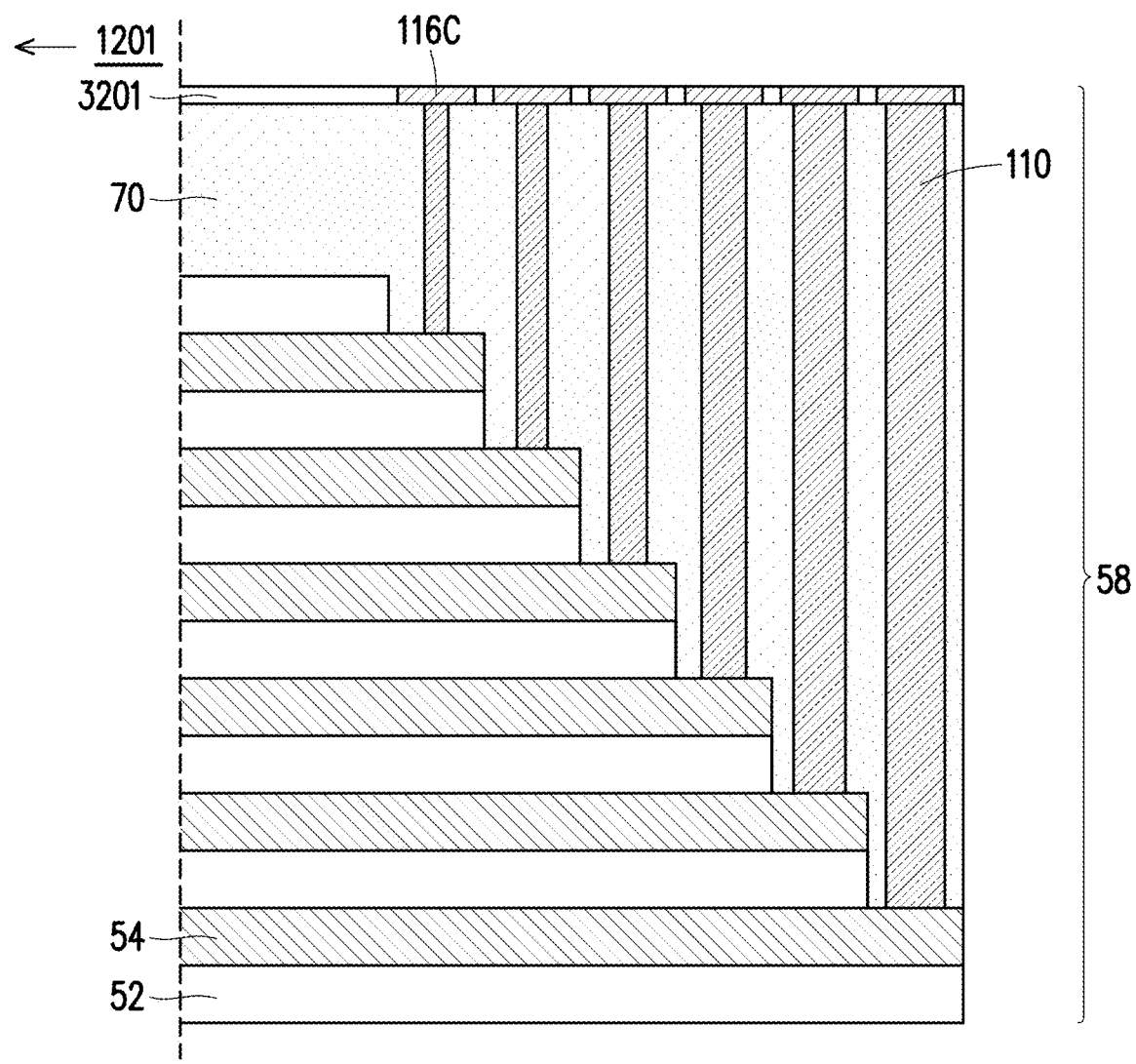

In FIGS. 32A, 32B, 32C, and 32D formation of common bit lines 116A, common source lines 116B, and common word lines 116C to the source/bit line contacts 112 and 114 and the staircase vias 110, respectively. FIG. 32D illustrates the staircase vias 110 and the source/bit line contacts 112 and 114 may be electrically connected to common bit lines 116A, common source lines 116B, and common word lines 116C, respectively, which connect the memory array to an underlying/overlying circuitry (e.g., control circuitry) and/or signal, power, and ground lines for the semiconductor die. For example, the common bit lines 116A, common source lines 116B, and common word lines 116C may be routed through one or more dielectric layers 3201 (shown in FIGS. 28C and 28D) and connect to conductive vias 118 that extends through the IMD 70 to electrically connect common word lines 116C to the underlying circuity of the interconnect structure 220 and the active devices on the substrate 50 as illustrated by FIG. 28C. Other conductive vias 118 may be formed through the IMD 70 to electrically connect the common bit lines 116A and the common source lines 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

Although the embodiments of FIGS. 2 through 32C illustrate a particular pattern for the conductive lines 106 and 108, other configurations are also possible. For example, in these embodiments, the conductive lines 106 and 108 have a staggered pattern. In some embodiments, the conductive lines 106 and 108 in a same row of the array are all aligned with each other.

Figure 33:
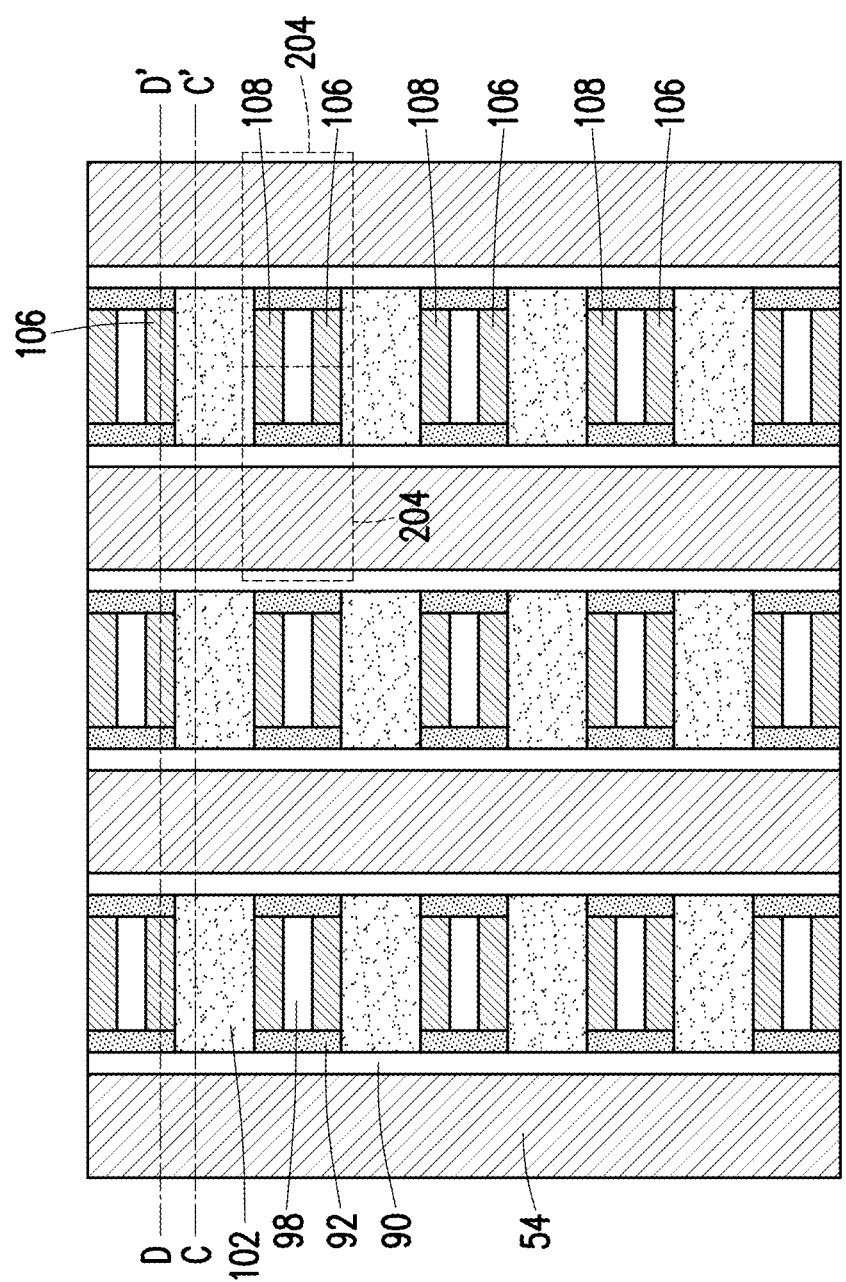
FIGS. 33, 34, and 35 illustrates varying views of a memory array in accordance with some embodiments.
Figure 34:
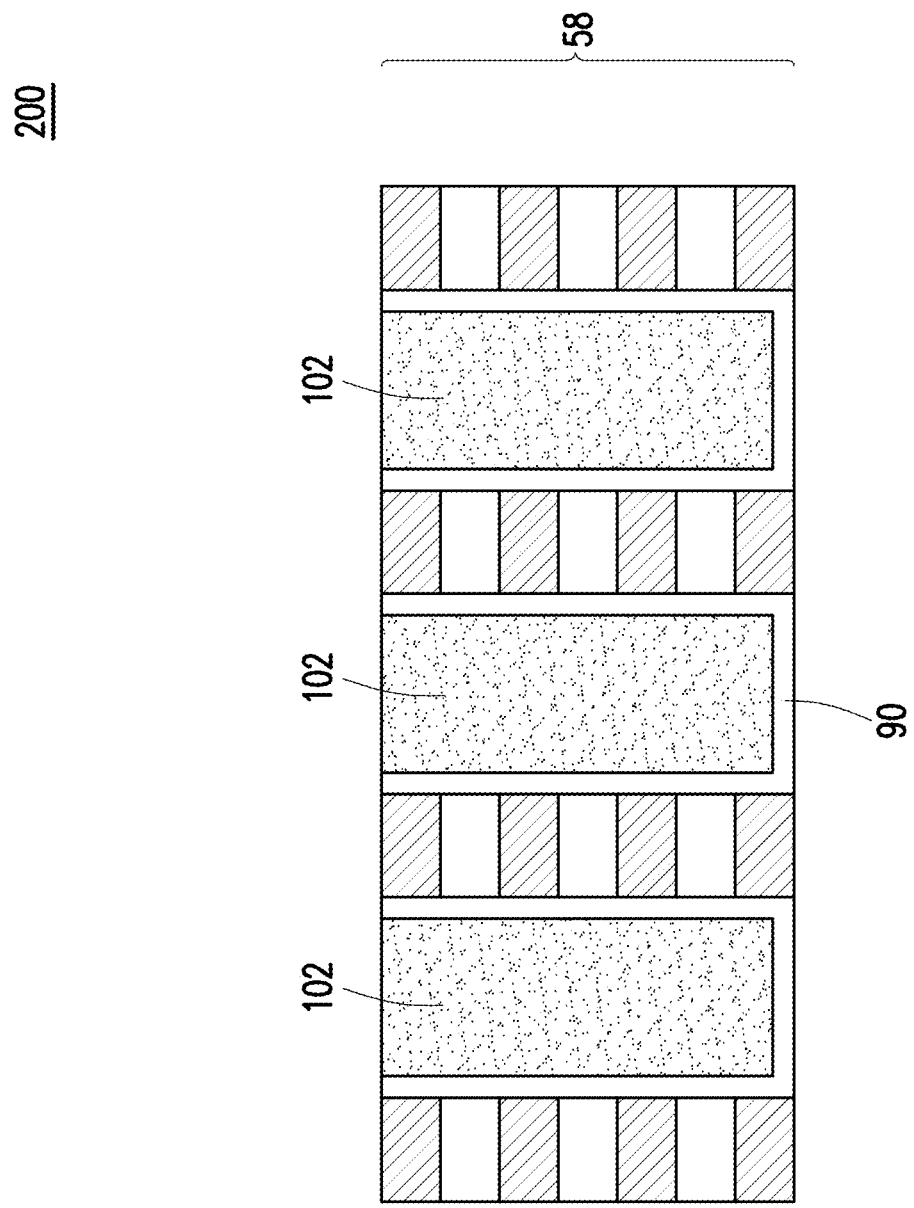
Figure 35:
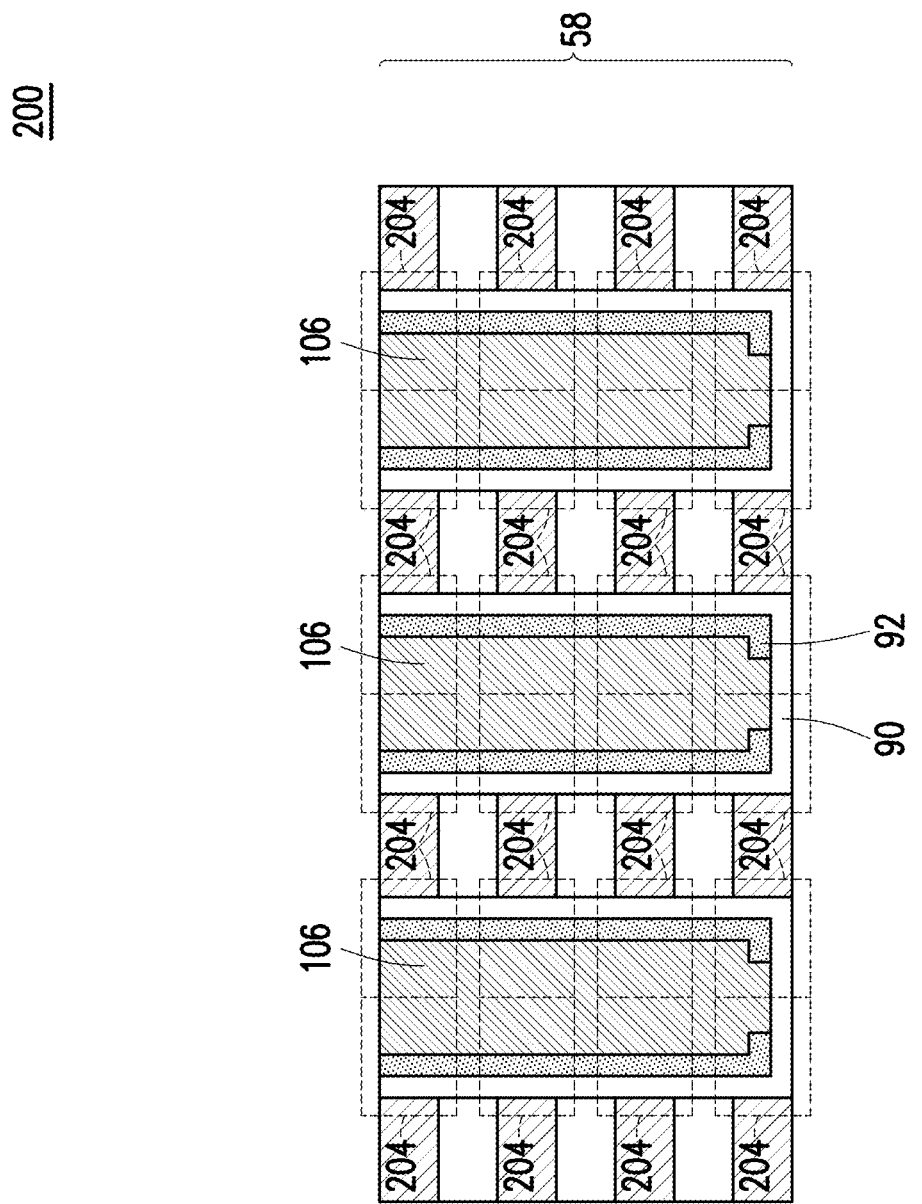

FIG. 33 illustrates a top-down view, and FIG. 34 illustrates a cross-sectional view alone line C-C' of FIG. 33. FIG. 35 illustrates a cross-sectional view alone line D-D' of FIG. 33. In FIGS. 33, 34, and 35, like reference numerals indicate like elements formed by like processes as the elements of FIGS. 2 through 32CV.

Figure 36:
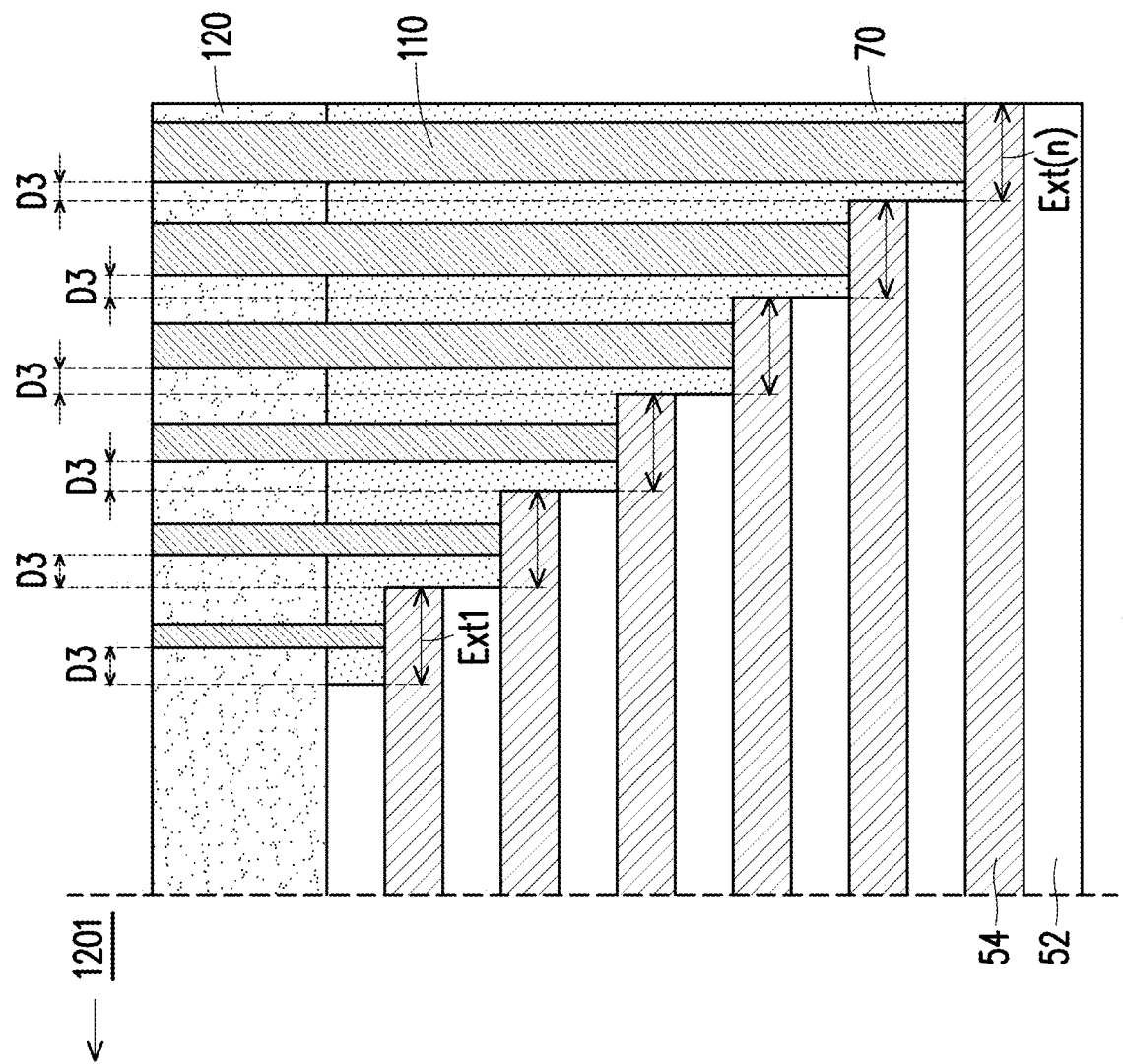
FIG. 36 illustrates a staircase contact structure in accordance with some other embodiments.

Turning now to FIG. 36, this figure illustrates the staircase contact structures 68 according to another embodiment. FIG. 36 is similar to FIG. 31 except each of the staircase vias 110 are spaced a third distance D3 along the extensions Ext1 to Ext(n) of the conductive lines 54 instead of being centered along the extensions. As such, a staircase via to word line distance (e.g., third distance D3) is the same for each of the staircase vias 110 in the illustrated embodiment of FIG. 36. Having a uniform staircase via to word line distance provides a reliable contact connection for manufacturing of the staircase contact structures 68 and for operation of the memory array device 200. Once the staircase contact structures 68 has been formed according to the illustrated embodiment, the memory array device 200 may be further processed as discussed with regard to FIGS. 32A to FIG. 35.

Figure 37:
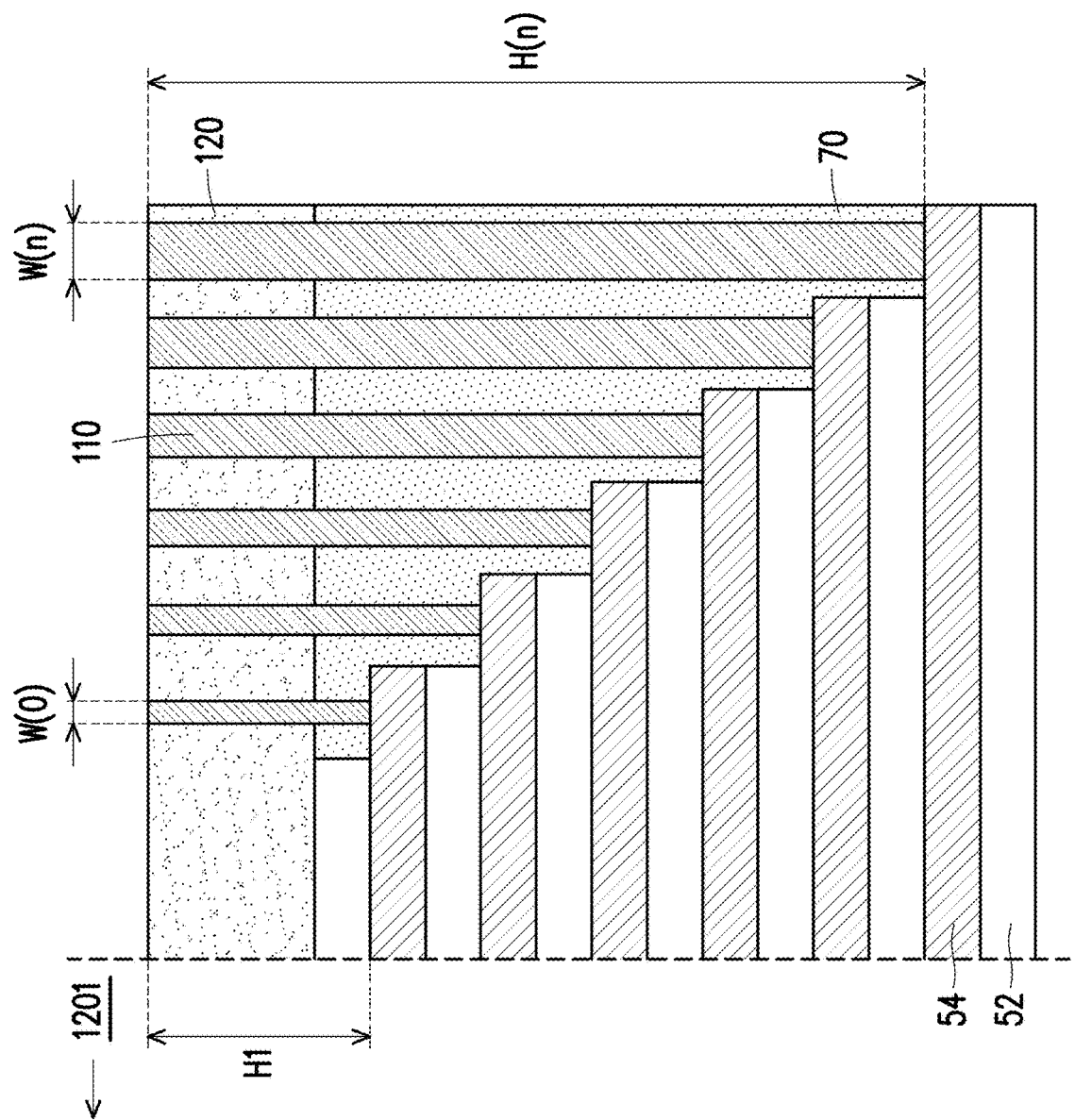
FIG. 37 illustrates a staircase contact structure in accordance with some other embodiments.

Continuing to FIG. 37, this figure illustrates the staircase contact structures 68 according to still another embodiment. FIG. 37 is similar to FIG. 31 except the widths (e.g., W(0) to W(n)) of the staircase vias 110 are proportional to the first width W(0), wherein n is a positive integer and wherein W(n) is between about 10 nm and about 500 nm. For example, an staircase via ratio W(n)/W(0) may be between about 1:1 and about 50:1. However, any suitable ratios may be utilized. In some embodiments, the nth width W(n) increases as the second distance D2 increases from the first staircase via 110. According to some embodiments, the nth width W(n)=[W(0)+W(0)/n], wherein n is a positive integer and wherein W(n) is a width between about 10 nm and 500 nm. However, any suitable widths may be utilized. In such embodiments, the openings 2901 (shown in FIG. 30) are formed with the desired widths and in the desired locations of the staircase vias 110. Once the staircase contact structures 68 has been formed according to the illustrated embodiment, the memory array device 200 may be further processed as discussed with regard to FIGS. 32A to FIG. 35.

Various embodiments provide a 3D stacked memory array with vertically stacked memory cells. The memory cells each comprise a TFT with a memory film, gate dielectric material and an oxide semiconductor channel region. The TFT comprises source/drain electrodes, which are also source lines and bits lines in the memory array. A dielectric material is disposed between and isolates adjacent ones of the source/drain electrodes.

In some embodiments, a contact staircase structure is formed from a stack of conductive layers separated by dielectric layers. The contact staircase structure provides word line contacts for a stacked memory array. The upper conductive layers provide word line contacts for upper memory cells of the stacked memory array and lower conductive layers provide word line contacts for lower memory cells of the stacked memory array. As such, step heights of the lower conductive layers are greater than step heights of the upper conductive layers. An etching loading effect (e.g., wider staircase via critical dimensions are used for deeper etching depths and narrow staircase via critical dimensions are used for shallow etching depths) is used to prevent over etching of the openings and upper-layer word line shorts for the staircase vias due to a large difference in step heights between upper and lower layers. Material savings (e.g., mask materials), lower costs of manufacturing, and easy process flows may be achieved for producing a 3D stacked memory array device with reliable word line contact connectivity.

According to an embodiment, a memory array device includes: a stack of transistors over a semiconductor substrate, the stack of transistors including a first thin film transistor over a second thin film transistor, the first thin film transistor includes: a first memory film along a first word line; and a first channel region a first source line and a first bit line, wherein the first memory film is disposed between the first channel region and the first word line; the second thin film transistor including: a second memory film along a second word line; and a second channel region along the first source line and the first bit line, wherein the second memory film is disposed between the second channel region and the second word line; a first staircase via electrically connected to the first word line, the first staircase via including a first width; and a second staircase via electrically connected to the second word line, the second staircase via including a second width, the second width being greater than the first width. In an embodiment, the first staircase via is located a first distance from the stack of transistors and wherein the second staircase via is located a second distance from the stack of transistors, the second distance being greater than the first distance. In an embodiment, the first staircase via is centered on a first extension of the first word line, wherein the second staircase via is centered on a second extension of the second word line, wherein the first extension of the first word line is a portion of the first word line that extends beyond a third word line over the first word line, and wherein the second extension of the second word line is a portion of the second word line that extends beyond the first word line. In an embodiment, the first staircase via is located a third distance along a first extension of the first word line and wherein the second staircase via is located the third distance along a second extension of the second word line, wherein the first extension of the first word line is a portion of the first word line that extends beyond a third word line over the first word line, and wherein the second extension of the second word line is a portion of the second word line that extends beyond the first word line. In an embodiment, the first width is in a range of 10 nm to 500 nm. In an embodiment, a ratio of the second width to the first width is in a range of 1:1 to 50:1. In an embodiment, the first staircase via and the second staircase via are included in a plurality of staircase vias, wherein a width of an nth staircase via of the plurality of staircase vias is equal to an nth width W(n), wherein the nth width W(n)=[W(0)+W(0)/n], and wherein W(0) is the first width and n is a positive integer.

According to another embodiment, a device includes: a semiconductor substrate; a word line stack; a first staircase via connected to a first word line of the word line stack, the first staircase via including a first width and a first height; a second staircase via connected to a second word line of the word line stack, the first word line being located over the second word line, the second staircase via including a second width and a second height, the second width being greater than the first width and the second height being greater than the first height; and a memory cell stack, the memory cell stack including: a first thin film transistor, wherein a portion of the first word line provides a gate electrode of the first thin film transistor; and a second thin film transistor, wherein the first thin film transistor is disposed over the second thin film transistor and wherein a portion of the second word line provides a gate electrode of the second thin film transistor. In an embodiment, the first staircase via is located a first distance from the memory cell stack and the second staircase via is located a second distance from the memory cell stack, the second distance being greater than the first distance. In an embodiment, the first width is between about 10 nm and about 500 nm. In an embodiment, a ratio of the second width to the first width is between about 1:1 and about 50:1. In an embodiment, the first staircase via is centered over a first extension of the first word line and the second staircase via is centered over a second extension of the second word line, wherein the first extension of the first word line is a portion of the first word line that extends beyond a third word line of the word line stack, wherein the third word line is disposed over the first word line, and wherein the second extension of the second word line is a portion of the second word line that extends beyond the first word line. In an embodiment, the first staircase via is located a third distance along a first extension of the first word line and the second staircase via is located the third distance along a second extension of the second word line, wherein the first extension of the first word line is a portion of the first word line that extends beyond a third word line of the word line stack, wherein the third word line is disposed over the first word line, and wherein the second extension of the second word line is a portion of the second word line that extends beyond the first word line. In an embodiment, a total of n staircase vias are connected to the word line stack, wherein a width of an nth staircase via is equal to an nth width W(n), wherein the nth width W(n)= [W(0)+W(0)/n], and wherein W(0) is the first width, and wherein n is a positive integer between 1 and 50.

In yet another embodiment, a method includes: forming a stack of memory cells in a first region of a multilayer stack of conductive layers, a portion of a first conductive layer being a gate electrode of a first memory cell in the stack of memory cells and a portion of a second conductive layer being a gate electrode of a second memory cell in the stack of memory cells; forming a conductive staircase structure in a second region of the multilayer stack of conductive layers; forming a dielectric layer over the conductive staircase structure; exposing the first conductive layer by forming a first opening through the dielectric layer, the first opening including a first width and being located a first distance from the first region; exposing the second conductive layer by forming a second opening through the dielectric layer, the second opening including a second width and being located a second distance from the first region, the second width being greater than the first width and the second distance being greater than the first distance; forming a first conductive via in the first opening; and forming a second conductive via in the second opening. In an embodiment, the first width is a width between about 10 nm and about 500 nm. In an embodiment, a ratio of the second width to the first width is between about 1:1 and about 50:1. In an embodiment, the multilayer stack of conductive layers includes a total of n conductive layers, wherein the method further includes exposing an nth conductive layer by forming an nth opening through the dielectric layer, a width of the nth opening is equal to a sum of the first width and a quotient of the first width divided by n, wherein n is a positive integer between 1 and 50. In an embodiment, the first opening is centered over a first extension of the first conductive layer and the second opening is centered over a second extension of the second conductive layer, wherein the first extension of the first conductive layer is a portion of the first conductive layer that extends beyond a third conductive layer over the first conductive layer, and wherein the second extension of the second conductive layer is a portion of the second conductive layer that extends beyond the first conductive layer. In an embodiment, the first opening is located a third distance along a first extension of the first conductive layer and the second opening is located the third distance along a second extension of the second conductive layer, wherein the first extension of the first conductive layer is a portion of the first conductive layer that extends beyond a third conductive layer over the first conductive layer, and wherein the second extension of the second conductive layer is a portion of the second conductive layer that extends beyond the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array device comprising:
   a stack of transistors over a semiconductor substrate, the stack of transistors comprising: a first thin film transistor over a second thin film transistor, the first thin film transistor comprising:
   a first memory film along a first word line; and
   a first channel region, a first source line and a first bit line, wherein the first memory film is disposed between the first channel region and the first word line;
   the second thin film transistor comprising:
   a second memory film along a second word line; and
   a second channel region along the first source line and a first line, wherein the second memory film is disposed between the second channel region and the second word line;
   a first staircase via electrically connected to the first word line, the first staircase via comprising: a first width; and
   a second staircase via electrically connected to the second word line, the second staircase via comprising: a second width, the second width being greater than the first width.

2. The memory array device of claim 1, wherein the first staircase via is located a first distance from the stack of transistors and wherein the second staircase via is located a second distance from the stack of transistors, the second distance being greater than the first distance.

3. The memory array device of claim 2, wherein the first staircase via is centered on a first extension of the first word line, wherein the second staircase via is centered on a second extension of the second word line, wherein the first extension of the first word line is a portion of the first word line that extends beyond a third word line over the first word line, and wherein the second extension of the second word line is a portion of the second word line that extends beyond the first word line.

4. The memory array device of claim 2, wherein the first staircase via is located a third distance along a first extension of the first word line and wherein the second staircase via is located the third distance along a second extension of the second word line, wherein the first extension of the first word line is a portion of the first word line that extends beyond a third word line over the first word line, and wherein the second extension of the second word line is a portion of the second word line that extends beyond the first word line.

5. The memory array device of claim 2, wherein the first width is in a range of 10 nm to 500 nm.

6. The memory array device of claim 5, wherein a ratio of the second width to the first width is in a range of 1:1 to 50:1.

7. The memory array device of claim 5, wherein the first staircase via and the second staircase via are comprised in a plurality of staircase vias, wherein a width of an nth staircase via of the plurality of staircase vias is equal to an nth width W(n), wherein the nth width W(n)=[W(0)+W(0)/n], and wherein W(0) is the first width and n is a positive integer.

8. A device comprising:
   a semiconductor substrate;
   a word line stack;
   a first staircase via connected to a first word line of the word line stack, the first staircase via comprising: a first width and a first height;

a second staircase via connected to a second word line of the word line stack, the first word line being located over the second word line, the second staircase via comprising: a second width and a second height, the second width being greater than the first width and the second height being greater than the first height; and a memory cell stack, the memory cell stack comprising:

a first thin film transistor, wherein a portion of the first word line provides a gate electrode of the first thin film transistor; and a second thin film transistor, wherein the first thin film transistor is disposed over the second thin film transistor and wherein a portion of the second word line provides a gate electrode of the second thin film transistor.

9. The device of claim 8, wherein the first staircase via is located a first distance from the memory cell stack and the second staircase via is located a second distance from the memory cell stack, the second distance being greater than the first distance.

10. The device of claim 9, wherein the first width is between about 10 nm and about 500 nm.

11. The device of claim 10, wherein a ratio of the second width to the first width is between about 1:1 and about 50:1.

12. The device of claim 10, wherein the first staircase via is centered over a first extension of the first word line and the second staircase via is centered over a second extension of the second word line, wherein the first extension of the first word line is a portion of the first word line that extends beyond a third word line of the word line stack, wherein the third word line is disposed over the first word line, and wherein the second extension of the second word line is a portion of the second word line that extends beyond the first word line.

13. The device of claim 10, wherein the first staircase via is located a third distance along a first extension of the first word line and the second staircase via is located the third distance along a second extension of the second word line, wherein the first extension of the first word line is a portion of the first word line that extends beyond a third word line of the word line stack, wherein the third word line is disposed over the first word line, and wherein the second extension of the second word line is a portion of the second word line that extends beyond the first word line.

14. The device of claim 10, wherein a total of n staircase vias are connected to the word line stack, wherein a width of an nth staircase via is equal to an nth width $W(n)$, wherein the nth width $W(n)=[W(0)+W(0)/n]$, and wherein $W(0)$ is the first width, and wherein n is a positive integer between 1 and 50.

* * * * *